(12) United States Patent
Abotabl et al.

(10) Patent No.: US 12,021,620 B2
(45) Date of Patent: Jun. 25, 2024

(54) CYCLIC REDUNDANCY CHECK DESIGN FOR COMMON AND PRIVATE TRANSPORT BLOCKS IN RATE SPLITTING TRANSMISSIONS

(71) Applicant: QUALCOMM Incorporated, San Diego, CA (US)

(72) Inventors: Ahmed Attia Abotabl, San Diego, CA (US); Ahmed Elshafie, San Diego, CA (US); Marwen Zorgui, San Diego, CA (US); Ahmed Abdelaziz Ibrahim Abdelaziz Zewail, San Diego, CA (US); Wanshi Chen, San Diego, CA (US)

(73) Assignee: QUALCOMM Incorporated, San Diego, CA (US)

( * ) Notice: Subject to any disclaimer, the term of this patent is extended or adjusted under 35 U.S.C. 154(b) by 0 days.

(21) Appl. No.: 17/944,838

(22) Filed: Sep. 14, 2022

(65) Prior Publication Data

US 2024/0089029 A1    Mar. 14, 2024

(51) Int. Cl.
*H04L 1/00* (2006.01)
*H03M 13/00* (2006.01)
*H03M 13/11* (2006.01)

(52) U.S. Cl.
CPC ....... *H04L 1/0061* (2013.01); *H03M 13/1111* (2013.01); *H03M 13/611* (2013.01); *H04L 1/0067* (2013.01)

(58) Field of Classification Search
CPC .............. H04L 1/0061; H04L 1/0067; H03M 13/1111; H03M 13/611
See application file for complete search history.

(56) References Cited

U.S. PATENT DOCUMENTS

2009/0019337 A1    1/2009   Pi et al.
2009/0132893 A1*   5/2009   Miyazaki ................ H04L 1/005
                                                        714/776

(Continued)

FOREIGN PATENT DOCUMENTS

WO    WO-2019201262 A1    10/2019

OTHER PUBLICATIONS

International Search Report and Written Opinion—PCT/US2023/032472—ISA/EPO—Dec. 22, 2023.

(Continued)

*Primary Examiner* — Thien Nguyen
(74) *Attorney, Agent, or Firm* — Holland & Hart LLP

(57) ABSTRACT

Methods, systems, and devices for wireless communication are described. A device may perform rate splitting on a first message for a first user equipment (UE) and a second message for a second UE, the first message comprising a first private portion and a first common portion, and the second message comprising a second private portion and a second common portion. The device may combine the first common portion and the second common portion into a third common portion. The device may generate cyclic redundancy check (CRC) parity bits associated with at least one of the first private portion and the third common portion and attach the generated CRC parity bits to one or more blocks associated with the transmission. The device may transmit the first private portion and the third common portion to the first UE, and the second private portion and the third common portion to the second UE.

28 Claims, 17 Drawing Sheets

(56) References Cited

U.S. PATENT DOCUMENTS

| | | |
|---|---|---|
| 2012/0246548 A1 | 9/2012 | Buckley et al. |
| 2014/0146756 A1 | 5/2014 | Sahin et al. |
| 2019/0036833 A1* | 1/2019 | Bernhard .............. H04L 47/365 |

OTHER PUBLICATIONS

Li D., et al., "Precoding Optimization Assisted Secure Transmission for Rate-Splitting Multiple Access", ICC 2022—IEEE International Conference on Communications, IEEE, May 16, 2022, pp. 673-678, XP034168591, p. 674, Sections I, II.

Li Z., et al., "Rate-Splitting Based Transmission Strategy Design in FDD-Based System", 2018 IEEE/CIC International Conference on Communications in China (ICCC), IEEE, Aug. 16, 2018, pp. 773-777, XP033517349, Section II-C.

\* cited by examiner

US 12,021,620 B2

CYCLIC REDUNDANCY CHECK DESIGN FOR COMMON AND PRIVATE TRANSPORT BLOCKS IN RATE SPLITTING TRANSMISSIONS

FIELD OF TECHNOLOGY

The following relates to wireless communication, including cyclic redundancy check (CRC) design for common and private transport blocks in rate splitting transmissions.

BACKGROUND

Wireless communications systems are widely deployed to provide various types of communication content such as voice, video, packet data, messaging, broadcast, and so on. These systems may be capable of supporting communication with multiple users by sharing the available system resources (e.g., time, frequency, and power). Examples of such multiple-access systems include fourth generation (4G) systems such as Long Term Evolution (LTE) systems, LTE-Advanced (LTE-A) systems, or LTE-A Pro systems, and fifth generation (5G) systems which may be referred to as New Radio (NR) systems. These systems may employ technologies such as code division multiple access (CDMA), time division multiple access (TDMA), frequency division multiple access (FDMA), orthogonal FDMA (OFDMA), or discrete Fourier transform spread orthogonal frequency division multiplexing (DFT-S-OFDM). A wireless multiple-access communications system may include one or more base stations, each supporting wireless communication for communication devices, which may be known as user equipment (UE).

SUMMARY

The described techniques relate to improved methods, systems, devices, and apparatuses that support CRC design for common and private transport blocks in rate splitting transmissions. For example, the described techniques relate to a device to perform rate splitting on a first message for a first UE and a second message for a second UE, the first message comprising a first private portion and a first common portion, and the second message comprising a second private portion and a second common portion. In performing the rate splitting, the device may combine the first common portion and the second common portion into a third common portion. The device may generate CRC parity bits associated with at least one of the first private portion and the third common portion, among other aspects. The device may attach the generated CRC parity bits to at least one code block, at least one transport block, one or more other blocks, or any combination thereof. The device may then transmit at least the first private portion and the third common portion to the first UE, and at least the second private portion and the third common portion to the second UE.

A method for wireless communications at a device is described. The method may include performing rate splitting on a first message for a first user equipment (UE) and a second message for a second UE, the first message including a first private portion and a first common portion, and the second message including a second private portion and a second common portion, the rate splitting including combining the first common portion and the second common portion into a third common portion, generating cyclic redundancy check parity bits associated with at least one of the first private portion and the third common portion, and transmitting, based on the generating, the first private portion and the third common portion to the first UE, and the second private portion and the third common portion to the second UE.

An apparatus for wireless communications at a device is described. The apparatus may include a processor, memory coupled with the processor, and instructions stored in the memory. The instructions may be executable by the processor to cause the apparatus to perform rate splitting on a first message for a first UE and a second message for a second UE, the first message including a first private portion and a first common portion, and the second message including a second private portion and a second common portion, the rate splitting including combining the first common portion and the second common portion into a third common portion, generate cyclic redundancy check parity bits associated with at least one of the first private portion and the third common portion, and transmit, based on the generating, the first private portion and the third common portion to the first UE, and the second private portion and the third common portion to the second UE.

Another apparatus for wireless communications at a device is described. The apparatus may include means for performing rate splitting on a first message for a first UE and a second message for a second UE, the first message including a first private portion and a first common portion, and the second message including a second private portion and a second common portion, the rate splitting including combining the first common portion and the second common portion into a third common portion, means for generating cyclic redundancy check parity bits associated with at least one of the first private portion and the third common portion, and means for transmitting, based on the generating, the first private portion and the third common portion to the first UE, and the second private portion and the third common portion to the second UE.

A non-transitory computer-readable medium storing code for wireless communications at a device is described. The code may include instructions executable by a processor to perform rate splitting on a first message for a first UE and a second message for a second UE, the first message including a first private portion and a first common portion, and the second message including a second private portion and a second common portion, the rate splitting including combining the first common portion and the second common portion into a third common portion, generate cyclic redundancy check parity bits associated with at least one of the first private portion and the third common portion, and transmit, based on the generating, the first private portion and the third common portion to the first UE, and the second private portion and the third common portion to the second UE.

In some examples of the method, apparatuses, and non-transitory computer-readable medium described herein, the generating may include operations, features, means, or instructions for generating a first set of cyclic redundancy check parity bits for at least one code block associated with at least one of the first private portion and the third common portion and generating a second set of cyclic redundancy check parity bits for at least one transport block associated with at least one of the first private portion and the third common portion.

Some examples of the method, apparatuses, and non-transitory computer-readable medium described herein may further include operations, features, means, or instructions for attaching the first set of cyclic redundancy check parity bits to the at least one code block and the second set of cyclic redundancy check parity bits to the at least one transport block, where the transmitting may be based on the attaching.

Some examples of the method, apparatuses, and non-transitory computer-readable medium described herein may further include operations, features, means, or instructions for attaching the first set of cyclic redundancy check parity bits to at least one first code block associated with the first private portion and to at least one second code block associated with the third common portion, attaching the second set of cyclic redundancy check parity bits to at least one first transport block associated with the first private portion and to at least one second transport block associated with the third common portion, and attaching a third set of cyclic redundancy check parity bits to a block associated with the first private portion and the third common portion, where the transmitting may be based on the attaching.

Some examples of the method, apparatuses, and non-transitory computer-readable medium described herein may further include operations, features, means, or instructions for attaching the first set of cyclic redundancy check parity bits to at least one first code block associated with the first private portion and to at least one second code block associated with the third common portion and attaching the second set of cyclic redundancy check parity bits to the at least one transport block associated with the first private portion or the third common portion, where the transmitting may be based on the attaching.

Some examples of the method, apparatuses, and non-transitory computer-readable medium described herein may further include operations, features, means, or instructions for encoding the first private portion, the second private portion, and the third common portion, where the generating may be based on the encoding.

In some examples of the method, apparatuses, and non-transitory computer-readable medium described herein, the generating may include operations, features, means, or instructions for generating a set of cyclic redundancy check parity bits associated with the first private portion and the third common portion.

Some examples of the method, apparatuses, and non-transitory computer-readable medium described herein may further include operations, features, means, or instructions for attaching the set of cyclic redundancy check parity bits to a transport block or a code block associated with the third common portion, where the transmitting may be based on the attaching.

Some examples of the method, apparatuses, and non-transitory computer-readable medium described herein may further include operations, features, means, or instructions for attaching the set of cyclic redundancy check parity bits to a transport block or a code block associated with the first private portion, where the transmitting may be based on the attaching.

Some examples of the method, apparatuses, and non-transitory computer-readable medium described herein may further include operations, features, means, or instructions for attaching a first subset of the set of cyclic redundancy check parity bits to a transport block or a code block associated with the first private portion and attaching a second subset of the set of cyclic redundancy check parity bits to a transport block or a code block associated with the third common portion, where the set of cyclic redundancy check parity bits includes the first subset and the second subset, and where the transmitting may be based on the attaching.

In some examples of the method, apparatuses, and non-transitory computer-readable medium described herein, the generating may include operations, features, means, or instructions for generating a first set of cyclic redundancy check parity bits for a first transport block associated with the first private portion based on the first private portion and the third common portion and generating a second set of cyclic redundancy check parity bits for a second transport block associated with the second private portion based on the second private portion and the third common portion.

Some examples of the method, apparatuses, and non-transitory computer-readable medium described herein may further include operations, features, means, or instructions for attaching the first set of cyclic redundancy check parity bits to the first transport block associated with the first private portion and attaching the second set of cyclic redundancy check parity bits to the second transport block associated with the second private portion, where the transmitting may be based on the attaching.

Some examples of the method, apparatuses, and non-transitory computer-readable medium described herein may further include operations, features, means, or instructions for generating the cyclic redundancy check parity bits may be based on a first set of one or more polynomials associated with rate splitting transmissions and the first set of one or more polynomials may be different from a second set of one or more polynomials associated with non-rate splitting transmissions.

A method for wireless communications at a UE is described. The method may include receiving, from a device, a message including a private portion, a common portion, and cyclic redundancy check parity bits, decoding the private portion and the common portion based on receiving the message, determining a decoding status based on the cyclic redundancy check parity bits, and communicating with the device based on determining the decoding status.

An apparatus for wireless communications at a UE is described. The apparatus may include a processor, memory coupled with the processor, and instructions stored in the memory. The instructions may be executable by the processor to cause the apparatus to receive, from a device, a message including a private portion, a common portion, and cyclic redundancy check parity bits, decode the private portion and the common portion based on receiving the message, determine a decoding status based on the cyclic redundancy check parity bits, and communicate with the device based on determining the decoding status.

Another apparatus for wireless communications at a UE is described. The apparatus may include means for receiving, from a device, a message including a private portion, a common portion, and cyclic redundancy check parity bits, means for decoding the private portion and the common portion based on receiving the message, means for determining a decoding status based on the cyclic redundancy check parity bits, and means for communicating with the device based on determining the decoding status.

A non-transitory computer-readable medium storing code for wireless communications at a UE is described. The code may include instructions executable by a processor to receive, from a device, a message including a private portion, a common portion, and cyclic redundancy check parity bits, decode the private portion and the common portion based on receiving the message, determine a decoding status based on the cyclic redundancy check parity bits, and communicate with the device based on determining the decoding status.

In some examples of the method, apparatuses, and non-transitory computer-readable medium described herein, a first subset of the cyclic redundancy check parity bits may be associated with at least one code block and a second subset of the cyclic redundancy check parity bits for at least one transport block, the at least one code block and the at least one transport block each associated with at least one of the private portion and the common portion.

In some examples of the method, apparatuses, and non-transitory computer-readable medium described herein, receiving the message may include operations, features, means, or instructions for receiving at least one code block, the at least one code block including at least the first subset of the cyclic redundancy check parity bits and receiving at least one transport block, the at least one transport block including at least the second subset of cyclic redundancy check parity bits, the at least one code block and the at least one transport block each associated with at least one of the private portion and the common portion.

In some examples of the method, apparatuses, and non-transitory computer-readable medium described herein, receiving the message may include operations, features, means, or instructions for receiving at least one first code block associated with the common portion and at least one second code block associated with the private portion, the at least one first code block and the at least one second code block including at least the first subset of the cyclic redundancy check parity bits, receiving at least one first transport block associated with the common portion and at least one second transport block associated with the private portion, the at least one first transport block and the at least one second transport block including at least the second subset of the cyclic redundancy check parity bits, and receiving at least one block associated with the common portion and the private portion, the at least one block including at least a third subset of the cyclic redundancy check parity bits.

In some examples of the method, apparatuses, and non-transitory computer-readable medium described herein, receiving the message may include operations, features, means, or instructions for receiving at least one first code block associated with the common portion and at least one second code block associated with the private portion, the at least one first code block and the at least one second code block including at least the first subset of the cyclic redundancy check parity bits and receiving at least one first transport block associated with the common portion and the private portion, the at least one transport block including at least the second subset of the cyclic redundancy check parity bits.

In some examples of the method, apparatuses, and non-transitory computer-readable medium described herein, receiving the message may include operations, features, means, or instructions for receiving at least one code block and receiving at least one transport block, where the cyclic redundancy check parity bits may be attached to the at least one transport block.

In some examples of the method, apparatuses, and non-transitory computer-readable medium described herein, the at least one transport block may be associated with the common portion.

In some examples of the method, apparatuses, and non-transitory computer-readable medium described herein, the at least one transport block may be associated with the private portion.

In some examples of the method, apparatuses, and non-transitory computer-readable medium described herein, the at least one transport block includes at least a first transport block associated with the common portion and a second transport block associated with the private portion and a first subset of the cyclic redundancy check parity bits may be attached to the first transport block and a second subset of the cyclic redundancy check parity bits may be attached to the second transport block.

In some examples of the method, apparatuses, and non-transitory computer-readable medium described herein, the decoding may be based on a first set of one or more polynomials associated with rate splitting transmissions and the first set of one or more polynomials may be different from a second set of one or more polynomials associated with non-rate splitting transmissions.

DETAILED DESCRIPTION

Figure 1:
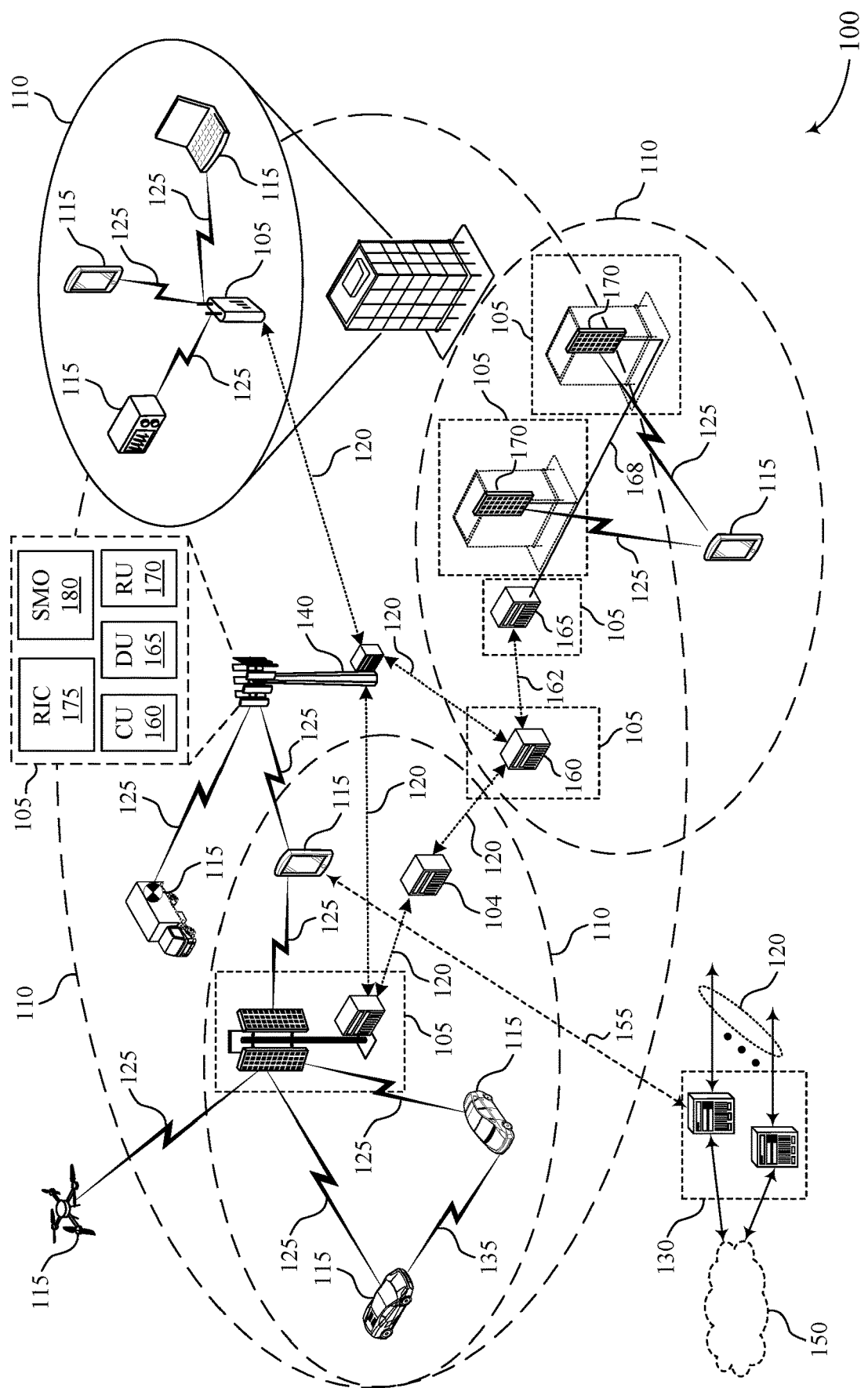
FIG. 1 illustrates an example of a wireless communications system that supports CRC design for common and private transport blocks in rate splitting transmissions in accordance with one or more aspects of the present disclosure.

In some examples, a transmitting device (e.g., a network entity, a UE, or another device) may perform rate splitting to transmit one or more messages to multiple UEs. For example, if the transmitting device receives or determines that messages to be respectively transmitted to a first UE and a second UE have a portion in common, the transmitting device may combine portions of the messages into a common stream that is transmitted to both the first UE and the second UE. The transmitting device may also transmit a private portion of each message to the first UE and the second UE, respectively, alongside the common portion. However, the transmitting device may not be configured to compute CRC parity bits for a rate splitting transmission. Additionally, the transmitting device may not be aware of a procedure for attaching the CRC parity bits to the portions of the messages and because these messages in the rate splitting transmission may not include CRC the messages may not be as accurate or have reduced errors.

In accordance with examples as described herein, a transmitting device may generate CRC parity bits for common and private portions of messages and attach the CRC parity bits to code blocks corresponding to the common message, the private message, or both. In some examples, the transmitting device may generate CRC parity bits for a common portion of messages and private portions of the messages, and may attach the CRC parity bits to code blocks corresponding to the common portion, one or more of the private portions, or both. Additionally, the transmitting device may generate CRC parity bits for transport blocks and attach the CRC parity bits to transport blocks associated with the common portion, one or more of the private portions, or both. Additionally, or alternatively, the transmitting device may generate CRC parity bits associated with a block corresponding to both the common portion and the private portions and attach the CRC parity bits to the block.

In some cases, the transmitting device may jointly generate CRC parity bits according to both the common portion and the private portion corresponding to a first UE, and the transmitting device may attach the jointly-generated CRC parity bits to a transport block associated with the common message or a transport block associated with the private message. In some cases, the transmitting device may attach a portion of the jointly-generated CRC parity bits to the transport block associated with the common message and another portion of the jointly-generated CRC parity bits to the transport block associated with the private message.

In some examples, the transmitting device may generate the CRC parity bits according to one or more polynomials. These polynomials may be the same as polynomials that the transmitting device uses for CRC parity bit generation for non-rate splitting transmissions, or the polynomials may be different, which may cover different length and error detectability ranges for different cases or situations that may occur in rate splitting transmissions.

Aspects of the disclosure are initially described in the context of wireless communications systems. Aspects of the disclosure are additionally illustrated in the context of CRC attachment diagrams and other diagrams. Aspects of the disclosure are further illustrated by and described with reference to apparatus diagrams, system diagrams, and flowcharts that relate to CRC design for common and private transport blocks in rate splitting transmissions.

FIG. 1 illustrates an example of a wireless communications system 100 that supports CRC design for common and private transport blocks in rate splitting transmissions in accordance with one or more aspects of the present disclosure. The wireless communications system 100 may include one or more network entities 105, one or more UEs 115, and a core network 130. In some examples, the wireless communications system 100 may be a Long Term Evolution (LTE) network, an LTE-Advanced (LTE-A) network, an LTE-A Pro network, a New Radio (NR) network, or a network operating in accordance with other systems and radio technologies, including future systems and radio technologies not explicitly mentioned herein.

The network entities 105 may be dispersed throughout a geographic area to form the wireless communications system 100 and may include devices in different forms or having different capabilities. In various examples, a network entity 105 may be referred to as a network element, a mobility element, a radio access network (RAN) node, or network equipment, among other nomenclature. In some examples, network entities 105 and UEs 115 may wirelessly communicate via one or more communication links 125 (e.g., a radio frequency (RF) access link). For example, a network entity 105 may support a coverage area 110 (e.g., a geographic coverage area) over which the UEs 115 and the network entity 105 may establish one or more communication links 125. The coverage area 110 may be an example of a geographic area over which a network entity 105 and a UE 115 may support the communication of signals according to one or more radio access technologies (RATs).

The UEs 115 may be dispersed throughout a coverage area 110 of the wireless communications system 100, and each UE 115 may be stationary, or mobile, or both at different times. The UEs 115 may be devices in different forms or having different capabilities. Some example UEs 115 are illustrated in FIG. 1. The UEs 115 described herein may be capable of supporting communications with various types of devices, such as other UEs 115 or network entities 105, as shown in FIG. 1.

As described herein, a node of the wireless communications system 100, which may be referred to as a device 205, or a wireless node, may be a network entity 105 (e.g., any network entity described herein), a UE 115 (e.g., any UE described herein), a network controller, an apparatus, a device, a computing system, one or more components, or another suitable processing entity configured to perform any of the techniques described herein. For example, a node may be a UE 115. As another example, a node may be a network entity 105. As another example, a first node may be configured to communicate with a second node or a third node. In one aspect of this example, the first node may be a UE 115, the second node may be a network entity 105, and the third node may be a UE 115. In another aspect of this example, the first node may be a UE 115, the second node may be a network entity 105, and the third node may be a network entity 105. In yet other aspects of this example, the first, second, and third nodes may be different relative to these examples. Similarly, reference to a UE 115, network entity 105, apparatus, device, computing system, or the like may include disclosure of the UE 115, network entity 105, apparatus, device, computing system, or the like being a node. For example, disclosure that a UE 115 is configured to receive information from a network entity 105 also discloses that a first node is configured to receive information from a second node.

In some examples, network entities 105 may communicate with the core network 130, or with one another, or both. For example, network entities 105 may communicate with the core network 130 via one or more backhaul communication links 120 (e.g., in accordance with an S1, N2, N3, or other interface protocol). In some examples, network entities 105 may communicate with one another via a backhaul communication link 120 (e.g., in accordance with an X2, Xn, or other interface protocol) either directly (e.g., directly between network entities 105) or indirectly (e.g., via a core network 130). In some examples, network entities 105 may communicate with one another via a midhaul communication link 162 (e.g., in accordance with a midhaul interface protocol) or a fronthaul communication link 168 (e.g., in accordance with a fronthaul interface protocol), or any combination thereof. The backhaul communication links 120, midhaul communication links 162, or fronthaul communication links 168 may be or include one or more wired links (e.g., an electrical link, an optical fiber link), one or more wireless links (e.g., a radio link, a wireless optical link), among other examples or various combinations thereof. A UE 115 may communicate with the core network 130 via a communication link 155.

One or more of the network entities 105 described herein may include or may be referred to as a base station 140 (e.g., a base transceiver station, a radio base station, an NR base station, an access point, a radio transceiver, a NodeB, an eNodeB (eNB), a next-generation NodeB or a giga-NodeB (either of which may be referred to as a gNB), a 5G NB, a next-generation eNB (ng-eNB), a Home NodeB, a Home eNodeB, or other suitable terminology). In some examples, a network entity 105 (e.g., a base station 140) may be implemented in an aggregated (e.g., monolithic, standalone) base station architecture, which may be configured to utilize a protocol stack that is physically or logically integrated within a single network entity 105 (e.g., a single RAN node, such as a base station 140).

In some examples, a network entity 105 may be implemented in a disaggregated architecture (e.g., a disaggregated base station architecture, a disaggregated RAN architecture), which may be configured to utilize a protocol stack that is physically or logically distributed among two or more network entities 105, such as an integrated access backhaul (IAB) network, an open RAN (O-RAN) (e.g., a network configuration sponsored by the O-RAN Alliance), or a virtualized RAN (vRAN) (e.g., a cloud RAN (C-RAN)). For example, a network entity 105 may include one or more of a central unit (CU) 160, a distributed unit (DU) 165, a radio unit (RU) 170, a RAN Intelligent Controller (RIC) 175 (e.g., a Near-Real Time RIC (Near-RT RIC), a Non-Real Time RIC (Non-RT RIC)), a Service Management and Orchestration (SMO) 180 system, or any combination thereof. An RU 170 may also be referred to as a radio head, a smart radio head, a remote radio head (RRH), a remote radio unit (RRU), or a transmission reception point (TRP). One or more components of the network entities 105 in a disaggregated RAN architecture may be co-located, or one or more components of the network entities 105 may be located in distributed locations (e.g., separate physical locations). In some examples, one or more network entities 105 of a disaggregated RAN architecture may be implemented as virtual units (e.g., a virtual CU (VCU), a virtual DU (VDU), a virtual RU (VRU)).

The split of functionality between a CU 160, a DU 165, and an RU 170 is flexible and may support different functionalities depending on which functions (e.g., network layer functions, protocol layer functions, baseband functions, RF functions, and any combinations thereof) are performed at a CU 160, a DU 165, or an RU 170. For example, a functional split of a protocol stack may be employed between a CU 160 and a DU 165 such that the CU 160 may support one or more layers of the protocol stack and the DU 165 may support one or more different layers of the protocol stack. In some examples, the CU 160 may host upper protocol layer (e.g., layer 3 (L3), layer 2 (L2)) functionality and signaling (e.g., Radio Resource Control (RRC), service data adaption protocol (SDAP), Packet Data Convergence Protocol (PDCP)). The CU 160 may be connected to one or more DUs 165 or RUs 170, and the one or more DUs 165 or RUs 170 may host lower protocol layers, such as layer 1 (L1) (e.g., physical (PHY) layer) or L2 (e.g., radio link control (RLC) layer, medium access control (MAC) layer) functionality and signaling, and may each be at least partially controlled by the CU 160. Additionally, or alternatively, a functional split of the protocol stack may be employed between a DU 165 and an RU 170 such that the DU 165 may support one or more layers of the protocol stack and the RU 170 may support one or more different layers of the protocol stack. The DU 165 may support one or multiple different cells (e.g., via one or more RUs 170). In some cases, a functional split between a CU 160 and a DU 165, or between a DU 165 and an RU 170 may be within a protocol layer (e.g., some functions for a protocol layer may be performed by one of a CU 160, a DU 165, or an RU 170, while other functions of the protocol layer are performed by a different one of the CU 160, the DU 165, or the RU 170). A CU 160 may be functionally split further into CU control plane (CU-CP) and CU user plane (CU-UP) functions. A CU 160 may be connected to one or more DUs 165 via a midhaul communication link 162 (e.g., F1, F1-c, F1-u), and a DU 165 may be connected to one or more RUs 170 via a fronthaul communication link 168 (e.g., open fronthaul (FH) interface). In some examples, a midhaul communication link 162 or a fronthaul communication link 168 may be implemented in accordance with an interface (e.g., a channel) between layers of a protocol stack supported by respective network entities 105 that are in communication via such communication links.

In wireless communications systems (e.g., wireless communications system 100), infrastructure and spectral resources for radio access may support wireless backhaul link capabilities to supplement wired backhaul connections, providing an IAB network architecture (e.g., to a core network 130). In some cases, in an IAB network, one or more network entities 105 (e.g., IAB nodes 104) may be partially controlled by each other. One or more IAB nodes 104 may be referred to as a donor entity or an IAB donor. One or more DUs 165 or one or more RUs 170 may be partially controlled by one or more CUs 160 associated with a donor network entity 105 (e.g., a donor base station 140). The one or more donor network entities 105 (e.g., IAB donors) may be in communication with one or more additional network entities 105 (e.g., IAB nodes 104) via supported access and backhaul links (e.g., backhaul communication links 120). IAB nodes 104 may include an IAB mobile termination (IAB-MT) controlled (e.g., scheduled) by DUs 165 of a coupled IAB donor. An IAB-MT may include an independent set of antennas for relay of communications with UEs 115, or may share the same antennas (e.g., of an RU 170) of an IAB node 104 used for access via the DU 165 of the IAB node 104 (e.g., referred to as virtual IAB-MT (vIAB-MT)). In some examples, the IAB nodes 104 may include DUs 165 that support communication links with additional entities (e.g., IAB nodes 104, UEs 115) within the relay chain or configuration of the access network (e.g., downstream). In such cases, one or more components of the disaggregated RAN architecture (e.g., one or more IAB nodes 104 or components of IAB nodes 104) may be configured to operate according to the techniques described herein.

In the case of the techniques described herein applied in the context of a disaggregated RAN architecture, one or more components of the disaggregated RAN architecture may be configured to support CRC design for common and private transport blocks in rate splitting transmissions as described herein. For example, some operations described as being performed by a UE 115 or a network entity 105 (e.g., a base station 140) may additionally, or alternatively, be performed by one or more components of the disaggregated RAN architecture (e.g., IAB nodes 104, DUs 165, CUs 160, RUs 170, RIC 175, SMO 180).

A UE 115 may include or may be referred to as a mobile device, a wireless device, a remote device, a handheld device, or a subscriber device, or some other suitable terminology, where the "device" may also be referred to as a unit, a station, a terminal, or a client, among other examples. A UE 115 may also include or may be referred to as a personal electronic device such as a cellular phone, a personal digital assistant (PDA), a tablet computer, a laptop computer, or a personal computer. In some examples, a UE 115 may include or be referred to as a wireless local loop (WLL) station, an Internet of Things (IoT) device, an Internet of Everything (IoE) device, or a machine type communications (MTC) device, among other examples, which may be implemented in various objects such as appliances, or vehicles, meters, among other examples.

The UEs 115 described herein may be able to communicate with various types of devices, such as other UEs 115 that may sometimes act as relays as well as the network entities 105 and the network equipment including macro eNBs or gNBs, small cell eNBs or gNBs, or relay base stations, among other examples, as shown in FIG. 1.

The UEs 115 and the network entities 105 may wirelessly communicate with one another via one or more communication links 125 (e.g., an access link) using resources associated with one or more carriers. The term "carrier" may refer to a set of RF spectrum resources having a defined physical layer structure for supporting the communication links 125. For example, a carrier used for a communication link 125 may include a portion of a RF spectrum band (e.g., a bandwidth part (BWP)) that is operated according to one or more physical layer channels for a given radio access technology (e.g., LTE, LTE-A, LTE-A Pro, NR). Each physical layer channel may carry acquisition signaling (e.g., synchronization signals, system information), control signaling that coordinates operation for the carrier, user data, or other signaling. The wireless communications system 100 may support communication with a UE 115 using carrier aggregation or multi-carrier operation. A UE 115 may be configured with multiple downlink component carriers and one or more uplink component carriers according to a carrier aggregation configuration. Carrier aggregation may be used with both frequency division duplexing (FDD) and time division duplexing (TDD) component carriers. Communication between a network entity 105 and other devices may refer to communication between the devices and any portion (e.g., entity, sub-entity) of a network entity 105. For example, the terms "transmitting," "receiving," or "communicating," when referring to a network entity 105, may refer to any portion of a network entity 105 (e.g., a base station 140, a CU 160, a DU 165, a RU 170) of a RAN communicating with another device (e.g., directly or via one or more other network entities 105).

Signal waveforms transmitted via a carrier may be made up of multiple subcarriers (e.g., using multi-carrier modulation (MCM) techniques such as orthogonal frequency division multiplexing (OFDM) or discrete Fourier transform spread OFDM (DFT-S-OFDM)). In a system employing MCM techniques, a resource element may refer to resources of one symbol period (e.g., a duration of one modulation symbol) and one subcarrier, in which case the symbol period and subcarrier spacing may be inversely related. The quantity of bits carried by each resource element may depend on the modulation scheme (e.g., the order of the modulation scheme, the coding rate of the modulation scheme, or both), such that a relatively higher quantity of resource elements (e.g., in a transmission duration) and a relatively higher order of a modulation scheme may correspond to a relatively higher rate of communication. A wireless communications resource may refer to a combination of an RF spectrum resource, a time resource, and a spatial resource (e.g., a spatial layer, a beam), and the use of multiple spatial resources may increase the data rate or data integrity for communications with a UE 115.

The time intervals for the network entities 105 or the UEs 115 may be expressed in multiples of a basic time unit which may, for example, refer to a sampling period of $T_S=1/(\Delta f_{max} \cdot N_f)$ seconds, for which $\Delta f_{max}$ may represent a supported subcarrier spacing, and $N_f$ may represent a supported discrete Fourier transform (DFT) size. Time intervals of a communications resource may be organized according to radio frames each having a specified duration (e.g., 10 milliseconds (ms)). Each radio frame may be identified by a system frame number (SFN) (e.g., ranging from 0 to 1023).

Each frame may include multiple consecutively-numbered subframes or slots, and each subframe or slot may have the same duration. In some examples, a frame may be divided (e.g., in the time domain) into subframes, and each subframe may be further divided into a quantity of slots. Alternatively, each frame may include a variable quantity of slots, and the quantity of slots may depend on subcarrier spacing. Each slot may include a quantity of symbol periods (e.g., depending on the length of the cyclic prefix prepended to each symbol period). In some wireless communications systems 100, a slot may further be divided into multiple mini-slots associated with one or more symbols. Excluding the cyclic prefix, each symbol period may be associated with one or more (e.g., $N_f$) sampling periods. The duration of a symbol period may depend on the subcarrier spacing or frequency band of operation.

A subframe, a slot, a mini-slot, or a symbol may be the smallest scheduling unit (e.g., in the time domain) of the wireless communications system 100 and may be referred to as a transmission time interval (TTI). In some examples, the TTI duration (e.g., a quantity of symbol periods in a TTI) may be variable. Additionally, or alternatively, the smallest scheduling unit of the wireless communications system 100 may be dynamically selected (e.g., in bursts of shortened TTIs (sTTIs)).

Physical channels may be multiplexed for communication using a carrier according to various techniques. A physical control channel and a physical data channel may be multiplexed for signaling via a downlink carrier, for example, using one or more of time division multiplexing (TDM) techniques, frequency division multiplexing (FDM) techniques, or hybrid TDM-FDM techniques. A control region (e.g., a control resource set (CORESET)) for a physical control channel may be defined by a set of symbol periods and may extend across the system bandwidth or a subset of the system bandwidth of the carrier. One or more control regions (e.g., CORESETs) may be configured for a set of the UEs 115. For example, one or more of the UEs 115 may monitor or search control regions for control information according to one or more search space sets, and each search space set may include one or multiple control channel candidates in one or more aggregation levels arranged in a cascaded manner. An aggregation level for a control channel candidate may refer to an amount of control channel resources (e.g., control channel elements (CCEs)) associated with encoded information for a control information format having a given payload size. Search space sets may include common search space sets configured for sending control information to multiple UEs 115 and UE-specific search space sets for sending control information to a specific UE 115.

In some examples, a network entity 105 (e.g., a base station 140, an RU 170) may be movable and therefore provide communication coverage for a moving coverage area 110. In some examples, different coverage areas 110 associated with different technologies may overlap, but the different coverage areas 110 may be supported by the same network entity 105. In some other examples, the overlapping coverage areas 110 associated with different technologies may be supported by different network entities 105. The wireless communications system 100 may include, for example, a heterogeneous network in which different types of the network entities 105 provide coverage for various coverage areas 110 using the same or different radio access technologies.

The wireless communications system 100 may be configured to support ultra-reliable communications or low-latency communications, or various combinations thereof. For example, the wireless communications system 100 may be configured to support ultra-reliable low-latency communications (URLLC). The UEs 115 may be designed to support ultra-reliable, low-latency, or critical functions. Ultra-reliable communications may include private communication or group communication and may be supported by one or more services such as push-to-talk, video, or data. Support for ultra-reliable, low-latency functions may include prioritization of services, and such services may be used for public safety or general commercial applications. The terms ultra-reliable, low-latency, and ultra-reliable low-latency may be used interchangeably herein.

In some examples, a UE 115 may be configured to support communicating directly with other UEs 115 via a device-to-device (D2D) communication link 135 (e.g., in accordance with a peer-to-peer (P2P), D2D, or sidelink protocol). In some examples, one or more UEs 115 of a group that are performing D2D communications may be within the coverage area 110 of a network entity 105 (e.g., a base station 140, an RU 170), which may support aspects of such D2D communications being configured by (e.g., scheduled by) the network entity 105. In some examples, one or more UEs 115 of such a group may be outside the coverage area 110 of a network entity 105 or may be otherwise unable to or not configured to receive transmissions from a network entity 105. In some examples, groups of the UEs 115 communicating via D2D communications may support a one-to-many (1:M) system in which each UE 115 transmits to each of the other UEs 115 in the group. In some examples, a network entity 105 may facilitate the scheduling of resources for D2D communications. In some other examples, D2D communications may be carried out between the UEs 115 without an involvement of a network entity 105.

The core network 130 may provide user authentication, access authorization, tracking, Internet Protocol (IP) connectivity, and other access, routing, or mobility functions. The core network 130 may be an evolved packet core (EPC) or 5G core (5GC), which may include at least one control plane entity that manages access and mobility (e.g., a mobility management entity (MME), an access and mobility management function (AMF)) and at least one user plane entity that routes packets or interconnects to external networks (e.g., a serving gateway (S-GW), a Packet Data Network (PDN) gateway (P-GW), or a user plane function (UPF)). The control plane entity may manage non-access stratum (NAS) functions such as mobility, authentication, and bearer management for the UEs 115 served by the network entities 105 (e.g., base stations 140) associated with the core network 130. User IP packets may be transferred through the user plane entity, which may provide IP address allocation as well as other functions. The user plane entity may be connected to IP services 150 for one or more network operators. The IP services 150 may include access to the Internet, Intranet(s), an IP Multimedia Subsystem (IMS), or a Packet-Switched Streaming Service.

The wireless communications system 100 may operate using one or more frequency bands, which may be in the range of 300 megahertz (MHz) to 300 gigahertz (GHz). Generally, the region from 300 MHz to 3 GHz is known as the ultra-high frequency (UHF) region or decimeter band because the wavelengths range from approximately one decimeter to one meter in length. UHF waves may be blocked or redirected by buildings and environmental features, which may be referred to as clusters, but the waves may penetrate structures sufficiently for a macro cell to provide service to the UEs 115 located indoors. Communications using UHF waves may be associated with smaller antennas and shorter ranges (e.g., less than 100 kilometers) compared to communications using the smaller frequencies and longer waves of the high frequency (HF) or very high frequency (VHF) portion of the spectrum below 300 MHz.

The wireless communications system 100 may utilize both licensed and unlicensed RF spectrum bands. For example, the wireless communications system 100 may employ License Assisted Access (LAA), LTE-Unlicensed (LTE-U) radio access technology, or NR technology using an unlicensed band such as the 5 GHz industrial, scientific, and medical (ISM) band. While operating using unlicensed RF spectrum bands, devices such as the network entities 105 and the UEs 115 may employ carrier sensing for collision detection and avoidance. In some examples, operations using unlicensed bands may be based on a carrier aggregation configuration in conjunction with component carriers operating using a licensed band (e.g., LAA). Operations using unlicensed spectrum may include downlink transmissions, uplink transmissions, P2P transmissions, or D2D transmissions, among other examples.

A network entity 105 (e.g., a base station 140, an RU 170) or a UE 115 may be equipped with multiple antennas, which may be used to employ techniques such as transmit diversity, receive diversity, multiple-input multiple-output (MIMO) communications, or beamforming. The antennas of a network entity 105 or a UE 115 may be located within one or more antenna arrays or antenna panels, which may support MIMO operations or transmit or receive beamforming. For example, one or more base station antennas or antenna arrays may be co-located at an antenna assembly, such as an antenna tower. In some examples, antennas or antenna arrays associated with a network entity 105 may be located at diverse geographic locations. A network entity 105 may include an antenna array with a set of rows and columns of antenna ports that the network entity 105 may use to support beamforming of communications with a UE 115. Likewise, a UE 115 may include one or more antenna arrays that may support various MIMO or beamforming operations. Additionally, or alternatively, an antenna panel may support RF beamforming for a signal transmitted via an antenna port.

The network entities 105 or the UEs 115 may use MIMO communications to exploit multipath signal propagation and increase spectral efficiency by transmitting or receiving multiple signals via different spatial layers. Such techniques may be referred to as spatial multiplexing. The multiple signals may, for example, be transmitted by the transmitting device via different antennas or different combinations of antennas. Likewise, the multiple signals may be received by the receiving device via different antennas or different combinations of antennas. Each of the multiple signals may be referred to as a separate spatial stream and may carry information associated with the same data stream (e.g., the same codeword) or different data streams (e.g., different codewords). Different spatial layers may be associated with different antenna ports used for channel measurement and reporting. MIMO techniques include single-user MIMO (SU-MIMO), for which multiple spatial layers are transmitted to the same receiving device, and multiple-user MIMO (MU-MIMO), for which multiple spatial layers are transmitted to multiple devices.

Beamforming, which may also be referred to as spatial filtering, directional transmission, or directional reception, is a signal processing technique that may be used at a transmitting device or a receiving device (e.g., a network entity 105, a UE 115) to shape or steer an antenna beam (e.g., a transmit beam, a receive beam) along a spatial path between the transmitting device and the receiving device. Beamforming may be achieved by combining the signals communicated via antenna elements of an antenna array such that some signals propagating along particular orientations with respect to an antenna array experience constructive interference while others experience destructive interference. The adjustment of signals communicated via the antenna elements may include a transmitting device or a receiving device applying amplitude offsets, phase offsets, or both to signals carried via the antenna elements associated with the device. The adjustments associated with each of the antenna elements may be defined by a beamforming weight set associated with a particular orientation (e.g., with respect to the antenna array of the transmitting device or receiving device, or with respect to some other orientation).

In some examples, a transmitting device (e.g., a network entity 105, a UE 115, another device) may perform rate splitting to transmit one or more messages to multiple UEs 115. For example, if the transmitting device receives or determines that messages to be respectively transmitted to a first UE 115 and a second UE 115 have a portion in common, the transmitting device may combine parts of the messages into a common stream that is transmitted to both the first UE 115 and the second UE 115. The transmitting device may also transmit a private portion of each message to the first UE 115 and the second UE 115 alongside the common portion. However, the transmitting device may not be configured to compute CRC parity bits for a rate splitting transmission. Additionally, the transmitting device may not be aware of a procedure for attaching the CRC parity bits to the portions of the messages.

In accordance with examples as described herein, a transmitting device may generate CRC parity bits for common and private portions of messages and attach CRC parity bits to code blocks corresponding to the common message, the private message, or both. In some examples, the transmitting device may generate CRC parity bits for a common portion of messages and private portions of the messages and attach CRC parity bits to code blocks corresponding to the common portion, the private portions, or both. Additionally, the transmitting device may generate CRC parity bits for transport blocks and attach CRC parity bits to transport blocks associated with the common portion, the private portions, or both. Additionally, or alternatively, the transmitting device may generate CRC parity bits associated with a block corresponding to both the common portion and the private portions and attach CRC parity bits to the block.

In some cases, the transmitting device may jointly generate CRC parity bits according to both the common portion and the private portion corresponding to a first UE, such as UE 115, and the transmitting device may attach the jointly-generated CRC parity bits to a transport block associated with the common message or a transport block associated with the private message. In some cases, the transmitting device may attach a portion of the jointly-generated CRC parity bits to the transport block associated with the common message and another portion of the jointly-generated CRC parity bits to the transport block associated with the private message.

In some examples, the transmitting device may generate the CRC parity bits according to one or more polynomials. These polynomials may be the same as polynomials that the transmitting device uses for CRC parity bit generation for non-rate splitting transmissions, or the polynomials may be different, which may cover different length and error detectability ranges for different cases or situations that may occur in rate splitting transmissions.

Figure 2:
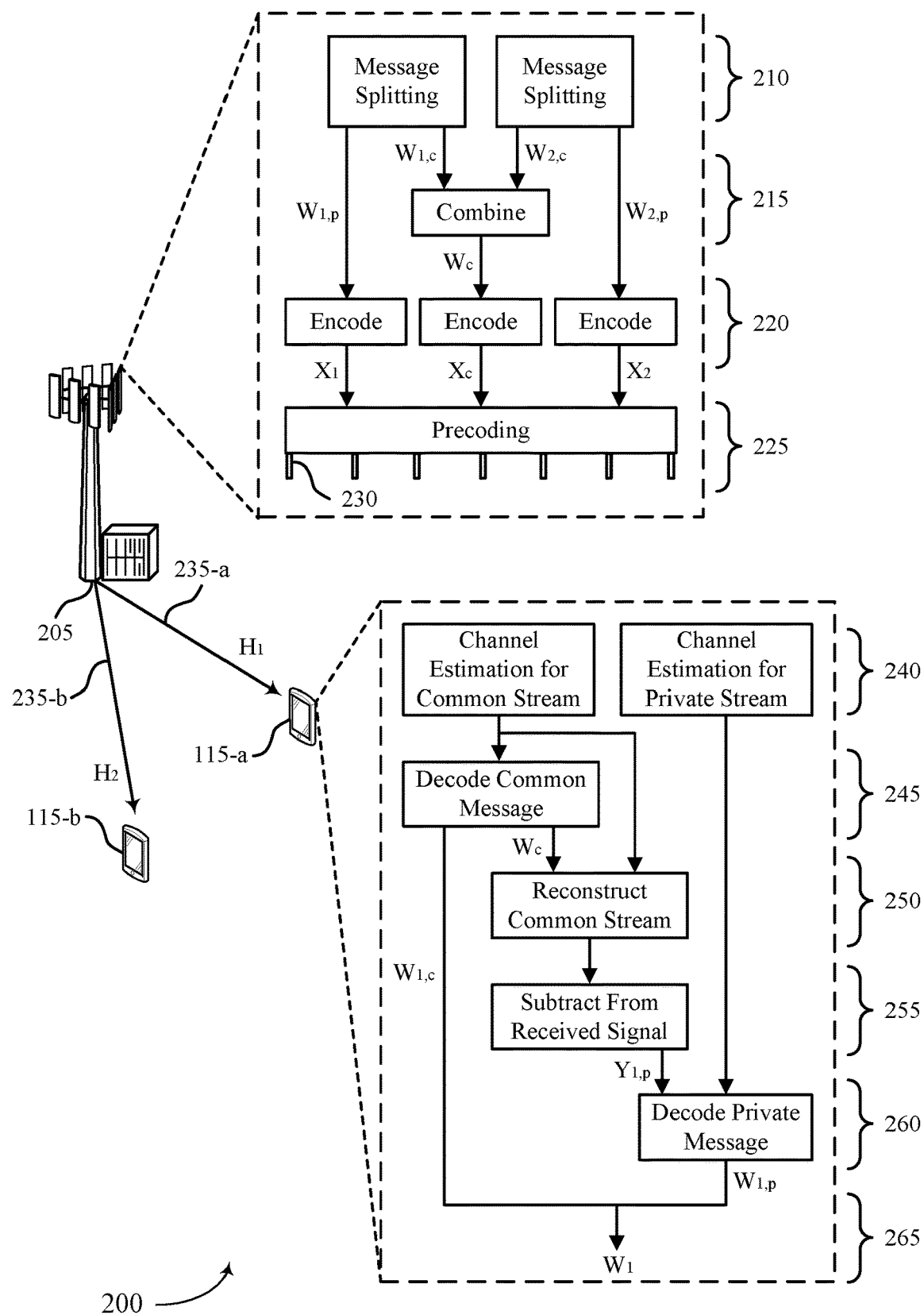
FIG. 2 illustrates an example of a wireless communications system that supports CRC design for common and private transport blocks in rate splitting transmissions in accordance with one or more aspects of the present disclosure.

FIG. 2 illustrates an example of a wireless communications system 200 that supports CRC design for common and private transport blocks in rate splitting transmissions in accordance with one or more aspects of the present disclosure. The wireless communications system 200 illustrates includes a device 205, which may be an example of a network entity 105 or a UE 115 as described herein with reference to FIG. 1. The device 205 may communicate with a UE 115-a and a UE 115-b, which may be examples of a UE 115 as described herein with reference to FIG. 1.

The device 205 may communicate with the UE 115-a and the UE 115-b using rate splitting techniques. For example, the device 205 may receive (e.g., from another device 205) or otherwise determine a first message intended for transmission to the UE 115-a and a second message intended for transmission to the UE 115-b. The device 205 may split messages to the UE 115-a and to the UE 115-b into a common message to be decoded by the UE 115-a and the UE 115-b and private messages unique to each of the UE 115-a and the UE 115-b, respectively. In some examples, the device 205 may use the rate splitting techniques for a broadcast channel, for example, to achieve a relatively high degree of freedom for transmissions, a relatively high capacity for transmissions, to gain other advantages, or any combination. In some cases, the common portion of individual messages of two or more UEs 115 may be combined, for example concatenated, into a common message, $W_c$, encoded and modulated to obtain, $X_c$, which may be referred to as a common stream, and may have one or more layers.

For example, a device 205 may perform message splitting at 210, for the UE 115-a and the UE 115-b. The device 205 may split a first message intended for transmission to the UE 115-a into a common message, $W_{1,c}$, and a private message, $W_{1,p}$. Similarly, the device 205 may split a second message intended for transmission to the UE 115-b into a common message $W_{2,c}$, and a private message, $W_{2,p}$.

At 215, the device 205 may combine the common message of the first message, $W_{1,c}$, with the common message of the second message, $W_{2,c}$, to obtain a combined common message, We. At 220, the device 205 may encode the combined common message, We, the private message of the first message, $W_{1,p}$, and the private message of the second message, $W_{2,p}$, to obtain a common stream, $X_c$, a private stream for the UE 115-a, $X_1$, and a private stream for the UE 115-b, $X_2$, respectively.

At 225, the device 205 may precode the common stream, $X_c$. In some examples, the device 205 may precode $X_c$ using a precoder, $P_c$, and the device 205 may determine $P_c$ based on preconfigured values or otherwise defined values. The device 205 may transmit the precoded common stream using one or more transmit antennas 230. For example, one or more transmission reception points (e.g., in a coordinated multipoint (CoMP) scenario), a base station, or both may transmit the precoded common stream using at least one transmit antenna 230.

The device 205 may encode and modulate the private message of individual messages from the UE 115-a and the UE 115-b (e.g., $W_{1,p}$ and $W_{2,p}$) separately to obtain private streams for the corresponding UEs (e.g., $X_1$ and $X_2$). The private streams may be precoded according to different precoders, such as $P_1$ and $P_2$, respectively. The device 205 may transmit the private streams using different transmit antennas 230 than the common stream. In some examples, the encoding at 220, may include modulation and mapping to one or more layers in addition to encoding.

The device 205 may transmit the precoded transmission, $H_1$, to the UE 115-a, which may include the common stream $X_c$, the private stream $X_{1,p}$, or both. Similarly, the device 205 may transmit the precoded transmission, $H_2$, to the UE 115-b, which may include the common stream $X_c$, the private stream $X_{2,p}$, or both. The device 205 may transmit the common stream and the private streams via transmissions of one or more common transport blocks, private transport blocks, common code blocks, private code blocks, or any combination thereof. For example, the device may transmit the precoded transmission, $H_1$, to the UE 115-a via communication link 235-a, and may transmit the precoded transmission, $H_2$, to the UE 115-b via communication link 235-b. The communication link 235-a and the communication link 235-b may be examples of communication links 125 as described herein with reference to FIG. 1, among other examples.

The UE 115-a and the UE 115-b may receive the one or more common transport blocks, private transport blocks, common code blocks, private code blocks, or combination thereof. In some cases, at the receiver side, each UE 115 may decode the common message prior to the private message, for example, using successive decoding. In some cases, at the receiver side, each UE 115 may decode a respective private message prior to the common. In some examples, at 240, the UE 115-a may perform channel estimation for the common stream $X_c$ and for the private stream $X_{1,p}$. For example, the UE 115-a may estimate an effective channel corresponding to the common stream (e.g., $H_1P_c$). At 245, the UE 115-a may decode the common stream $X_c$ to obtain the common message (e.g., We), which may include demodulation and de-mapping procedures. The common message may include a message of the individual message for each UE 115 (e.g., $W_{1,c}$ and $W_{2,c}$) embedded in the common message, including data intended for the individual UE 115-a.

At 250, to obtain the private message, the UE 115-a may re-encode the common stream (e.g., $X_c$) and may adapt based on (e.g., may multiply) by the estimated effective channel (e.g., $H_1P_c$). At 255, the UE 115-a may adapt the result (e.g., may subtract the result) from a received signal, $Y_1$, which may result in an effective channel for the private message, $Y_{1,p}$. That is, the UE 115-a may perform a cancelation according to Equation 1:

$$Y_{1,p} = Y_1 - H_1 P_c X_c = H_1 P_1 X_1 + H_1 P_2 X_2 + N_1 \qquad (1)$$

where $N_1$ is an interference value, and Equation 1 is based on a correct channel estimation and successful decoding.

At 260, the UE 115-a may use $Y_{1,p}$ to decode the private message, $W_{1,p}$. Accordingly, the UE 115-a may obtain an overall message, $W_1$, based on the common message (e.g., $W_{1,c}$) and the private message (e.g., $W_{1,p}$). The UE 115-b may follow a similar process for obtaining a common message (e.g., $W_{2,c}$) and a private message (e.g., $W_{2,p}$), which the UE 115-b may use to obtain an overall message, $W_2$.

The device 205 may compute CRC parity bits for one or more of the transport blocks and the code blocks used for the transmissions to the UE 115-a and the UE 115-b. However, as the primary decoding technique for a UE 115 using other different techniques is successive decoding, more efficient error detectability and correction may be desired. Further, the device 205 may not be configured to compute CRC parity bits for a rate splitting transmission, and may not be aware of a procedure for attaching the CRC parity bits to the portions of the messages.

In accordance with examples as described herein, the device 205 may generate (e.g., compute or calculate) CRC parity bits for common transport blocks, private transport blocks, common code blocks, private code blocks, one or more other blocks, or any combination thereof, and may attach them to the respective blocks. For example, for a transport block, the device 205 may calculate CRC parity bits based on the entire transport block (e.g., all bits of the transport block). The device 205 may denote each bit in a transport block according to a sequence (e.g., $a_0, a_1, a_2, a_3, \ldots, a_{A-1}$, where A is the quantity of bits in the transport block) and each CRC parity bit according to another sequence (e.g., $p_0, p_1, p_2, p_3, \ldots, p_{L-1}$, where L is the quantity of parity bits). In some examples, the lowest order information bit (e.g., $a_0$) may be mapped to a bit, such as the most significant bit, of the transport block. The device 205 may calculate values for the CRC parity bits based on one or more cyclic generator polynomials, such as $g_{CRC24A}(D)$, which may correspond to a CRC with a length (e.g., L) of 24 parity bits, and is given below in Equation 2:

$$g_{CRC24C}(D) = D^{24} + D^{23} + D^{18} + D^{17} + D^{14} + D^{11} + D^{10} + D^7 + D^6 + D^5 + D^4 + D^3 + D + 1 \qquad (2)$$

For a code block, the device 205 may perform code block segmentation onto one or more code blocks based on bits corresponding to a transport block, including the CRC parity bits. In some examples, bits after code block segmentation for each block may be denoted by a sequence (e.g., $c_{r0}, C_{r1}, C_{r2}, C_{r3}, \ldots, C_{r(K_r-1)}$, where r is the code block number and Kr is the quantity of bits in the code block with number r)

which may be used to calculate CRC parity bits based on one or more cyclic generator polynomials such as $g_{CRC24B}(D)$, which may correspond to a CRC with a length (e.g., L) of 24 parity bits, and is given below in Equation 3:

$$g_{CRC24B}(D)=D^{24}+D^{23}+D^{6}+D^{5}+D+1 \qquad (3)$$

In some examples, the device 205 may generate the CRC parity bits according to the polynomials of Equations 2 and 3. In other examples, the device 205 may generate parity bits based on different polynomials. For example, the device 205 may use one or more polynomials for rate splitting transmissions that are different from polynomials that the device 205 uses for CRC parity bit generation for non-rate splitting transmissions. That is, the device 205 may be configured with a set of one or more polynomials for rate splitting transmissions which may be different than a configured set of one or more polynomials for non-rate splitting transmissions. This may allow the device 205 to cover different length and error detectability ranges for different cases that may occur in rate splitting transmissions. For example, different polynomials may be used for different lengths (e.g., quantity) of CRC parity bits, or different situations.

In some examples, the device 205 may generate CRC parity bits (one or more CRC parity bits) for a common portion of message(s) and private portions of the messages, and attach the CRC parity bits to code blocks corresponding to the common portion of the message(s), one or more of the private portions of the messages, or any combination. Additionally, the device 205 may generate CRC parity bits for transport blocks and attach them to transport blocks associated with the common message, the private messages, or both. Additionally, or alternatively, the device 205 may generate CRC parity bits associated with a block corresponding to both the common portion of the message(s) and the one or more of the private portions of the messages, and attach them to the block. Details regarding the attachment of the CRC parity bits are described in further detail herein, with reference to FIGS. 3A, 3B, and 3C.

In some cases, the device 205 may jointly generate CRC parity bits according to both the common portion of the message(s) and the one or more of the private portions of the messages corresponding to the UE 115-a, the UE 115-b, or both, and the device 205 may attach the jointly-generated CRC parity bits to a transport block associated with the common portion of the message(s) or a transport block associated with the one or more of the private portions of the messages. In some cases, the device 205 may attach a portion of the jointly-generated CRC parity bits to the transport block associated with the common portion of the message(s) and another portion of the jointly-generated CRC parity bits to the transport block associated with the private messages. Details regarding the joint generation and attachment of the CRC parity bits are described in further detail herein, with reference to FIGS. 4A and 4B.

Figure 3A:
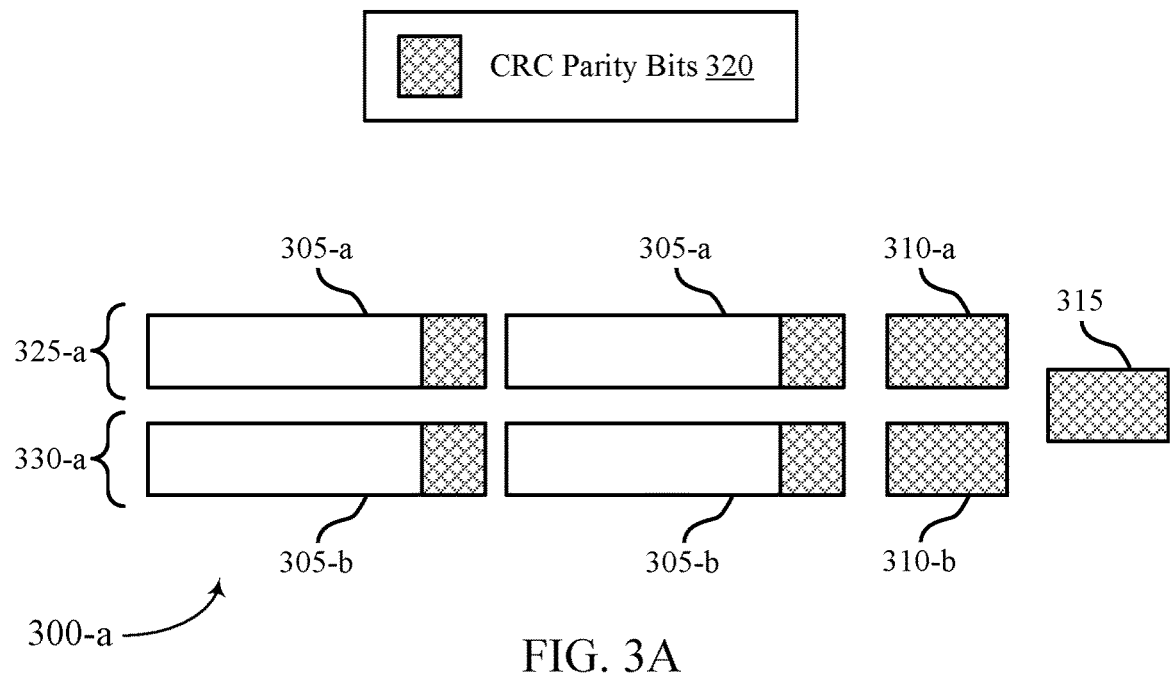
FIG. 3A illustrates an example of a CRC attachment diagram that supports CRC design for common and private transport blocks in rate splitting transmissions in accordance with one or more aspects of the present disclosure.

FIG. 3A illustrates an example of a CRC attachment diagram 300-a that supports CRC design for common and private transport blocks in rate splitting transmissions in accordance with one or more aspects of the present disclosure. The CRC attachment diagram 300-a may illustrate methods for a device to attach CRC parity bits 320 to code blocks 305, transport blocks 310, or both, as described herein with reference to FIGS. 1 and 2.

In some examples, a device (e.g., a network entity 105, a UE 115, or another device) may generate CRC parity bits 320 for a common message and/or a private message of a rate splitting transmission intended for a UE 115, as described herein with reference to FIG. 2. The device may transmit the CRC parity bits 320 to one or more code blocks 305, a transport blocks 310, additional blocks 315, or any combination thereof. With reference to FIG. 3A, blocks corresponding to section 325-a may refer to blocks associated with the common message, and blocks corresponding to section 330-a may refer to blocks associated with the private message.

As illustrated in FIG. 3A, the device may generate and attach CRC parity bits 320 to one or more code blocks 305-a corresponding to the common message. Additionally, the device may generate and attach CRC parity bits 320 to one or more code blocks 305-b corresponding to the private message. In some examples, the device may attach CRC parity bits 320 to a transport block 310-a corresponding to the common message, and CRC parity bits 320 to a transport block 310-b corresponding to the private message.

In some cases, the device may additionally generate and attach CRC parity bits 320 to a block 315, such as for example a transport block, associated with both the common message and the private message. This may provide a receiving UE 115 additional opportunities for error detection across the entire transmission. Accordingly, the device may attach CRC parity bits 320 to code blocks 305, transport blocks 310, and additional blocks 315 associated with a rate splitting transmission to a UE 115, which may provide more efficient error detectability and correction for the transmission. For example, if the receiving UE 115 detects a single error based on the CRC parity bits 320 corresponding to transport block 310-b, the receiving UE 115 may determine that an error is present in the private message, but may determine that the common message was decoded without errors.

Figure 3B:
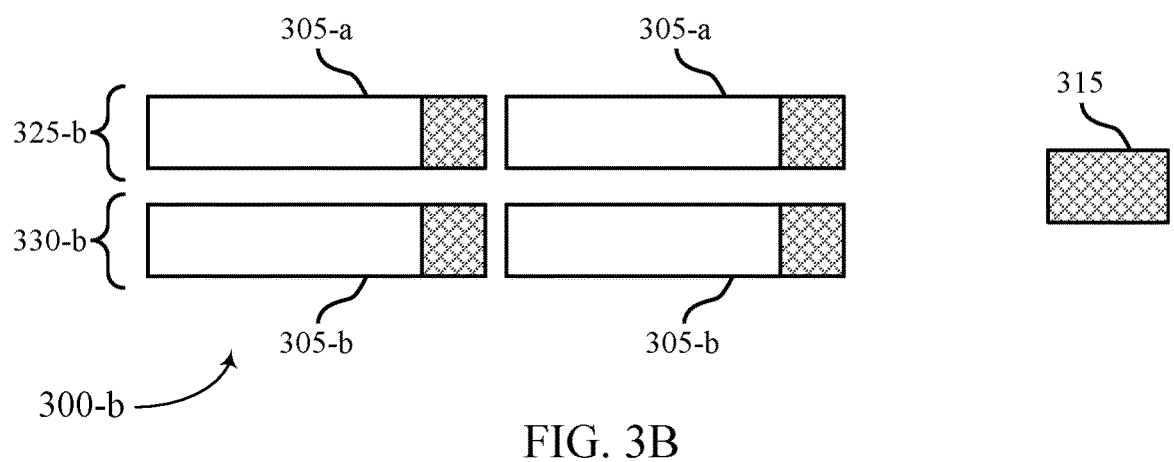
FIG. 3B illustrates an example of a CRC attachment diagram that supports CRC design for common and private transport blocks in rate splitting transmissions in accordance with one or more aspects of the present disclosure.

FIG. 3B illustrates an example of a CRC attachment diagram 300-b that supports CRC design for common and private transport blocks in rate splitting transmissions in accordance with one or more aspects of the present disclosure. The CRC attachment diagram 300-b may illustrate methods for a device to attach CRC parity bits 320 to code blocks 305, transport blocks 310, or both, as described herein with reference to FIGS. 1 and 2.

In some examples, a device (e.g., a network entity 105, a UE 115, or another device) may generate CRC parity bits 320 for a common message and a private message of a rate splitting transmission intended for a UE 115, as described herein with reference to FIG. 2. The device may transmit the CRC parity bits 320 to one or more code blocks 305, transport blocks 310, additional blocks 315, or any combination thereof. With reference to FIG. 3B, blocks corresponding to a section 325-b may refer to blocks associated with the common message, and blocks corresponding to a section 330-b may refer to blocks associated with the private message.

As illustrated in FIG. 3B, the device may generate and attach CRC parity bits 320 to one or more code blocks 305-a corresponding to the common message. Additionally, the device may generate and attach CRC parity bits 320 to one or more code blocks 305-b corresponding to the private message. In some examples, the device may refrain from attaching CRC parity bits 320 to any transport blocks 310, which may reduce transmission overhead and computations performed at the device. Additionally, a receiving UE 115 may check a single CRC associated with CRC parity bits 320 in block 315, which may reduce processing time relative to, for example, checking CRC for transport block 310-a associated with the common message and for transport block 310-b associated with the private message.

For example, the device may refrain from including CRC parity bits 320 in transport blocks 310, and instead generate and attach CRC parity bits 320 to a block 315 associated with both the common message and the private message. This may provide a receiving UE 115 additional opportunities for error detection across the entire transmission, among other advantages. Accordingly, the device may attach CRC parity bits 320 to code blocks 305, transport blocks 310, and additional blocks 315 associated with a rate splitting transmission to a UE 115, which may provide more efficient error detectability and correction for the transmission.

Figure 3C:
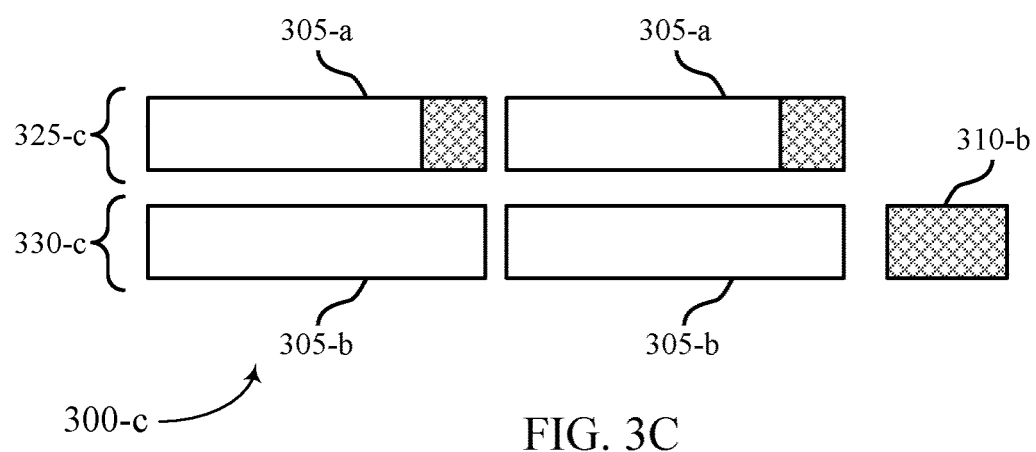
FIG. 3C illustrates an example of a CRC attachment diagram that supports CRC design for common and private transport blocks in rate splitting transmissions in accordance with one or more aspects of the present disclosure.

FIG. 3C illustrates an example of a CRC attachment diagram 300-c that supports CRC design for common and private transport blocks in rate splitting transmissions in accordance with one or more aspects of the present disclosure. The CRC attachment diagram 300-c may illustrate methods for a device to attach CRC parity bits 320 to code blocks 305, transport blocks 310, or both, as described herein with reference to FIGS. 1 and 2.

In some examples, a device (e.g., a network entity 105, a UE 115, or another device) may generate CRC parity bits 320 for a common message and a private message of a rate splitting transmission intended for a UE 115, as described herein with reference to FIG. 2. The device may transmit the CRC parity bits 320 to one or more code blocks 305, transport blocks 310, or both. With reference to FIG. 3C, blocks corresponding to a section 325-c may refer to blocks associated with the common message, and blocks corresponding to a section 330-c may refer to blocks associated with the private message.

As illustrated in FIG. 3C, the device may generate and attach CRC parity bits 320 to one or more code blocks 305-a corresponding to the common message, and the device may refrain from attaching CRC parity bits 320 to one or more code blocks 305-b corresponding to the private message. For example, if a receiving UE 115 decodes a common message first, and then decodes the private message based on decoding the common message, then an error indicated by the CRC parity bits 320 in code block 305-a may result in an error in the private message. As such, the device may attach the CRC parity bits 320 to the one or more code blocks 305-a and refrain from attaching CRC parity bits 320 to any code blocks 305-b.

Alternatively, the device may generate and attach CRC parity bits 320 to one or more code blocks 305-b corresponding to the private message, and the device may refrain from attaching CRC parity bits 320 to one or more code blocks 305-a corresponding to the common message. For example, if a receiving UE 115 decodes a private message first, and then decodes the common message based on decoding the private message, then an error indicated by the CRC parity bits 320 in code block 305-b may result in an error in the common message. As such, the device may attach the CRC parity bits 320 to the one or more code blocks 305-b and refrain from attaching CRC parity bits 320 to any code blocks 305-a.

In some examples, the device may generate and attach CRC parity bits 320 to one or more transport blocks 310-b corresponding to the private message. Additionally, or alternatively, the device may generate and attach CRC parity bits 320 to one or more transport blocks 310-a. Attaching CRC parity bits 320 to one or more transport blocks 310 may provide a receiving UE 115 with an additional layer of error detection. Accordingly, the device may attach CRC parity bits 320 to code blocks 305, transport blocks 310, or both, associated with a rate splitting transmission to a UE 115. This may provide more efficient error detectability and correction for the transmission, among other advantages.

Figure 4A:
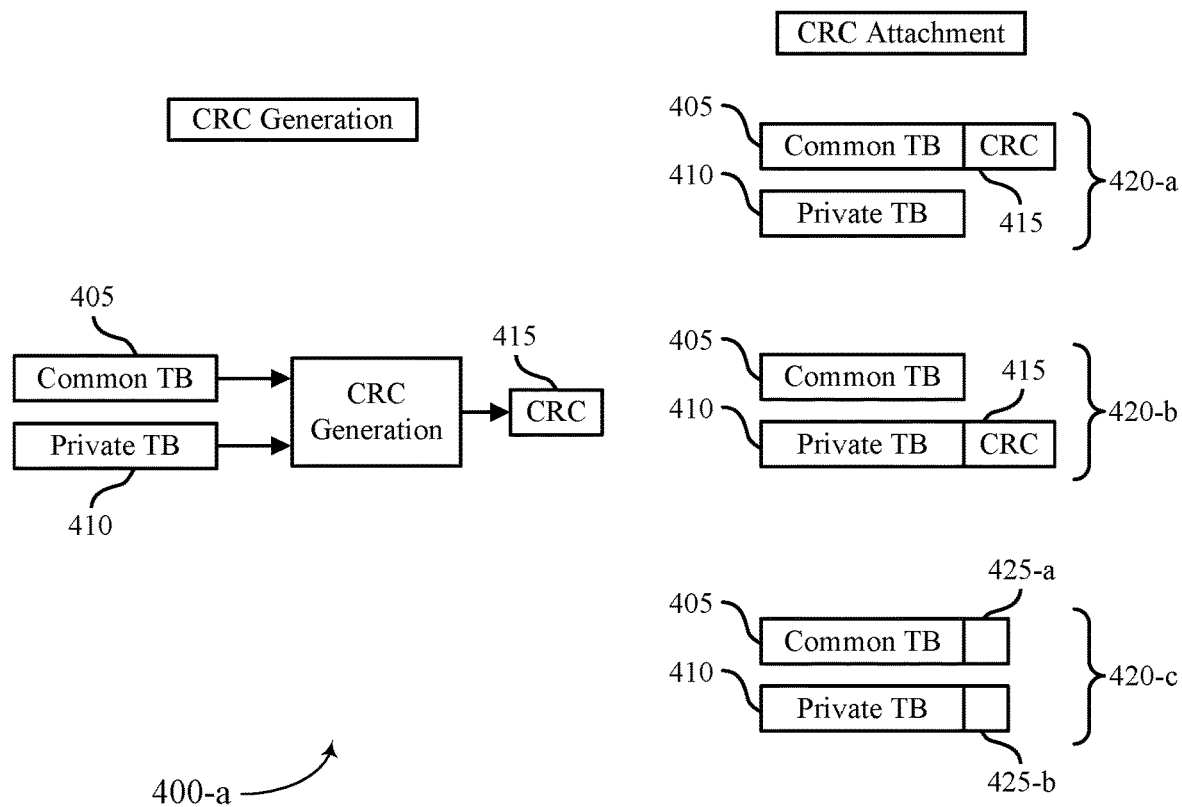
FIG. 4A illustrates an example of a diagram that supports CRC design for common and private transport blocks in rate splitting transmissions in accordance with one or more aspects of the present disclosure.

FIG. 4A illustrates an example of a diagram 400-a that supports CRC design for common and private transport blocks in rate splitting transmissions in accordance with one or more aspects of the present disclosure. The diagram 400-a may illustrate methods for a device to generate and attach CRC parity bits to code blocks, transport blocks, or both, as described herein with reference to FIGS. 1 through 3C.

A device (e.g., a network entity 105, a UE 115, or another device) may perform CRC generation (e.g., compute CRC parity bits) based on bits corresponding to a common transport block (e.g., common TB) 405 and a private transport block (e.g., private TB) 410. The common transport block 405 and the private transport block 410 may correspond to a common message and a private message of a rate splitting transmission to a UE 115, as described in more detail herein, with reference to FIG. 2.

In some examples, the device may be configured to perform joint CRC generation based on the common transport block 405 and the private transport block 410. For example, the device may generate a single CRC 415 (e.g., CRC parity bits) based on bits corresponding to the common transport block 405 and bits corresponding to the private transport block 410.

The device may be configured to attach the CRC 415 to the common transport block 405, the private transport block 410, or both, for a transmission to a UE 115. For example, in case 420-a, the device may attach the generated CRC 415 to the common transport block 405. In another example, as in case 420-b, the device may attach the CRC 415 to the private transport block 410.

In some examples, the device may be configured to split the CRC 415 into one or more CRC portions 420. For example, the device may split the generated CRC 415 into a first CRC portion 425-a and a second CRC portion 425-b. In some cases, the first CRC portion 425-a may contain a first half of the bits corresponding to the CRC 415, while the second CRC portion 425-b may contain a second half of the bits corresponding to the CRC 415. In other cases, the device may split the CRC 415 into different proportions. In some examples, as in case 420-c, the device may attach the first CRC portion 425-a to the common transport block 405, and the second CRC portion 425-b to the private transport block 410.

Accordingly, the device may generate CRC 415 and transmit the CRC 415 in common transport blocks 405, private transport blocks 410, or both, corresponding to a rate splitting transmission for a UE 115. This may provide for more efficient CRC generation at the device and reduce transmission overhead regarding transmission of CRC 415, among other advantages.

Figure 4B:
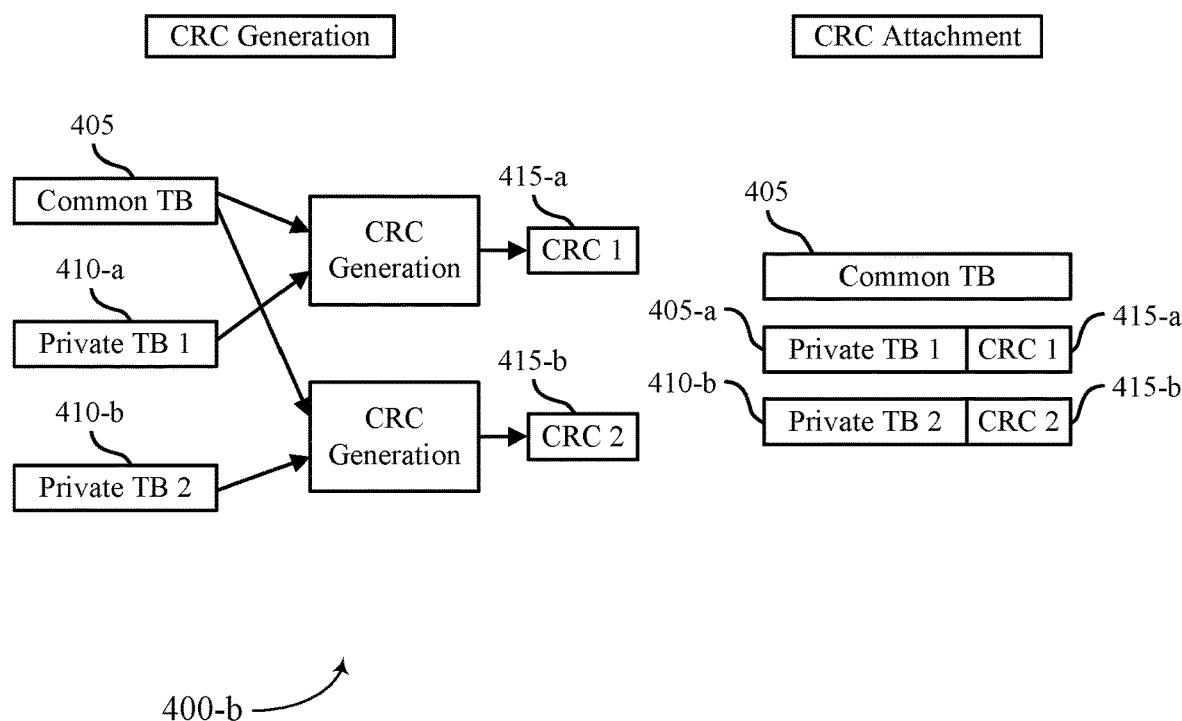
FIG. 4B illustrates an example of a diagram that supports CRC design for common and private transport blocks in rate splitting transmissions in accordance with one or more aspects of the present disclosure.

FIG. 4B illustrates an example of a diagram 400-b that supports CRC design for common and private transport blocks in rate splitting transmissions in accordance with one or more aspects of the present disclosure. The diagram 400-a may illustrate methods for a device to generate and attach CRC parity bits to code blocks, transport blocks, or both, as described herein with reference to FIGS. 1 through 3C.

A device (e.g., a network entity 105, a UE 115, or another device) may perform CRC generation (e.g., compute CRC parity bits) based on bits corresponding to a common transport block (e.g., common TB) 405 and a private transport block (e.g., private TB) 410. The common transport block 405 and the private transport block 410-a may correspond to a common message and a private message of a rate splitting transmission to a first UE 115, and the common transport block 405 and the private transport block 410-*b* may correspond to the common message and a private message of a rate splitting transmission to a second UE 115, as described in more detail herein, with reference to FIG. 2.

In some examples, the device may be configured to perform joint CRC generation based on the common transport block 405, the private transport block 410-*a*, and the private transport block 410-*b*. For example, the device may generate a first CRC 415-*a* (e.g., CRC parity bits) based on bits corresponding to the common transport block 405 and bits corresponding to the private transport block 410-*a*. The device may additionally generate a second CRC 415-*b* based on bits corresponding to the common transport block 405 and bits corresponding to the private transport block 410-*b*. The first CRC 415-*a* may be associated with a rate splitting transmission to the first UE 115, and the second CRC 415-*b* may be associated with a rate splitting transmission to the second UE 115.

In some examples, the device may be configured to attach the first CRC 415-*a* to the private transport block 410-*a*, which may correspond to a private message for the first UE 115. Additionally, the device may be configured to attach the second CRC 415-*b* to the private transport block 410-*b*, which may correspond to a private message for the second UE 115. to a UE 115.

Accordingly, the device may jointly generate the first CRC 415-*a* and the second CRC 415-*b* for a rate splitting transmission for a first UE 115 and a second UE 115. This may provide for more efficient CRC generation at the device and reduce transmission overhead regarding transmission of CRC 415, among other advantages.

Figure 5:
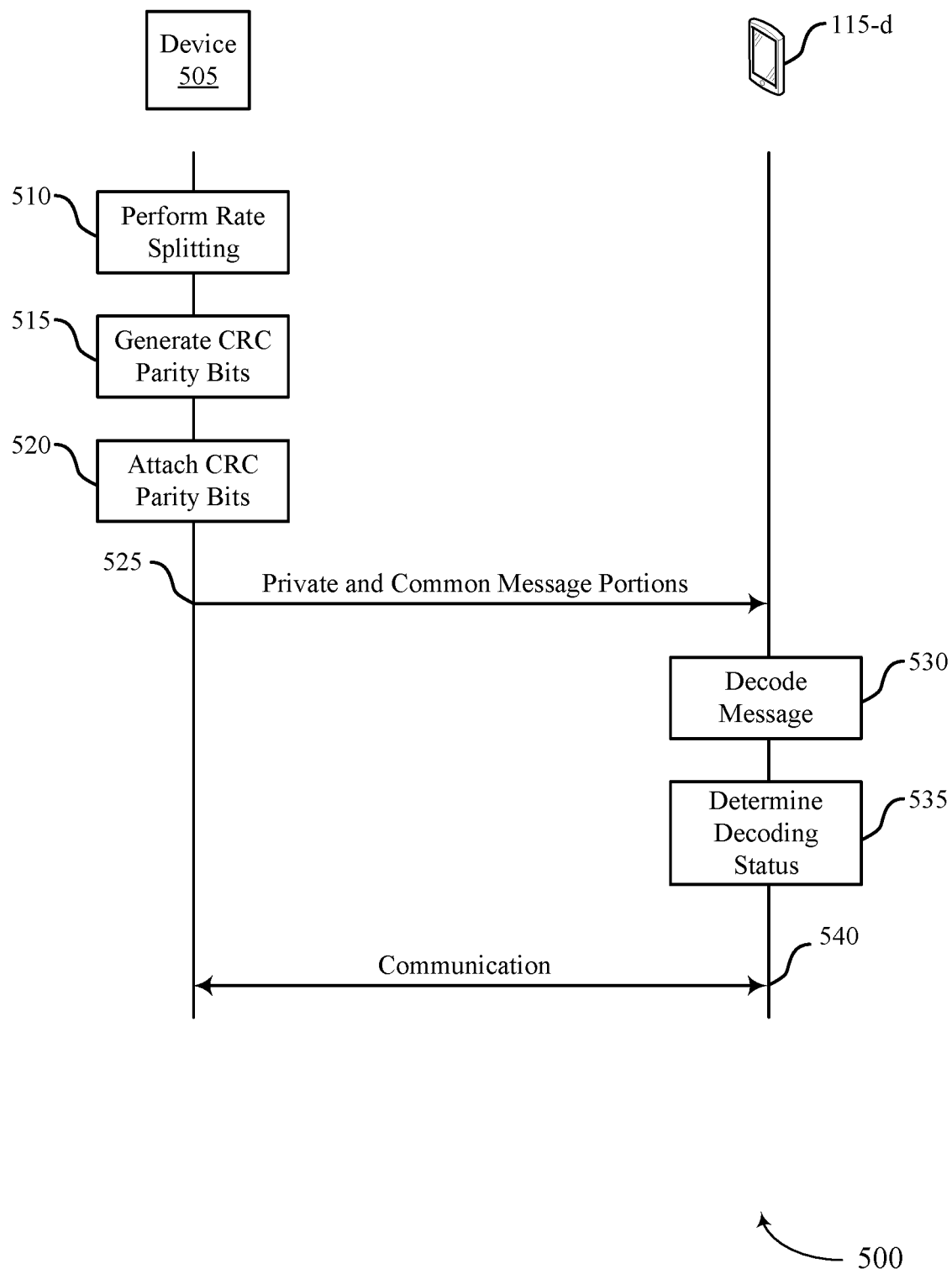
FIG. 5 illustrates an example of a process flow that supports CRC design for common and private transport blocks in rate splitting transmissions in accordance with one or more aspects of the present disclosure.

FIG. 5 illustrates an example of a process flow 500 that supports CRC design for common and private transport blocks in rate splitting transmissions in accordance with one or more aspects of the present disclosure. The process flow 500 may be implemented in a wireless communications system 100 or a wireless communications system 200 as described with reference to FIGS. 1 and 2. The process flow 500 may include a UE 115-*d*, which may be an example of a UE 115 as described with reference to FIGS. 1 through 4. The process flow 500 may also include a device 505, which may be an example devices as described with reference to FIGS. 1 through 4. In the following description of the process flow 500, the operations performed by the devices may be performed in different orders or at different times. Additionally, or alternatively, some operations may be omitted from the process flow 500, and other operations may be added to the process flow 500.

At 510, the device 505 may perform rate splitting on a first message for a first UE 115-*d* and a second message for a second UE 115. In some examples, the first message may include a first private portion and a first common portion, and the second message may include a second private portion and a second common portion. The device 505 may combine the first common portion and the second common portion into a third common portion, as described herein with reference to FIG. 2. In some examples, the device 505 may encode the first private portion, the second private portion, and the third common portion.

At 515, the device 505 may generate CRC parity bits associated with the first private portion, the third common portion, or both, as described in further detail herein, with reference to FIGS. 1 through 4B. In some examples, the device 505 may generate a first set of CRC parity bits for one or more code blocks associated with the first private portion, the third common portion, or both. Additionally, or alternatively, the device 505 may generate a second set of CRC parity bits for one or more transport blocks associated with the first private portion, the third common portion, or both. In some examples, the device 505 may jointly generate the first set of CRC parity bits based on a transport block associated with the first private portion and a transport block associated with the third common portion. In some cases, the generation of the CRC parity bits may be based on the encoding of the first private portion, the second private portion and the third common portion. The generation of the CRC parity bits may be based on a set of one or more polynomials associated with rate splitting transmissions, which may be different from a set of one or more polynomials associated with non-rate splitting transmissions. The device 505 may additionally or alternatively perform similar CRC generation procedures to generate CRC parity bits for a second UE 115.

At 520, the device 505 may attach the generated CRC parity bits to one or more blocks associated with a transmission to the UE 115-*d*, as described herein with reference to FIGS. 2 through 4B. In some examples, the device 505 may attach generated CRC parity bits to at least one transport block, at least one code block, or both. For example, the device 505 may attach the first set of CRC parity bits to at least one code block and the second set of CRC parity bits to at least one transport block. Additionally, or alternatively, the device 505 may attach the first set of CRC parity bits to at least one first code block associated with the first private portion and to at least one second code block associated with the third common portion, and the device 505 may attach the second set of CRC parity bits to at least one first transport block associated with the first private portion and to at least one second transport block associated with the third common portion. In some cases, the device 505 may attach a third set of generated CRC parity bits to a block that is associated with both the first private portion and the third common portion.

In some examples, the device 505 may attach the first set of CRC parity bits to at least one code block associated with the third common portion, and refrain from attaching CRC parity bits to code blocks associated with the first private portion. Alternatively, the device 505 may attach the first set of CRC parity bits to at least one code block associated with the first private portion, and refrain from attaching CRC parity bits to code blocks associated with the third common portion. Similarly, the device 505 may attach generated CRC parity bits to at least one transport block associated with the first private portion, and refrain from attaching generated CRC parity bits to transport blocks associated with the third common portion. Alternatively, the device 505 may attach generated CRC parity bits to at least one transport block associated with the third common portion, and refrain from attaching generated CRC parity bits to transport blocks associated with the first private portion. In some examples, the device 505 may attach a first portion of the generated CRC parity bits (e.g., jointly-generated CRC parity bits) to a transport block associated with the third common portion, and a second portion of the generated CRC parity bits to a transport block associated with the first private portion.

At 525, the device 505 may transmit a message including the first private portion, the third common portion, and the generated CRC parity bits to the first UE 115-*d*. The device 505 may additionally transmit the second private portion and the third common portion to a second UE 115. The transmissions may include transmissions of at least one code block, at least one transport block, at least one block, or any combination thereof. The code blocks, transport blocks, blocks, or combination thereof may include one or more of the generated CRC parity bits based on the attaching of the CRC parity bits.

At 530, the UE 115-*d* may decode the first private portion, the third common portion, and the CRC parity bits included in the message. In some examples, the decoding may be based on a set of one or more polynomials associated with rate splitting transmissions, which may be different from a set of one or more polynomials associated with non-rate splitting transmissions.

At 535, the 115-*d* may determine a decoding status based on the CRC parity bits. For example, in some cases, the UE 115-*d* may determine that the third common portion, the first private portion, or both, contain errors based on the CRC parity bits (e.g., the CRC based on the CRC parity bits failed). Alternatively, the UE 115-*d* may determine that the message may contain no errors based on the CRC parity bits (e.g., the CRC based on the CRC parity bits passed).

At 540, the UE 115-*d* and the device 505 may communicate based on the decoding status. For example, the UE 115-*d* may request a retransmission of at least part of the message based on the decoding status indicating that the CRC associated with at least part of the message failed.

Figure 6:
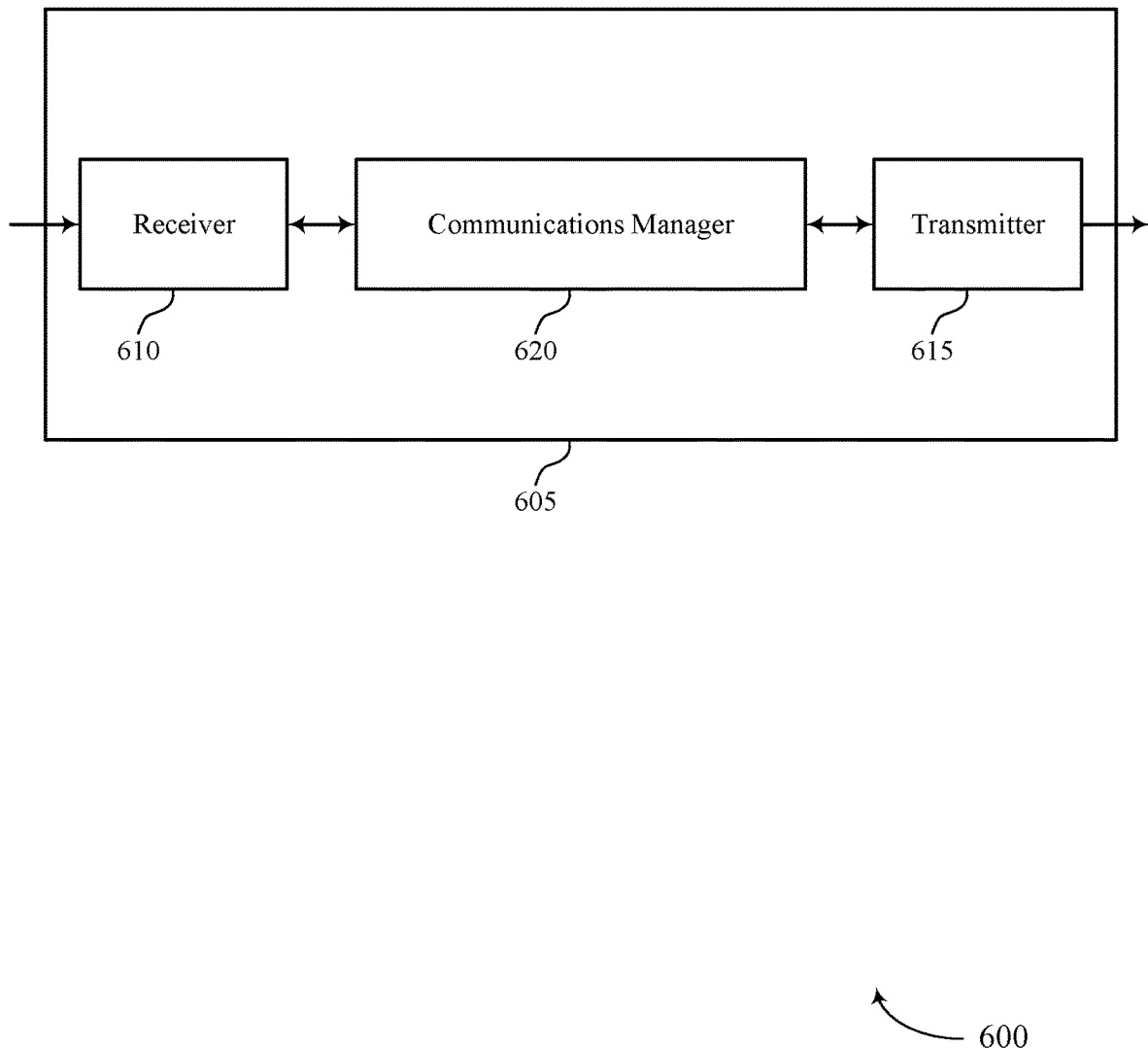
FIGS. 6 and 7 show block diagrams of devices that support CRC design for common and private transport blocks in rate splitting transmissions in accordance with one or more aspects of the present disclosure.

FIG. 6 shows a block diagram 600 of a device 605 that supports CRC design for common and private transport blocks in rate splitting transmissions in accordance with one or more aspects of the present disclosure. The device 605 may be an example of aspects of a UE 115 as described herein. The device 605 may include a receiver 610, a transmitter 615, and a communications manager 620. The device 605 may also include a processor. Each of these components may be in communication with one another (e.g., via one or more buses).

The receiver 610 may provide a means for receiving information such as packets, user data, control information, or any combination thereof associated with various information channels (e.g., control channels, data channels, information channels related to CRC design for common and private transport blocks in rate splitting transmissions). Information may be passed on to other components of the device 605. The receiver 610 may utilize a single antenna or a set of multiple antennas.

The transmitter 615 may provide a means for transmitting signals generated by other components of the device 605. For example, the transmitter 615 may transmit information such as packets, user data, control information, or any combination thereof associated with various information channels (e.g., control channels, data channels, information channels related to CRC design for common and private transport blocks in rate splitting transmissions). In some examples, the transmitter 615 may be co-located with a receiver 610 in a transceiver module. The transmitter 615 may utilize a single antenna or a set of multiple antennas.

The communications manager 620, the receiver 610, the transmitter 615, or various combinations thereof or various components thereof may be examples of means for performing various aspects of CRC design for common and private transport blocks in rate splitting transmissions as described herein. For example, the communications manager 620, the receiver 610, the transmitter 615, or various combinations or components thereof may support a method for performing one or more of the functions described herein.

In some examples, the communications manager 620, the receiver 610, the transmitter 615, or various combinations or components thereof may be implemented in hardware (e.g., in communications management circuitry). The hardware may include a processor, a digital signal processor (DSP), a central processing unit (CPU), an application-specific integrated circuit (ASIC), a field-programmable gate array (FPGA) or other programmable logic device, a microcontroller, discrete gate or transistor logic, discrete hardware components, or any combination thereof configured as or otherwise supporting a means for performing the functions described in the present disclosure. In some examples, a processor and memory coupled with the processor may be configured to perform one or more of the functions described herein (e.g., by executing, by the processor, instructions stored in the memory).

Additionally, or alternatively, in some examples, the communications manager 620, the receiver 610, the transmitter 615, or various combinations or components thereof may be implemented in code (e.g., as communications management software or firmware) executed by a processor. If implemented in code executed by a processor, the functions of the communications manager 620, the receiver 610, the transmitter 615, or various combinations or components thereof may be performed by a general-purpose processor, a DSP, a CPU, an ASIC, an FPGA, a microcontroller, or any combination of these or other programmable logic devices (e.g., configured as or otherwise supporting a means for performing the functions described in the present disclosure).

In some examples, the communications manager 620 may be configured to perform various operations (e.g., receiving, obtaining, monitoring, outputting, transmitting) using or otherwise in cooperation with the receiver 610, the transmitter 615, or both. For example, the communications manager 620 may receive information from the receiver 610, send information to the transmitter 615, or be integrated in combination with the receiver 610, the transmitter 615, or both to obtain information, output information, or perform various other operations as described herein.

The communications manager 620 may support wireless communications at a device in accordance with examples as disclosed herein. For example, the communications manager 620 may be configured as or otherwise support a means for performing rate splitting on a first message for a first UE and a second message for a second UE, the first message including a first private portion and a first common portion, and the second message including a second private portion and a second common portion, the rate splitting including combining the first common portion and the second common portion into a third common portion. The communications manager 620 may be configured as or otherwise support a means for generating CRC parity bits associated with at least one of the first private portion and the third common portion. The communications manager 620 may be configured as or otherwise support a means for transmitting, based on the generating, the first private portion and the third common portion to the first UE, and the second private portion and the third common portion to the second UE.

Additionally, or alternatively, the communications manager 620 may support wireless communications at a UE in accordance with examples as disclosed herein. For example, the communications manager 620 may be configured as or otherwise support a means for receiving, from a device, a message including a private portion, a common portion, and CRC parity bits. The communications manager 620 may be configured as or otherwise support a means for decoding the private portion and the common portion based on receiving the message. The communications manager 620 may be configured as or otherwise support a means for determining a decoding status based on the CRC parity bits. The communications manager 620 may be configured as or otherwise support a means for communicating with the device based on determining the decoding status.

By including or configuring the communications manager 620 in accordance with examples as described herein, the device 605 (e.g., a processor controlling or otherwise coupled with the receiver 610, the transmitter 615, the communications manager 620, or any combination thereof) may support techniques for CRC design for common and private transport blocks in rate splitting transmissions that reduce processing time and transmission overhead related to generating and transmitting CRC parity bits.

Figure 7:
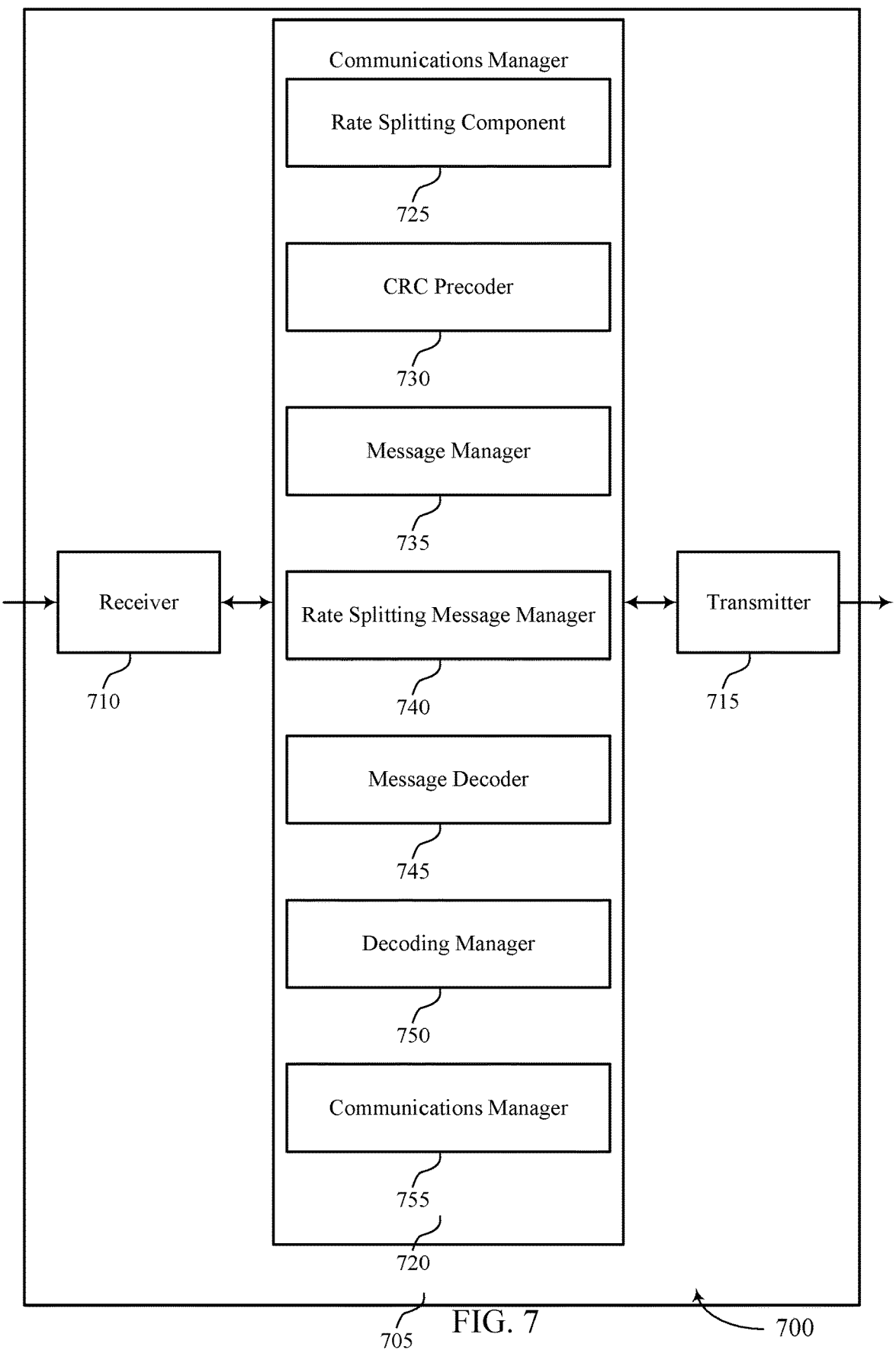

FIG. 7 shows a block diagram 700 of a device 705 that supports CRC design for common and private transport blocks in rate splitting transmissions in accordance with one or more aspects of the present disclosure. The device 705 may be an example of aspects of a device 605 or a UE 115 as described herein. The device 705 may include a receiver 710, a transmitter 715, and a communications manager 720. The device 705 may also include a processor. Each of these components may be in communication with one another (e.g., via one or more buses).

The receiver 710 may provide a means for receiving information such as packets, user data, control information, or any combination thereof associated with various information channels (e.g., control channels, data channels, information channels related to CRC design for common and private transport blocks in rate splitting transmissions). Information may be passed on to other components of the device 705. The receiver 710 may utilize a single antenna or a set of multiple antennas.

The transmitter 715 may provide a means for transmitting signals generated by other components of the device 705. For example, the transmitter 715 may transmit information such as packets, user data, control information, or any combination thereof associated with various information channels (e.g., control channels, data channels, information channels related to CRC design for common and private transport blocks in rate splitting transmissions). In some examples, the transmitter 715 may be co-located with a receiver 710 in a transceiver module. The transmitter 715 may utilize a single antenna or a set of multiple antennas.

The device 705, or various components thereof, may be an example of means for performing various aspects of CRC design for common and private transport blocks in rate splitting transmissions as described herein. For example, the communications manager 720 may include a rate splitting component 725, an CRC precoder 730, a message manager 735, a rate splitting message manager 740, a message decoder 745, a decoding manager 750, a communications manager 755, or any combination thereof. The communications manager 720 may be an example of aspects of a communications manager 620 as described herein. In some examples, the communications manager 720, or various components thereof, may be configured to perform various operations (e.g., receiving, obtaining, monitoring, outputting, transmitting) using or otherwise in cooperation with the receiver 710, the transmitter 715, or both. For example, the communications manager 720 may receive information from the receiver 710, send information to the transmitter 715, or be integrated in combination with the receiver 710, the transmitter 715, or both to obtain information, output information, or perform various other operations as described herein.

The communications manager 720 may support wireless communications at a device in accordance with examples as disclosed herein. The rate splitting component 725 may be configured as or otherwise support a means for performing rate splitting on a first message for a first UE and a second message for a second UE, the first message including a first private portion and a first common portion, and the second message including a second private portion and a second common portion, the rate splitting including combining the first common portion and the second common portion into a third common portion. The CRC precoder 730 may be configured as or otherwise support a means for generating CRC parity bits associated with at least one of the first private portion and the third common portion. The message manager 735 may be configured as or otherwise support a means for transmitting, based on the generating, the first private portion and the third common portion to the first UE, and the second private portion and the third common portion to the second UE.

Additionally, or alternatively, the communications manager 720 may support wireless communications at a UE in accordance with examples as disclosed herein. The rate splitting message manager 740 may be configured as or otherwise support a means for receiving, from a device, a message including a private portion, a common portion, and CRC parity bits. The message decoder 745 may be configured as or otherwise support a means for decoding the private portion and the common portion based on receiving the message. The decoding manager 750 may be configured as or otherwise support a means for determining a decoding status based on the CRC parity bits. The communications manager 755 may be configured as or otherwise support a means for communicating with the device based on determining the decoding status.

Figure 8:
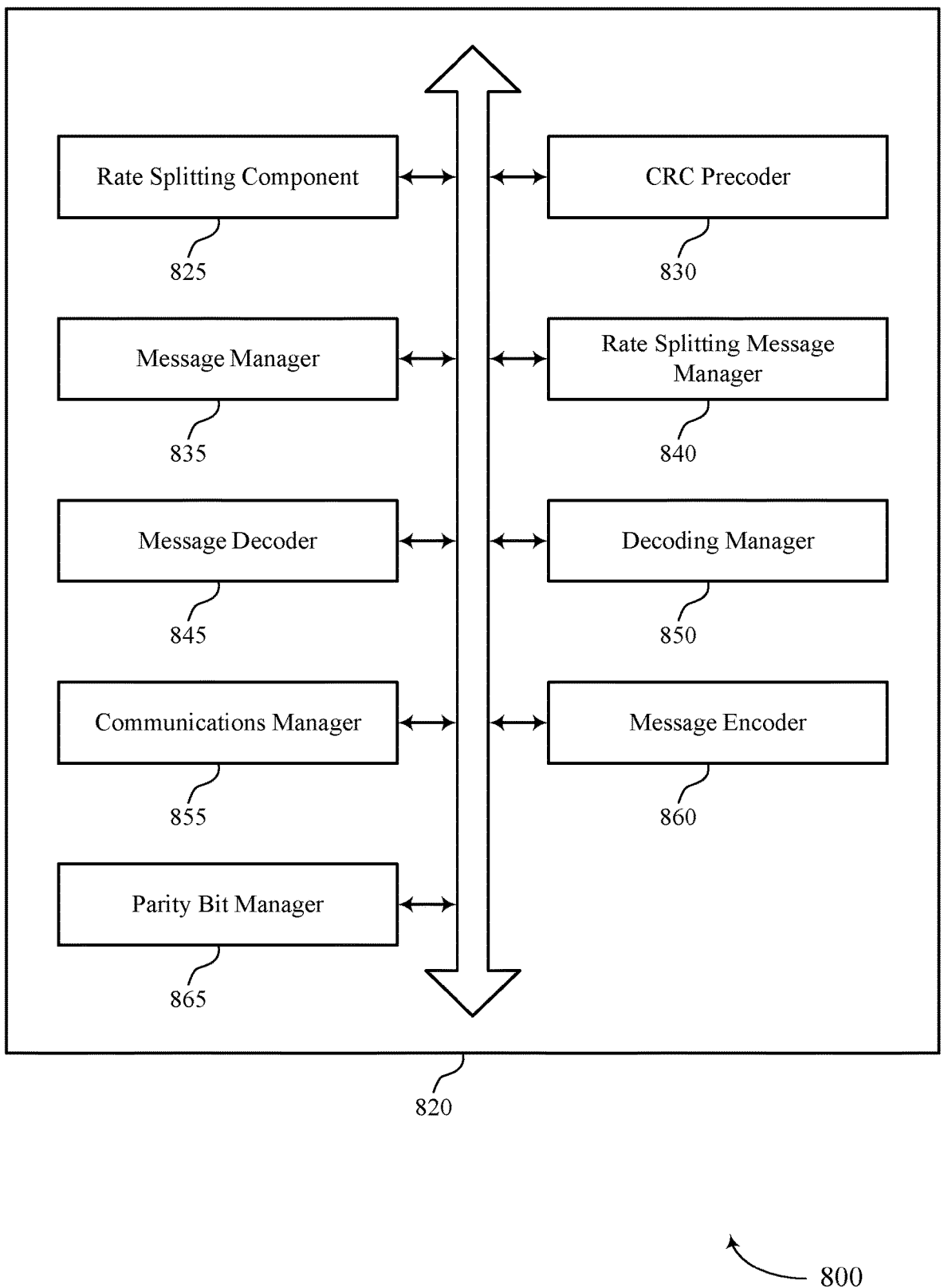
FIG. 8 shows a block diagram of a communications manager that supports CRC design for common and private transport blocks in rate splitting transmissions in accordance with one or more aspects of the present disclosure.

FIG. 8 shows a block diagram 800 of a communications manager 820 that supports CRC design for common and private transport blocks in rate splitting transmissions in accordance with one or more aspects of the present disclosure. The communications manager 820 may be an example of aspects of a communications manager 620, a communications manager 720, or both, as described herein. The communications manager 820, or various components thereof, may be an example of means for performing various aspects of CRC design for common and private transport blocks in rate splitting transmissions as described herein. For example, the communications manager 820 may include a rate splitting component 825, an CRC precoder 830, a message manager 835, a rate splitting message manager 840, a message decoder 845, a decoding manager 850, a communications manager 855, a message encoder 860, a parity bit manager 865, or any combination thereof. Each of these components may communicate, directly or indirectly, with one another (e.g., via one or more buses).

The communications manager 820 may support wireless communications at a device in accordance with examples as disclosed herein. The rate splitting component 825 may be configured as or otherwise support a means for performing rate splitting on a first message for a first UE and a second message for a second UE, the first message including a first private portion and a first common portion, and the second message including a second private portion and a second common portion, the rate splitting including combining the first common portion and the second common portion into a third common portion. The CRC precoder 830 may be configured as or otherwise support a means for generating CRC parity bits associated with at least one of the first private portion and the third common portion. The message manager 835 may be configured as or otherwise support a means for transmitting, based on the generating, the first private portion and the third common portion to the first UE, and the second private portion and the third common portion to the second UE.

In some examples, to support generating, the CRC precoder 830 may be configured as or otherwise support a means for generating a first set of CRC parity bits for at least one code block associated with at least one of the first private portion and the third common portion. In some examples, to support generating, the CRC precoder 830 may be configured as or otherwise support a means for generating a second set of CRC parity bits for at least one transport block associated with at least one of the first private portion and the third common portion.

In some examples, the parity bit manager 865 may be configured as or otherwise support a means for attaching the first set of CRC parity bits to the at least one code block and the second set of CRC parity bits to the at least one transport block, where the transmitting is based on the attaching.

In some examples, the parity bit manager 865 may be configured as or otherwise support a means for attaching the first set of CRC parity bits to at least one first code block associated with the first private portion and to at least one second code block associated with the third common portion. In some examples, the parity bit manager 865 may be configured as or otherwise support a means for attaching the second set of CRC parity bits to at least one first transport block associated with the first private portion and to at least one second transport block associated with the third common portion. In some examples, the parity bit manager 865 may be configured as or otherwise support a means for attaching a third set of CRC parity bits to a block associated with the first private portion and the third common portion, where the transmitting is based on the attaching.

In some examples, the parity bit manager 865 may be configured as or otherwise support a means for attaching the first set of CRC parity bits to at least one first code block associated with the first private portion and to at least one second code block associated with the third common portion. In some examples, the parity bit manager 865 may be configured as or otherwise support a means for attaching the second set of CRC parity bits to the at least one transport block associated with the first private portion or the third common portion, where the transmitting is based on the attaching.

In some examples, the message encoder 860 may be configured as or otherwise support a means for encoding the first private portion, the second private portion, and the third common portion, where the generating is based on the encoding.

In some examples, to support generating, the CRC precoder 830 may be configured as or otherwise support a means for generating a set of CRC parity bits associated with the first private portion and the third common portion.

In some examples, the parity bit manager 865 may be configured as or otherwise support a means for attaching the set of CRC parity bits to a transport block or a code block associated with the third common portion, where the transmitting is based on the attaching.

In some examples, the parity bit manager 865 may be configured as or otherwise support a means for attaching the set of CRC parity bits to a transport block or a code block associated with the first private portion, where the transmitting is based on the attaching.

In some examples, the parity bit manager 865 may be configured as or otherwise support a means for attaching a first subset of the set of CRC parity bits to a transport block or a code block associated with the first private portion. In some examples, the parity bit manager 865 may be configured as or otherwise support a means for attaching a second subset of the set of CRC parity bits to a transport block or a code block associated with the third common portion, where the set of CRC parity bits includes the first subset and the second subset, and where the transmitting is based on the attaching.

In some examples, to support generating, the CRC precoder 830 may be configured as or otherwise support a means for generating a first set of CRC parity bits for a first transport block associated with the first private portion based on the first private portion and the third common portion. In some examples, to support generating, the CRC precoder 830 may be configured as or otherwise support a means for generating a second set of CRC parity bits for a second transport block associated with the second private portion based on the second private portion and the third common portion.

In some examples, the parity bit manager 865 may be configured as or otherwise support a means for attaching the first set of CRC parity bits to the first transport block associated with the first private portion. In some examples, the parity bit manager 865 may be configured as or otherwise support a means for attaching the second set of CRC parity bits to the second transport block associated with the second private portion, where the transmitting is based on the attaching.

In some examples, generating the CRC parity bits is based on a first set of one or more polynomials associated with rate splitting transmissions. In some examples, the first set of one or more polynomials is different from a second set of one or more polynomials associated with non-rate splitting transmissions.

Additionally, or alternatively, the communications manager 820 may support wireless communications at a UE in accordance with examples as disclosed herein. The rate splitting message manager 840 may be configured as or otherwise support a means for receiving, from a device, a message including a private portion, a common portion, and CRC parity bits. The message decoder 845 may be configured as or otherwise support a means for decoding the private portion and the common portion based on receiving the message. The decoding manager 850 may be configured as or otherwise support a means for determining a decoding status based on the CRC parity bits. The communications manager 855 may be configured as or otherwise support a means for communicating with the device based on determining the decoding status.

In some examples, a first subset of the CRC parity bits is associated with at least one code block and a second subset of the CRC parity bits for at least one transport block, the at least one code block and the at least one transport block each associated with at least one of the private portion and the common portion.

In some examples, to support receiving the message, the rate splitting message manager 840 may be configured as or otherwise support a means for receiving at least one code block, the at least one code block including at least the first subset of the CRC parity bits. In some examples, to support receiving the message, the rate splitting message manager 840 may be configured as or otherwise support a means for receiving at least one transport block, the at least one transport block including at least the second subset of CRC parity bits, the at least one code block and the at least one transport block each associated with at least one of the private portion and the common portion.

In some examples, to support receiving the message, the rate splitting message manager 840 may be configured as or otherwise support a means for receiving at least one first code block associated with the common portion and at least one second code block associated with the private portion, the at least one first code block and the at least one second code block including at least the first subset of the CRC parity bits. In some examples, to support receiving the message, the rate splitting message manager 840 may be configured as or otherwise support a means for receiving at least one first transport block associated with the common portion and at least one second transport block associated with the private portion, the at least one first transport block and the at least one second transport block including at least the second subset of the CRC parity bits. In some examples, to support receiving the message, the rate splitting message manager 840 may be configured as or otherwise support a means for receiving at least one block associated with the common portion and the private portion, the at least one block including at least a third subset of the CRC parity bits.

In some examples, to support receiving the message, the rate splitting message manager 840 may be configured as or otherwise support a means for receiving at least one first code block associated with the common portion and at least one second code block associated with the private portion, the at least one first code block and the at least one second code block including at least the first subset of the CRC parity bits. In some examples, to support receiving the message, the rate splitting message manager 840 may be configured as or otherwise support a means for receiving at least one first transport block associated with the common portion and the private portion, the at least one transport block including at least the second subset of the CRC parity bits.

In some examples, to support receiving the message, the rate splitting message manager 840 may be configured as or otherwise support a means for receiving at least one code block. In some examples, to support receiving the message, the rate splitting message manager 840 may be configured as or otherwise support a means for receiving at least one transport block, where the CRC parity bits are attached to the at least one transport block.

In some examples, the at least one transport block is associated with the common portion.

In some examples, the at least one transport block is associated with the private portion.

In some examples, the at least one transport block includes at least a first transport block associated with the common portion and a second transport block associated with the private portion. In some examples, a first subset of the CRC parity bits are attached to the first transport block and a second subset of the CRC parity bits are attached to the second transport block.

In some examples, the decoding is based on a first set of one or more polynomials associated with rate splitting transmissions. In some examples, the first set of one or more polynomials is different from a second set of one or more polynomials associated with non-rate splitting transmissions.

Figure 9:
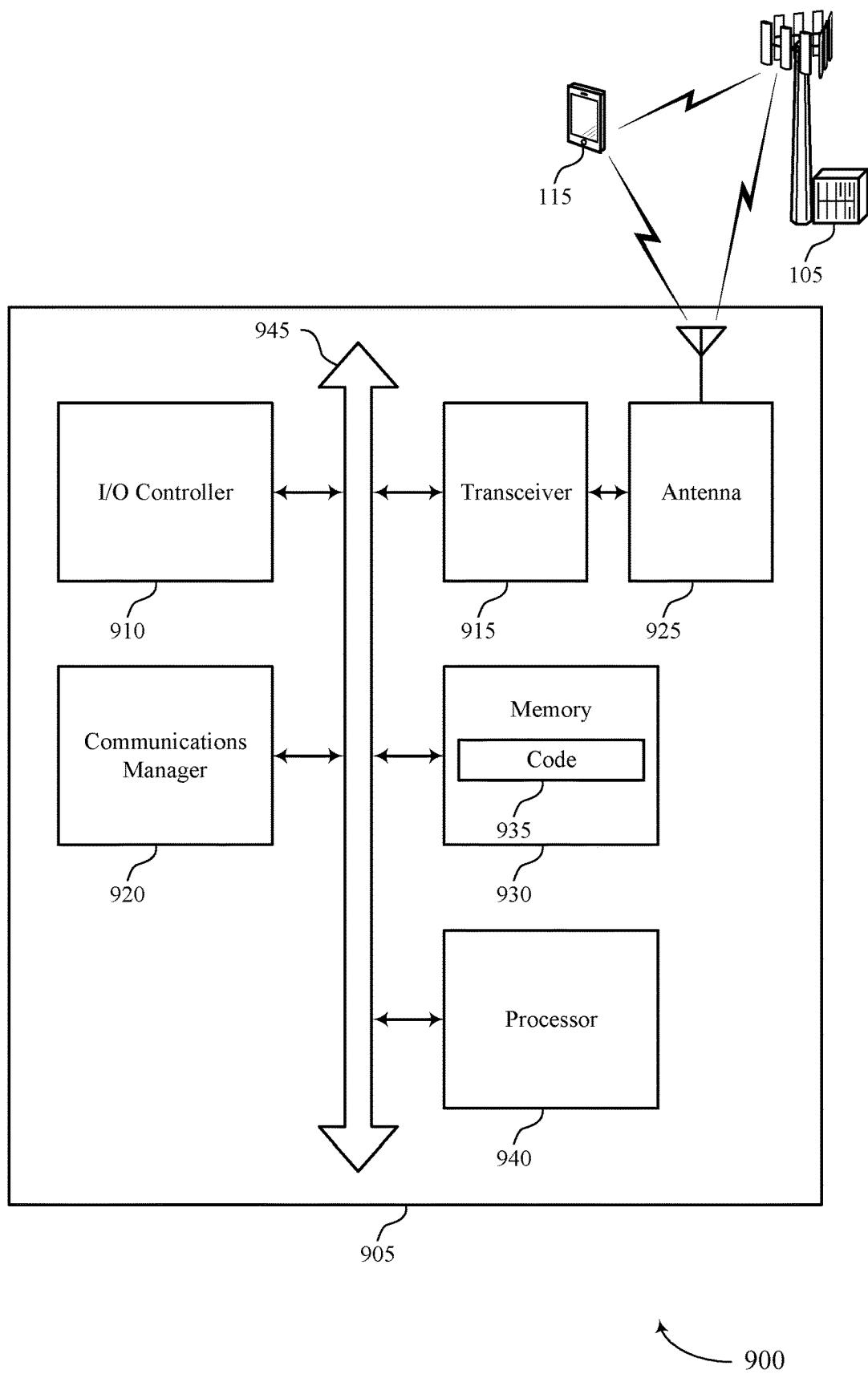
FIG. 9 shows a diagram of a system including a device that supports CRC design for common and private transport blocks in rate splitting transmissions in accordance with one or more aspects of the present disclosure.

FIG. 9 shows a diagram of a system 900 including a device 905 that supports CRC design for common and private transport blocks in rate splitting transmissions in accordance with one or more aspects of the present disclosure. The device 905 may be an example of or include the components of a device 605, a device 705, or a UE 115 as described herein. The device 905 may communicate (e.g., wirelessly) with one or more network entities 105, one or more UEs 115, or any combination thereof. The device 905 may include components for bi-directional voice and data communications including components for transmitting and receiving communications, such as a communications manager 920, an input/output (I/O) controller 910, a transceiver 915, an antenna 925, a memory 930, code 935, and a processor 940. These components may be in electronic communication or otherwise coupled (e.g., operatively, communicatively, functionally, electronically, electrically) via one or more buses (e.g., a bus 945).

The I/O controller 910 may manage input and output signals for the device 905. The I/O controller 910 may also manage peripherals not integrated into the device 905. In some cases, the I/O controller 910 may represent a physical connection or port to an external peripheral. In some cases, the I/O controller 910 may utilize an operating system such as iOS®, ANDROID®, MS-DOS®, MS-WINDOWS®, OS/2®, UNIX®, LINUX®, or another known operating system. Additionally, or alternatively, the I/O controller 910 may represent or interact with a modem, a keyboard, a mouse, a touchscreen, or a similar device. In some cases, the I/O controller 910 may be implemented as part of a processor, such as the processor 940. In some cases, a user may interact with the device 905 via the I/O controller 910 or via hardware components controlled by the I/O controller 910.

In some cases, the device 905 may include a single antenna 925. However, in some other cases, the device 905 may have more than one antenna 925, which may be capable of concurrently transmitting or receiving multiple wireless transmissions. The transceiver 915 may communicate bi-directionally, via the one or more antennas 925, wired, or wireless links as described herein. For example, the transceiver 915 may represent a wireless transceiver and may communicate bi-directionally with another wireless transceiver. The transceiver 915 may also include a modem to modulate the packets, to provide the modulated packets to one or more antennas 925 for transmission, and to demodulate packets received from the one or more antennas 925. The transceiver 915, or the transceiver 915 and one or more antennas 925, may be an example of a transmitter 615, a transmitter 715, a receiver 610, a receiver 710, or any combination thereof or component thereof, as described herein.

The memory 930 may include random access memory (RAM) and read-only memory (ROM). The memory 930 may store computer-readable, computer-executable code 935 including instructions that, when executed by the processor 940, cause the device 905 to perform various functions described herein. The code 935 may be stored in a non-transitory computer-readable medium such as system memory or another type of memory. In some cases, the code 935 may not be directly executable by the processor 940 but may cause a computer (e.g., when compiled and executed) to perform functions described herein. In some cases, the memory 930 may contain, among other things, a basic I/O system (BIOS) which may control basic hardware or software operation such as the interaction with peripheral components or devices.

The processor 940 may include an intelligent hardware device (e.g., a general-purpose processor, a DSP, a CPU, a microcontroller, an ASIC, an FPGA, a programmable logic device, a discrete gate or transistor logic component, a discrete hardware component, or any combination thereof). In some cases, the processor 940 may be configured to operate a memory array using a memory controller. In some other cases, a memory controller may be integrated into the processor 940. The processor 940 may be configured to execute computer-readable instructions stored in a memory (e.g., the memory 930) to cause the device 905 to perform various functions (e.g., functions or tasks supporting CRC design for common and private transport blocks in rate splitting transmissions). For example, the device 905 or a component of the device 905 may include a processor 940 and memory 930 coupled with or to the processor 940, the processor 940 and memory 930 configured to perform various functions described herein.

The communications manager 920 may support wireless communications at a device in accordance with examples as disclosed herein. For example, the communications manager 920 may be configured as or otherwise support a means for performing rate splitting on a first message for a first UE and a second message for a second UE, the first message including a first private portion and a first common portion, and the second message including a second private portion and a second common portion, the rate splitting including combining the first common portion and the second common portion into a third common portion. The communications manager 920 may be configured as or otherwise support a means for generating CRC parity bits associated with at least one of the first private portion and the third common portion. The communications manager 920 may be configured as or otherwise support a means for transmitting, based on the generating, the first private portion and the third common portion to the first UE, and the second private portion and the third common portion to the second UE.

Additionally, or alternatively, the communications manager 920 may support wireless communications at a UE in accordance with examples as disclosed herein. For example, the communications manager 920 may be configured as or otherwise support a means for receiving, from a device, a message including a private portion, a common portion, and CRC parity bits. The communications manager 920 may be configured as or otherwise support a means for decoding the private portion and the common portion based on receiving the message. The communications manager 920 may be configured as or otherwise support a means for determining a decoding status based on the CRC parity bits. The communications manager 920 may be configured as or otherwise support a means for communicating with the device based on determining the decoding status.

By including or configuring the communications manager 920 in accordance with examples as described herein, the device 905 may support techniques for CRC design for common and private transport blocks in rate splitting transmissions that may reduce processing at the device 905, enhance error detectability, and reduce transmission overhead related to generating and transmitting CRC parity bits.

In some examples, the communications manager 920 may be configured to perform various operations (e.g., receiving, monitoring, transmitting) using or otherwise in cooperation with the transceiver 915, the one or more antennas 925, or any combination thereof. Although the communications manager 920 is illustrated as a separate component, in some examples, one or more functions described with reference to the communications manager 920 may be supported by or performed by the processor 940, the memory 930, the code 935, or any combination thereof. For example, the code 935 may include instructions executable by the processor 940 to cause the device 905 to perform various aspects of CRC design for common and private transport blocks in rate splitting transmissions as described herein, or the processor 940 and the memory 930 may be otherwise configured to perform or support such operations.

Figure 10:
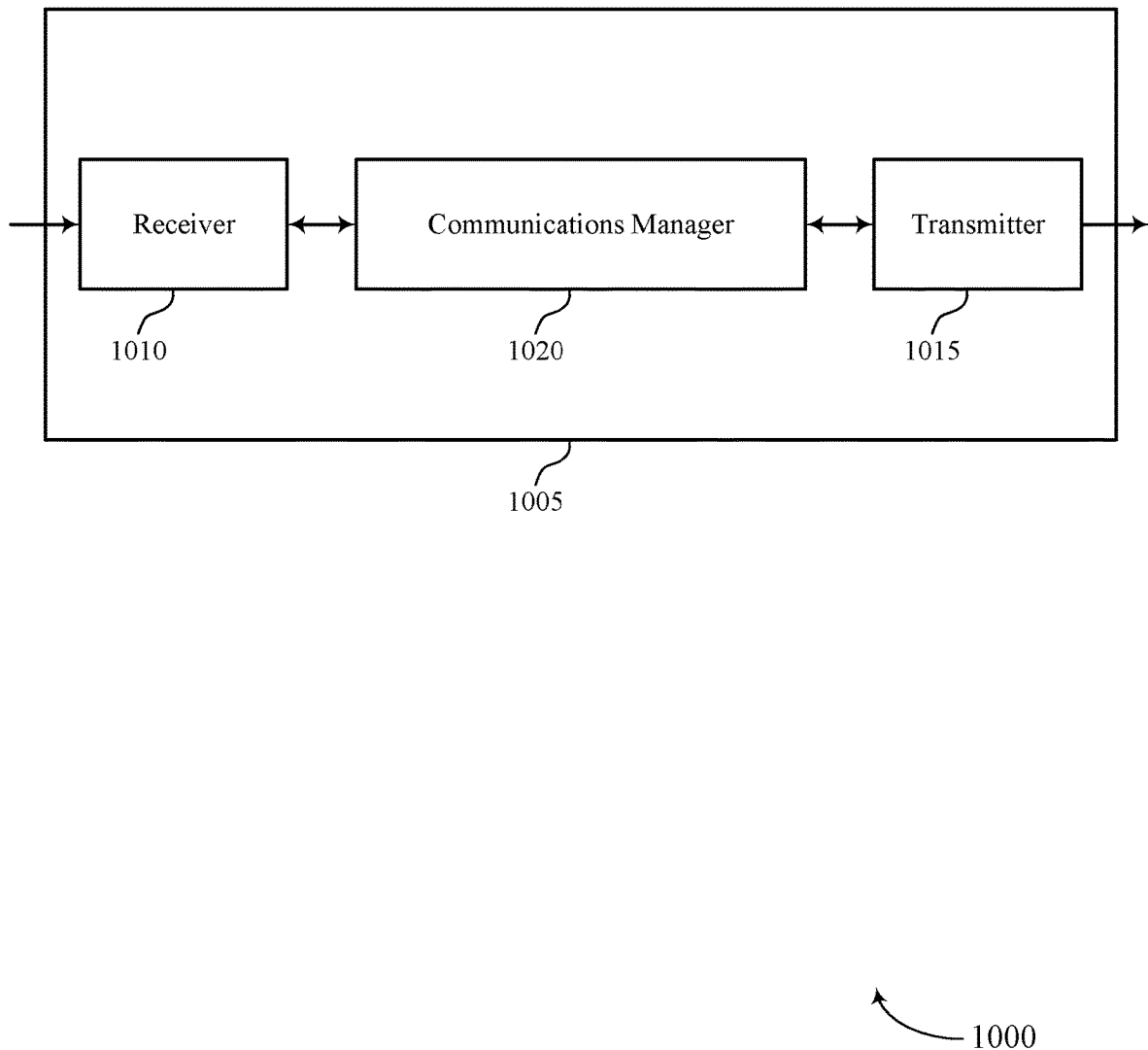
FIGS. 10 and 11 show block diagrams of devices that support CRC design for common and private transport blocks in rate splitting transmissions in accordance with one or more aspects of the present disclosure.

FIG. 10 shows a block diagram 1000 of a device 1005 that supports CRC design for common and private transport blocks in rate splitting transmissions in accordance with one or more aspects of the present disclosure. The device 1005 may be an example of aspects of a network entity 105 as described herein. The device 1005 may include a receiver 1010, a transmitter 1015, and a communications manager 1020. The device 1005 may also include a processor. Each of these components may be in communication with one another (e.g., via one or more buses).

The receiver 1010 may provide a means for obtaining (e.g., receiving, determining, identifying) information such as user data, control information, or any combination thereof (e.g., I/Q samples, symbols, packets, protocol data units, service data units) associated with various channels (e.g., control channels, data channels, information channels, channels associated with a protocol stack). Information may be passed on to other components of the device 1005. In some examples, the receiver 1010 may support obtaining information by receiving signals via one or more antennas. Additionally, or alternatively, the receiver 1010 may support obtaining information by receiving signals via one or more wired (e.g., electrical, fiber optic) interfaces, wireless interfaces, or any combination thereof.

The transmitter 1015 may provide a means for outputting (e.g., transmitting, providing, conveying, sending) information generated by other components of the device 1005. For example, the transmitter 1015 may output information such as user data, control information, or any combination thereof (e.g., I/Q samples, symbols, packets, protocol data units, service data units) associated with various channels (e.g., control channels, data channels, information channels, channels associated with a protocol stack). In some examples, the transmitter 1015 may support outputting information by transmitting signals via one or more antennas. Additionally, or alternatively, the transmitter 1015 may support outputting information by transmitting signals via one or more wired (e.g., electrical, fiber optic) interfaces, wireless interfaces, or any combination thereof. In some examples, the transmitter 1015 and the receiver 1010 may be co-located in a transceiver, which may include or be coupled with a modem.

The communications manager 1020, the receiver 1010, the transmitter 1015, or various combinations thereof or various components thereof may be examples of means for performing various aspects of CRC design for common and private transport blocks in rate splitting transmissions as described herein. For example, the communications manager 1020, the receiver 1010, the transmitter 1015, or various combinations or components thereof may support a method for performing one or more of the functions described herein.

In some examples, the communications manager 1020, the receiver 1010, the transmitter 1015, or various combinations or components thereof may be implemented in hardware (e.g., in communications management circuitry). The hardware may include a processor, a DSP, a CPU, an ASIC, an FPGA or other programmable logic device, a microcontroller, discrete gate or transistor logic, discrete hardware components, or any combination thereof configured as or otherwise supporting a means for performing the functions described in the present disclosure. In some examples, a processor and memory coupled with the processor may be configured to perform one or more of the functions described herein (e.g., by executing, by the processor, instructions stored in the memory).

Additionally, or alternatively, in some examples, the communications manager 1020, the receiver 1010, the transmitter 1015, or various combinations or components thereof may be implemented in code (e.g., as communications management software or firmware) executed by a processor. If implemented in code executed by a processor, the functions of the communications manager 1020, the receiver 1010, the transmitter 1015, or various combinations or components thereof may be performed by a general-purpose processor, a DSP, a CPU, an ASIC, an FPGA, a microcontroller, or any combination of these or other programmable logic devices (e.g., configured as or otherwise supporting a means for performing the functions described in the present disclosure).

In some examples, the communications manager 1020 may be configured to perform various operations (e.g., receiving, obtaining, monitoring, outputting, transmitting) using or otherwise in cooperation with the receiver 1010, the transmitter 1015, or both. For example, the communications manager 1020 may receive information from the receiver 1010, send information to the transmitter 1015, or be integrated in combination with the receiver 1010, the transmitter 1015, or both to obtain information, output information, or perform various other operations as described herein.

The communications manager 1020 may support wireless communications at a device in accordance with examples as disclosed herein. For example, the communications manager 1020 may be configured as or otherwise support a means for performing rate splitting on a first message for a first UE and a second message for a second UE, the first message including a first private portion and a first common portion, and the second message including a second private portion and a second common portion, the rate splitting including combining the first common portion and the second common portion into a third common portion. The communications manager 1020 may be configured as or otherwise support a means for generating CRC parity bits associated with at least one of the first private portion and the third common portion. The communications manager 1020 may be configured as or otherwise support a means for transmitting, based on the generating, the first private portion and the third common portion to the first UE, and the second private portion and the third common portion to the second UE.

By including or configuring the communications manager 1020 in accordance with examples as described herein, the device 1005 (e.g., a processor controlling or otherwise coupled with the receiver 1010, the transmitter 1015, the communications manager 1020, or any combination thereof) may support techniques for CRC design for common and private transport blocks in rate splitting transmissions that reduce processing time and transmission overhead related to generating and transmitting CRC parity bits.

Figure 11:
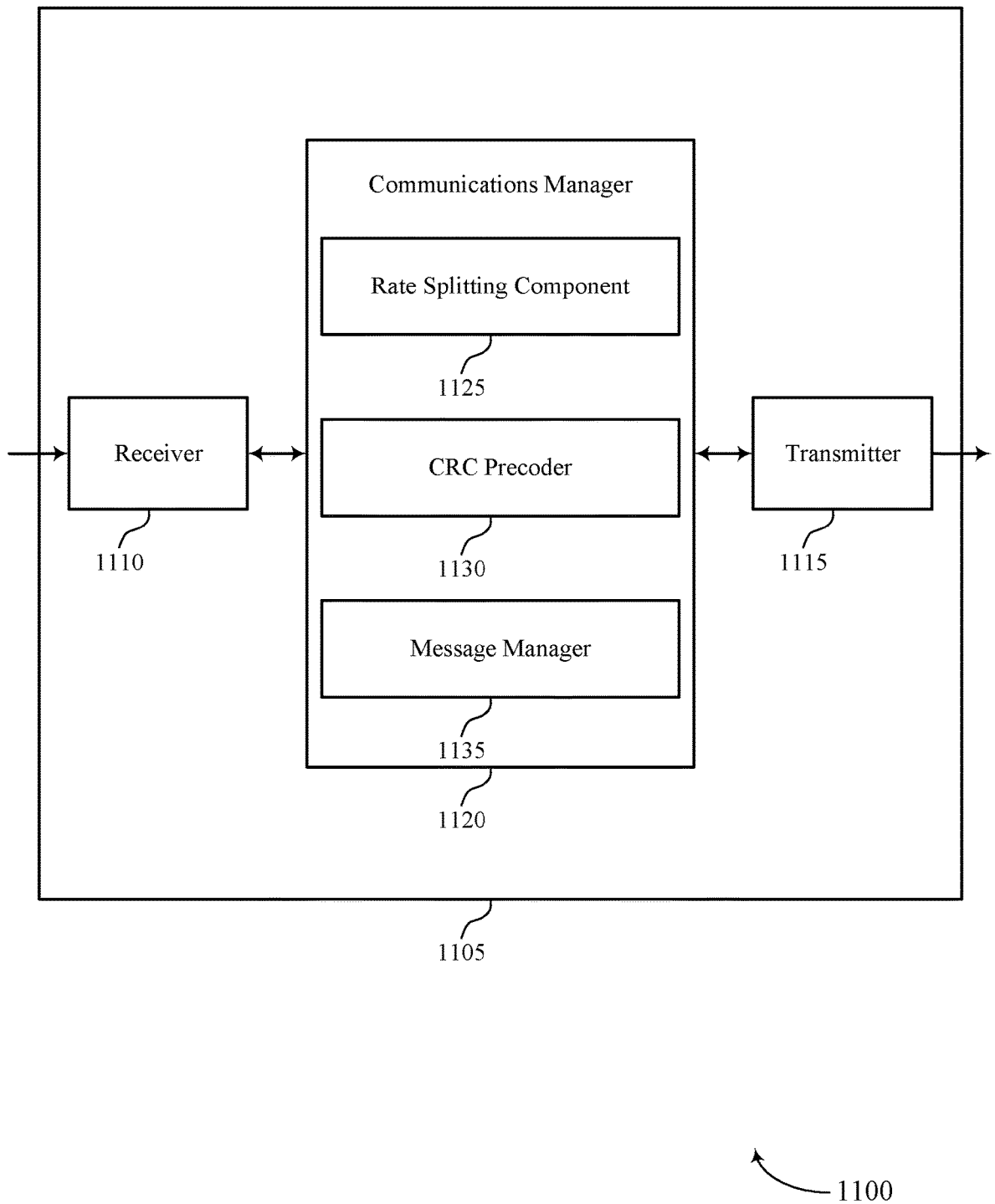

FIG. 11 shows a block diagram 1100 of a device 1105 that supports CRC design for common and private transport blocks in rate splitting transmissions in accordance with one or more aspects of the present disclosure. The device 1105 may be an example of aspects of a device 1005 or a network entity 105 as described herein. The device 1105 may include a receiver 1110, a transmitter 1115, and a communications manager 1120. The device 1105 may also include a processor. Each of these components may be in communication with one another (e.g., via one or more buses).

The receiver 1110 may provide a means for obtaining (e.g., receiving, determining, identifying) information such as user data, control information, or any combination thereof (e.g., I/Q samples, symbols, packets, protocol data units, service data units) associated with various channels (e.g., control channels, data channels, information channels, channels associated with a protocol stack). Information may be passed on to other components of the device 1105. In some examples, the receiver 1110 may support obtaining information by receiving signals via one or more antennas. Additionally, or alternatively, the receiver 1110 may support obtaining information by receiving signals via one or more wired (e.g., electrical, fiber optic) interfaces, wireless interfaces, or any combination thereof.

The transmitter 1115 may provide a means for outputting (e.g., transmitting, providing, conveying, sending) information generated by other components of the device 1105. For example, the transmitter 1115 may output information such as user data, control information, or any combination thereof (e.g., I/Q samples, symbols, packets, protocol data units, service data units) associated with various channels (e.g., control channels, data channels, information channels, channels associated with a protocol stack). In some examples, the transmitter 1115 may support outputting information by transmitting signals via one or more antennas. Additionally, or alternatively, the transmitter 1115 may support outputting information by transmitting signals via one or more wired (e.g., electrical, fiber optic) interfaces, wireless interfaces, or any combination thereof. In some examples, the transmitter 1115 and the receiver 1110 may be co-located in a transceiver, which may include or be coupled with a modem.

The device 1105, or various components thereof, may be an example of means for performing various aspects of CRC design for common and private transport blocks in rate splitting transmissions as described herein. For example, the communications manager 1120 may include a rate splitting component 1125, an CRC precoder 1130, a message manager 1135, or any combination thereof. The communications manager 1120 may be an example of aspects of a communications manager 1020 as described herein. In some examples, the communications manager 1120, or various components thereof, may be configured to perform various operations (e.g., receiving, obtaining, monitoring, outputting, transmitting) using or otherwise in cooperation with the receiver 1110, the transmitter 1115, or both. For example, the communications manager 1120 may receive information from the receiver 1110, send information to the transmitter 1115, or be integrated in combination with the receiver 1110, the transmitter 1115, or both to obtain information, output information, or perform various other operations as described herein.

The communications manager 1120 may support wireless communications at a device in accordance with examples as disclosed herein. The rate splitting component 1125 may be configured as or otherwise support a means for performing rate splitting on a first message for a first UE and a second message for a second UE, the first message including a first private portion and a first common portion, and the second message including a second private portion and a second common portion, the rate splitting including combining the first common portion and the second common portion into a third common portion. The CRC precoder 1130 may be configured as or otherwise support a means for generating CRC parity bits associated with at least one of the first private portion and the third common portion. The message manager 1135 may be configured as or otherwise support a means for transmitting, based on the generating, the first private portion and the third common portion to the first UE, and the second private portion and the third common portion to the second UE.

Figure 12:
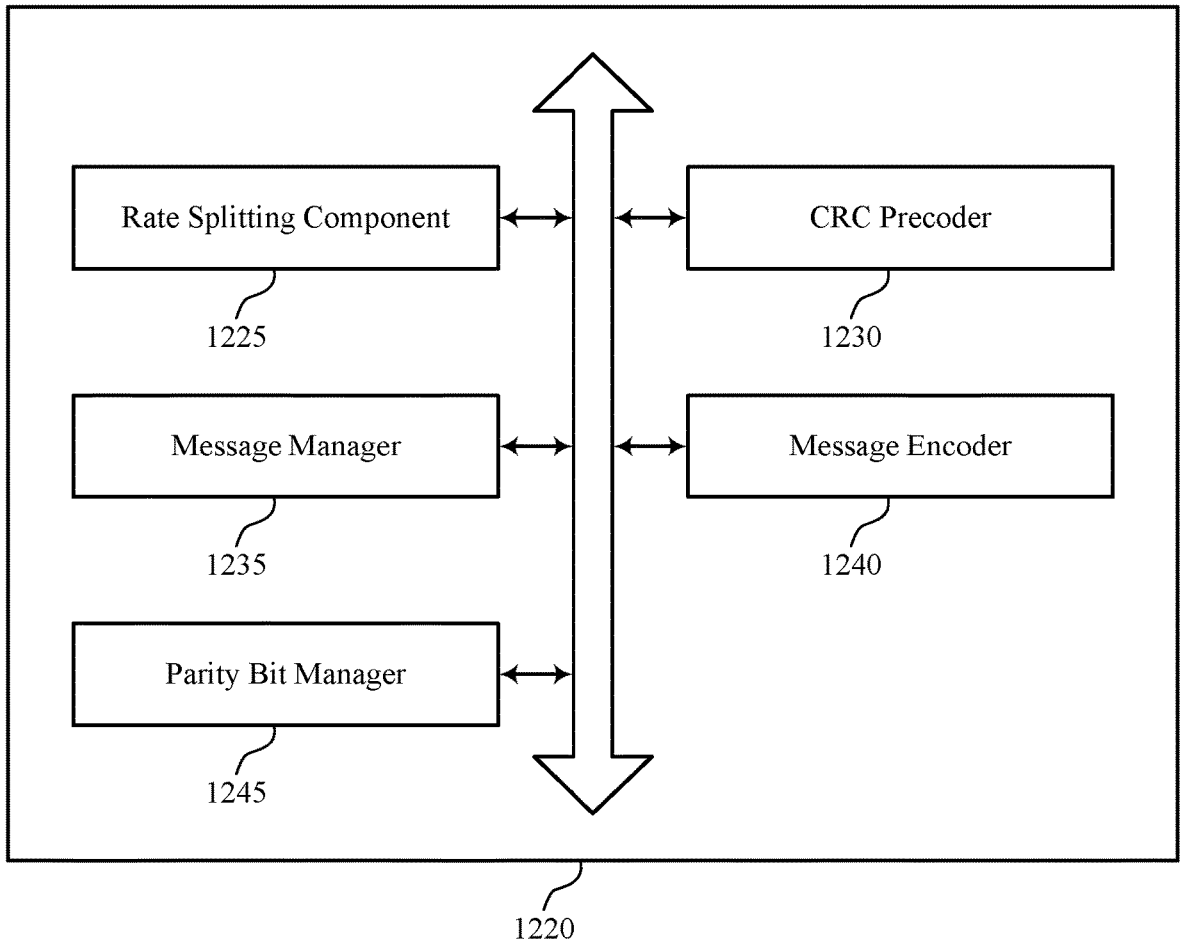
FIG. 12 shows a block diagram of a communications manager that supports CRC design for common and private transport blocks in rate splitting transmissions in accordance with one or more aspects of the present disclosure.

FIG. 12 shows a block diagram 1200 of a communications manager 1220 that supports CRC design for common and private transport blocks in rate splitting transmissions in accordance with one or more aspects of the present disclosure. The communications manager 1220 may be an example of aspects of a communications manager 1020, a communications manager 1120, or both, as described herein. The communications manager 1220, or various components thereof, may be an example of means for performing various aspects of CRC design for common and private transport blocks in rate splitting transmissions as described herein. For example, the communications manager 1220 may include a rate splitting component 1225, an CRC precoder 1230, a message manager 1235, a message encoder 1240, a parity bit manager 1245, or any combination thereof. Each of these components may communicate, directly or indirectly, with one another (e.g., via one or more buses) which may include communications within a protocol layer of a protocol stack, communications associated with a logical channel of a protocol stack (e.g., between protocol layers of a protocol stack, within a device, component, or virtualized component associated with a network entity 105, between devices, components, or virtualized components associated with a network entity 105), or any combination thereof.

The communications manager 1220 may support wireless communications at a device in accordance with examples as disclosed herein. The rate splitting component 1225 may be configured as or otherwise support a means for performing rate splitting on a first message for a first UE and a second message for a second UE, the first message including a first private portion and a first common portion, and the second message including a second private portion and a second common portion, the rate splitting including combining the first common portion and the second common portion into a third common portion. The CRC precoder 1230 may be configured as or otherwise support a means for generating CRC parity bits associated with at least one of the first private portion and the third common portion. The message manager 1235 may be configured as or otherwise support a means for transmitting, based on the generating, the first private portion and the third common portion to the first UE, and the second private portion and the third common portion to the second UE.

In some examples, to support generating, the CRC precoder 1230 may be configured as or otherwise support a means for generating a first set of CRC parity bits for at least one code block associated with at least one of the first private portion and the third common portion. In some examples, to support generating, the CRC precoder 1230 may be configured as or otherwise support a means for generating a second set of CRC parity bits for at least one transport block associated with at least one of the first private portion and the third common portion.

In some examples, the parity bit manager 1245 may be configured as or otherwise support a means for attaching the first set of CRC parity bits to the at least one code block and the second set of CRC parity bits to the at least one transport block, where the transmitting is based on the attaching.

In some examples, the parity bit manager 1245 may be configured as or otherwise support a means for attaching the first set of CRC parity bits to at least one first code block associated with the first private portion and to at least one second code block associated with the third common portion. In some examples, the parity bit manager 1245 may be configured as or otherwise support a means for attaching the second set of CRC parity bits to at least one first transport block associated with the first private portion and to at least one second transport block associated with the third common portion. In some examples, the parity bit manager 1245 may be configured as or otherwise support a means for attaching a third set of CRC parity bits to a block associated with the first private portion and the third common portion, where the transmitting is based on the attaching.

In some examples, the parity bit manager 1245 may be configured as or otherwise support a means for attaching the first set of CRC parity bits to at least one first code block associated with the first private portion and to at least one second code block associated with the third common portion. In some examples, the parity bit manager 1245 may be configured as or otherwise support a means for attaching the second set of CRC parity bits to the at least one transport block associated with the first private portion or the third common portion, where the transmitting is based on the attaching.

In some examples, the message encoder 1240 may be configured as or otherwise support a means for encoding the first private portion, the second private portion, and the third common portion, where the generating is based on the encoding.

In some examples, to support generating, the CRC precoder 1230 may be configured as or otherwise support a means for generating a set of CRC parity bits associated with the first private portion and the third common portion.

In some examples, the parity bit manager 1245 may be configured as or otherwise support a means for attaching the set of CRC parity bits to a transport block or a code block associated with the third common portion, where the transmitting is based on the attaching.

In some examples, the parity bit manager 1245 may be configured as or otherwise support a means for attaching the set of CRC parity bits to a transport block or a code block associated with the first private portion, where the transmitting is based on the attaching.

In some examples, the parity bit manager 1245 may be configured as or otherwise support a means for attaching a first subset of the set of CRC parity bits to a transport block or a code block associated with the first private portion. In some examples, the parity bit manager 1245 may be configured as or otherwise support a means for attaching a second subset of the set of CRC parity bits to a transport block or a code block associated with the third common portion, where the set of CRC parity bits includes the first subset and the second subset, and where the transmitting is based on the attaching.

In some examples, to support generating, the CRC precoder 1230 may be configured as or otherwise support a means for generating a first set of CRC parity bits for a first transport block associated with the first private portion based on the first private portion and the third common portion. In some examples, to support generating, the CRC precoder 1230 may be configured as or otherwise support a means for generating a second set of CRC parity bits for a second transport block associated with the second private portion based on the second private portion and the third common portion.

In some examples, the parity bit manager 1245 may be configured as or otherwise support a means for attaching the first set of CRC parity bits to the first transport block associated with the first private portion. In some examples, the parity bit manager 1245 may be configured as or otherwise support a means for attaching the second set of CRC parity bits to the second transport block associated with the second private portion, where the transmitting is based on the attaching.

In some examples, generating the CRC parity bits is based on a first set of one or more polynomials associated with rate splitting transmissions. In some examples, the first set of one or more polynomials is different from a second set of one or more polynomials associated with non-rate splitting transmissions.

Figure 13:
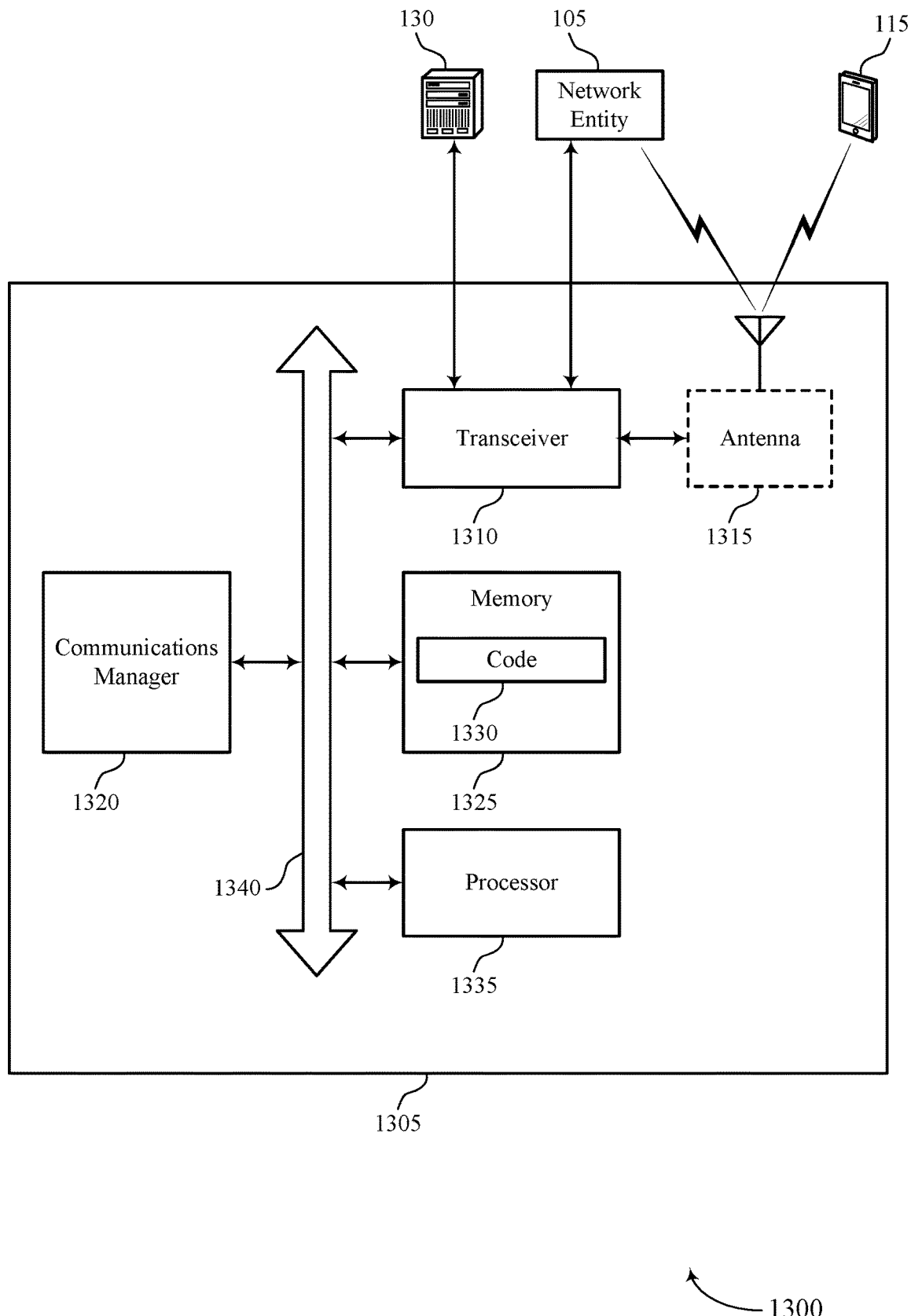
FIG. 13 shows a diagram of a system including a device that supports CRC design for common and private transport blocks in rate splitting transmissions in accordance with one or more aspects of the present disclosure.

FIG. 13 shows a diagram of a system 1300 including a device 1305 that supports CRC design for common and private transport blocks in rate splitting transmissions in accordance with one or more aspects of the present disclosure. The device 1305 may be an example of or include the components of a device 1005, a device 1105, or a network entity 105 as described herein. The device 1305 may communicate with one or more network entities 105, one or more UEs 115, or any combination thereof, which may include communications over one or more wired interfaces, over one or more wireless interfaces, or any combination thereof. The device 1305 may include components that support outputting and obtaining communications, such as a communications manager 1320, a transceiver 1310, an antenna 1315, a memory 1325, code 1330, and a processor 1335. These components may be in electronic communication or otherwise coupled (e.g., operatively, communicatively, functionally, electronically, electrically) via one or more buses (e.g., a bus 1340).

The transceiver 1310 may support bi-directional communications via wired links, wireless links, or both as described herein. In some examples, the transceiver 1310 may include a wired transceiver and may communicate bi-directionally with another wired transceiver. Additionally, or alternatively, in some examples, the transceiver 1310 may include a wireless transceiver and may communicate bi-directionally with another wireless transceiver. In some examples, the device 1305 may include one or more antennas 1315, which may be capable of transmitting or receiving wireless transmissions (e.g., concurrently). The transceiver 1310 may also include a modem to modulate signals, to provide the modulated signals for transmission (e.g., by one or more antennas 1315, by a wired transmitter), to receive modulated signals (e.g., from one or more antennas 1315, from a wired receiver), and to demodulate signals. In some implementations, the transceiver 1310 may include one or more interfaces, such as one or more interfaces coupled with the one or more antennas 1315 that are configured to support various receiving or obtaining operations, or one or more interfaces coupled with the one or more antennas 1315 that are configured to support various transmitting or outputting operations, or any combination thereof. In some implementations, the transceiver 1310 may include or be configured for coupling with one or more processors or memory components that are operable to perform or support operations based on received or obtained information or signals, or to generate information or other signals for transmission or other outputting, or any combination thereof. In some implementations, the transceiver 1310, or the transceiver 1310 and the one or more antennas 1315, or the transceiver 1310 and the one or more antennas 1315 and one or more processors or memory components (for example, the processor 1335, or the memory 1325, or both), may be included in a chip or chip assembly that is installed in the device 1305. In some examples, the transceiver may be operable to support communications via one or more communications links (e.g., a communication link 125, a backhaul communication link 120, a midhaul communication link 162, a fronthaul communication link 168).

The memory 1325 may include RAM and ROM. The memory 1325 may store computer-readable, computer-executable code 1330 including instructions that, when executed by the processor 1335, cause the device 1305 to perform various functions described herein. The code 1330 may be stored in a non-transitory computer-readable medium such as system memory or another type of memory. In some cases, the code 1330 may not be directly executable by the processor 1335 but may cause a computer (e.g., when compiled and executed) to perform functions described herein. In some cases, the memory 1325 may contain, among other things, a BIOS which may control basic hardware or software operation such as the interaction with peripheral components or devices.

The processor 1335 may include an intelligent hardware device (e.g., a general-purpose processor, a DSP, an ASIC, a CPU, an FPGA, a microcontroller, a programmable logic device, discrete gate or transistor logic, a discrete hardware component, or any combination thereof). In some cases, the processor 1335 may be configured to operate a memory array using a memory controller. In some other cases, a memory controller may be integrated into the processor 1335. The processor 1335 may be configured to execute computer-readable instructions stored in a memory (e.g., the memory 1325) to cause the device 1305 to perform various functions (e.g., functions or tasks supporting CRC design for common and private transport blocks in rate splitting transmissions). For example, the device 1305 or a component of the device 1305 may include a processor 1335 and memory 1325 coupled with the processor 1335, the processor 1335 and memory 1325 configured to perform various functions described herein. The processor 1335 may be an example of a cloud-computing platform (e.g., one or more physical nodes and supporting software such as operating systems, virtual machines, or container instances) that may host the functions (e.g., by executing code 1330) to perform the functions of the device 1305. The processor 1335 may be any one or more suitable processors capable of executing scripts or instructions of one or more software programs stored in the device 1305 (such as within the memory 1325). In some implementations, the processor 1335 may be a component of a processing system. A processing system may generally refer to a system or series of machines or components that receives inputs and processes the inputs to produce a set of outputs (which may be passed to other systems or components of, for example, the device 1305). For example, a processing system of the device 1305 may refer to a system including the various other components or subcomponents of the device 1305, such as the processor 1335, or the transceiver 1310, or the communications manager 1320, or other components or combinations of components of the device 1305. The processing system of the device 1305 may interface with other components of the device 1305, and may process information received from other components (such as inputs or signals) or output information to other components. For example, a chip or modem of the device 1305 may include a processing system and one or more interfaces to output information, or to obtain information, or both. The one or more interfaces may be implemented as or otherwise include a first interface configured to output information and a second interface configured to obtain information, or a same interface configured to output information and to obtain information, among other implementations. In some implementations, the one or more interfaces may refer to an interface between the processing system of the chip or modem and a transmitter, such that the device 1305 may transmit information output from the chip or modem. Additionally, or alternatively, in some implementations, the one or more interfaces may refer to an interface between the processing system of the chip or modem and a receiver, such that the device 1305 may obtain information or signal inputs, and the information may be passed to the processing system. A person having ordinary skill in the art will readily recognize that a first interface also may obtain information or signal inputs, and a second interface also may output information or signal outputs.

In some examples, a bus 1340 may support communications of (e.g., within) a protocol layer of a protocol stack. In some examples, a bus 1340 may support communications associated with a logical channel of a protocol stack (e.g., between protocol layers of a protocol stack), which may include communications performed within a component of the device 1305, or between different components of the device 1305 that may be co-located or located in different locations (e.g., where the device 1305 may refer to a system in which one or more of the communications manager 1320, the transceiver 1310, the memory 1325, the code 1330, and the processor 1335 may be located in one of the different components or divided between different components).

In some examples, the communications manager 1320 may manage aspects of communications with a core network 130 (e.g., via one or more wired or wireless backhaul links). For example, the communications manager 1320 may manage the transfer of data communications for client devices, such as one or more UEs 115. In some examples, the communications manager 1320 may manage communications with other network entities 105, and may include a controller or scheduler for controlling communications with UEs 115 in cooperation with other network entities 105. In some examples, the communications manager 1320 may support an X2 interface within an LTE/LTE-A wireless communications network technology to provide communication between network entities 105.

The communications manager 1320 may support wireless communications at a device in accordance with examples as disclosed herein. For example, the communications manager 1320 may be configured as or otherwise support a means for performing rate splitting on a first message for a first UE and a second message for a second UE, the first message including a first private portion and a first common portion, and the second message including a second private portion and a second common portion, the rate splitting including combining the first common portion and the second common portion into a third common portion. The communications manager 1320 may be configured as or otherwise support a means for generating CRC parity bits associated with at least one of the first private portion and the third common portion. The communications manager 1320 may be configured as or otherwise support a means for transmitting, based on the generating, the first private portion and the third common portion to the first UE, and the second private portion and the third common portion to the second UE.

By including or configuring the communications manager 1320 in accordance with examples as described herein, the device 1305 may support techniques for CRC design for common and private transport blocks in rate splitting transmissions that may reduce processing time, enhance error detectability of transmissions, and reduce transmission overhead related to generating and transmitting CRC parity bits.

In some examples, the communications manager 1320 may be configured to perform various operations (e.g., receiving, obtaining, monitoring, outputting, transmitting) using or otherwise in cooperation with the transceiver 1310, the one or more antennas 1315 (e.g., where applicable), or any combination thereof. Although the communications manager 1320 is illustrated as a separate component, in some examples, one or more functions described with reference to the communications manager 1320 may be supported by or performed by the transceiver 1310, the processor 1335, the memory 1325, the code 1330, or any combination thereof. For example, the code 1330 may include instructions executable by the processor 1335 to cause the device 1305 to perform various aspects of CRC design for common and private transport blocks in rate splitting transmissions as described herein, or the processor 1335 and the memory 1325 may be otherwise configured to perform or support such operations.

Figure 14:
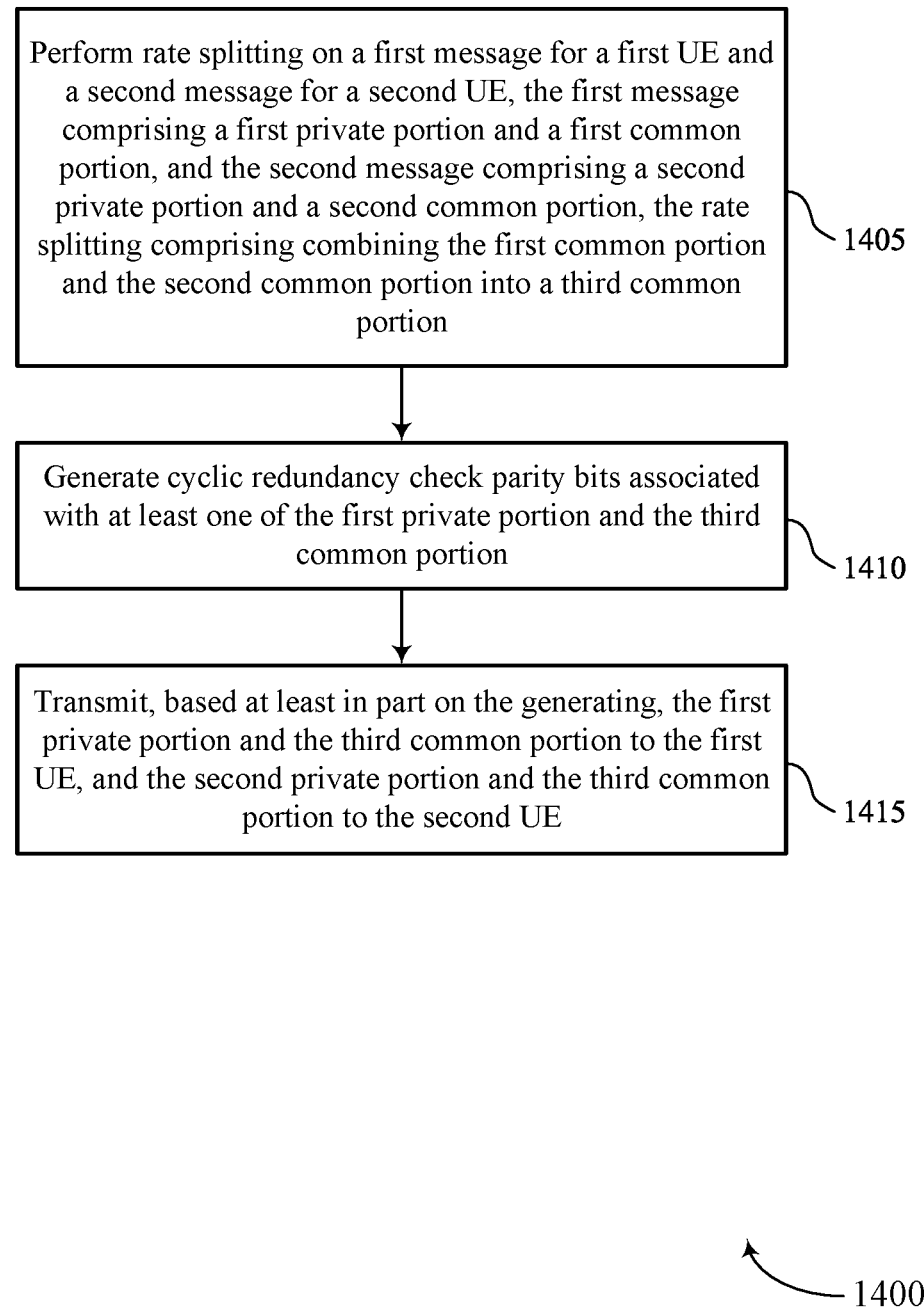
FIGS. 14 through 17 show flowcharts illustrating methods that support CRC design for common and private transport blocks in rate splitting transmissions in accordance with one or more aspects of the present disclosure.

FIG. 14 shows a flowchart illustrating a method 1400 that supports CRC design for common and private transport blocks in rate splitting transmissions in accordance with one or more aspects of the present disclosure. The operations of the method 1400 may be implemented by a UE or a network entity or its components as described herein. For example, the operations of the method 1400 may be performed by a UE 115 as described with reference to FIGS. 1 through 9 or a network entity as described with reference to FIGS. 1 through 5 and 10 through 13. In some examples, a UE or a network entity may execute a set of instructions to control the functional elements of the UE or the network entity to perform the described functions. Additionally, or alternatively, the UE or the network entity may perform aspects of the described functions using special-purpose hardware.

At 1405, the method may include performing rate splitting on a first message for a first UE and a second message for a second UE, the first message including a first private portion and a first common portion, and the second message including a second private portion and a second common portion, the rate splitting including combining the first common portion and the second common portion into a third common portion. The operations of 1405 may be performed in accordance with examples as disclosed herein. In some examples, aspects of the operations of 1405 may be performed by a rate splitting component 825 or a rate splitting component 1225 as described with reference to FIGS. 8 and 12.

At 1410, the method may include generating CRC parity bits associated with at least one of the first private portion and the third common portion. The operations of 1410 may be performed in accordance with examples as disclosed herein. In some examples, aspects of the operations of 1410 may be performed by an CRC precoder 830 or an CRC precoder 1230 as described with reference to FIGS. 8 and 12.

At 1415, the method may include transmitting, based on the generating, the first private portion and the third common portion to the first UE, and the second private portion and the third common portion to the second UE. The operations of 1415 may be performed in accordance with examples as disclosed herein. In some examples, aspects of the operations of 1415 may be performed by a message manager 835 or a message manager 1235 as described with reference to FIGS. 8 and 12.

Figure 15:
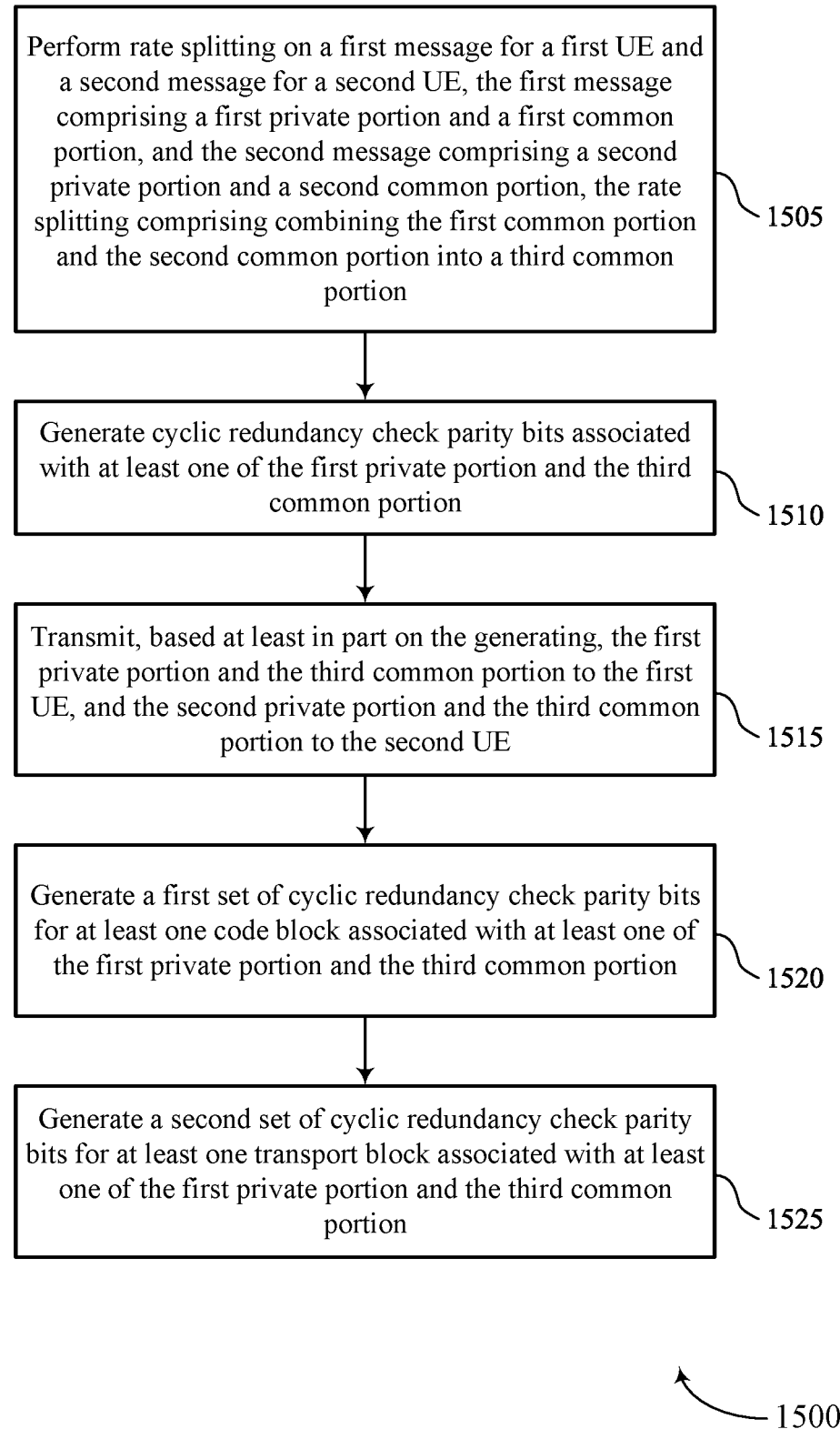

FIG. 15 shows a flowchart illustrating a method 1500 that supports CRC design for common and private transport blocks in rate splitting transmissions in accordance with one or more aspects of the present disclosure. The operations of the method 1500 may be implemented by a UE or a network entity or its components as described herein. For example, the operations of the method 1500 may be performed by a UE 115 as described with reference to FIGS. 1 through 9 or a network entity as described with reference to FIGS. 1 through 5 and 10 through 13. In some examples, a UE or a network entity may execute a set of instructions to control the functional elements of the UE or the network entity to perform the described functions. Additionally, or alternatively, the UE or the network entity may perform aspects of the described functions using special-purpose hardware.

At 1505, the method may include performing rate splitting on a first message for a first UE and a second message for a second UE, the first message including a first private portion and a first common portion, and the second message including a second private portion and a second common portion, the rate splitting including combining the first common portion and the second common portion into a third common portion. The operations of 1505 may be performed in accordance with examples as disclosed herein. In some examples, aspects of the operations of 1505 may be performed by a rate splitting component 825 or a rate splitting component 1225 as described with reference to FIGS. 8 and 12.

At 1510, the method may include generating CRC parity bits associated with at least one of the first private portion and the third common portion. The operations of 1510 may be performed in accordance with examples as disclosed herein. In some examples, aspects of the operations of 1510 may be performed by an CRC precoder 830 or an CRC precoder 1230 as described with reference to FIGS. 8 and 12.

At 1515, the method may include transmitting, based on the generating, the first private portion and the third common portion to the first UE, and the second private portion and the third common portion to the second UE. The operations of 1515 may be performed in accordance with examples as disclosed herein. In some examples, aspects of the operations of 1515 may be performed by a message manager 835 or a message manager 1235 as described with reference to FIGS. 8 and 12.

At 1520, the method may include generating a first set of CRC parity bits for at least one code block associated with at least one of the first private portion and the third common portion. The operations of 1520 may be performed in accordance with examples as disclosed herein. In some examples, aspects of the operations of 1520 may be performed by an CRC precoder 830 or an CRC precoder 1230 as described with reference to FIGS. 8 and 12.

At 1525, the method may include generating a second set of CRC parity bits for at least one transport block associated with at least one of the first private portion and the third common portion. The operations of 1525 may be performed in accordance with examples as disclosed herein. In some examples, aspects of the operations of 1525 may be performed by an CRC precoder 830 or an CRC precoder 1230 as described with reference to FIGS. 8 and 12.

Figure 16:
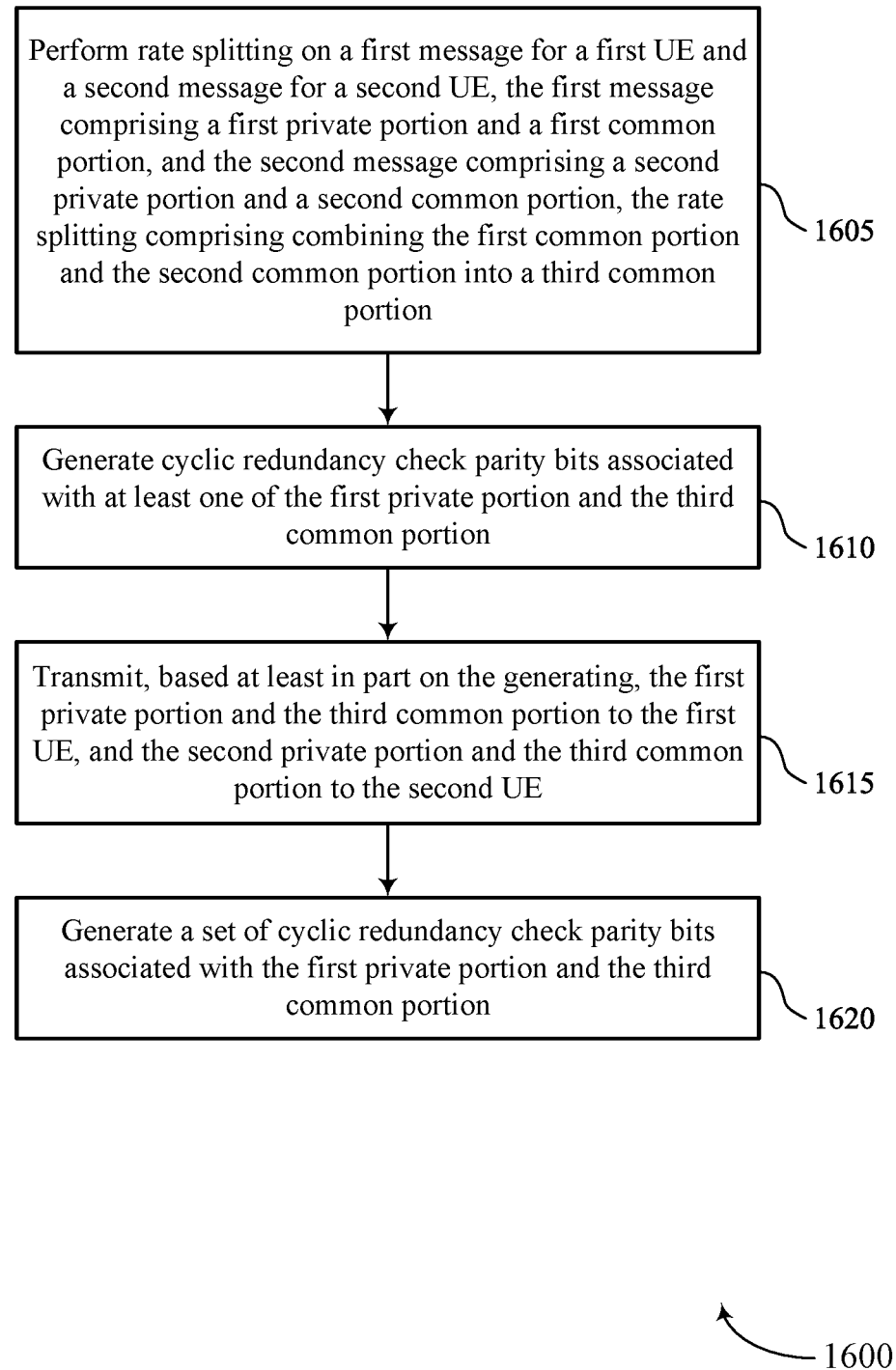

FIG. 16 shows a flowchart illustrating a method 1600 that supports CRC design for common and private transport blocks in rate splitting transmissions in accordance with one or more aspects of the present disclosure. The operations of the method 1600 may be implemented by a UE or a network entity or its components as described herein. For example, the operations of the method 1600 may be performed by a UE 115 as described with reference to FIGS. 1 through 9 or a network entity as described with reference to FIGS. 1 through 5 and 10 through 13. In some examples, a UE or a network entity may execute a set of instructions to control the functional elements of the UE or the network entity to perform the described functions. Additionally, or alternatively, the UE or the network entity may perform aspects of the described functions using special-purpose hardware.

At 1605, the method may include performing rate splitting on a first message for a first UE and a second message for a second UE, the first message including a first private portion and a first common portion, and the second message including a second private portion and a second common portion, the rate splitting including combining the first common portion and the second common portion into a third common portion. The operations of 1605 may be performed in accordance with examples as disclosed herein. In some examples, aspects of the operations of 1605 may be performed by a rate splitting component 825 or a rate splitting component 1225 as described with reference to FIGS. 8 and 12.

At 1610, the method may include generating CRC parity bits associated with at least one of the first private portion and the third common portion. The operations of 1610 may be performed in accordance with examples as disclosed herein. In some examples, aspects of the operations of 1610 may be performed by an CRC precoder 830 or an CRC precoder 1230 as described with reference to FIGS. 8 and 12.

At 1615, the method may include transmitting, based on the generating, the first private portion and the third common portion to the first UE, and the second private portion and the third common portion to the second UE. The operations of 1615 may be performed in accordance with examples as disclosed herein. In some examples, aspects of the operations of 1615 may be performed by a message manager 835 or a message manager 1235 as described with reference to FIGS. 8 and 12.

At 1620, the method may include generating a set of CRC parity bits associated with the first private portion and the third common portion. The operations of 1620 may be performed in accordance with examples as disclosed herein. In some examples, aspects of the operations of 1620 may be performed by an CRC precoder 830 or an CRC precoder 1230 as described with reference to FIGS. 8 and 12.

Figure 17:
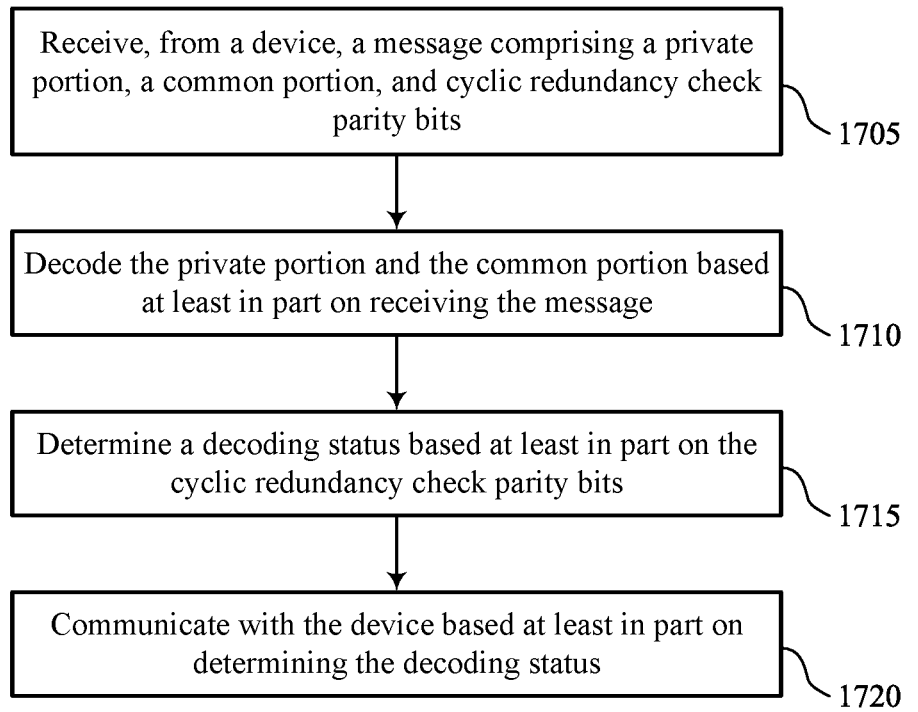

FIG. 17 shows a flowchart illustrating a method 1700 that supports CRC design for common and private transport blocks in rate splitting transmissions in accordance with one or more aspects of the present disclosure. The operations of the method 1700 may be implemented by a UE or its components as described herein. For example, the operations of the method 1700 may be performed by a UE 115 as described with reference to FIGS. 1 through 9. In some examples, a UE may execute a set of instructions to control the functional elements of the UE to perform the described functions. Additionally, or alternatively, the UE may perform aspects of the described functions using special-purpose hardware.

At 1705, the method may include receiving, from a device, a message including a private portion, a common portion, and CRC parity bits. The operations of 1705 may be performed in accordance with examples as disclosed herein. In some examples, aspects of the operations of 1705 may be performed by a rate splitting message manager 840 as described with reference to FIG. 8.

At 1710, the method may include decoding the private portion and the common portion based on receiving the message. The operations of 1710 may be performed in accordance with examples as disclosed herein. In some examples, aspects of the operations of 1710 may be performed by a message decoder 845 as described with reference to FIG. 8.

At 1715, the method may include determining a decoding status based on the CRC parity bits. The operations of 1715 may be performed in accordance with examples as disclosed herein. In some examples, aspects of the operations of 1715 may be performed by a decoding manager 850 as described with reference to FIG. 8.

At 1720, the method may include communicating with the device based on determining the decoding status. The operations of 1720 may be performed in accordance with examples as disclosed herein. In some examples, aspects of the operations of 1720 may be performed by a communications manager 855 as described with reference to FIG. 8.

The following provides an overview of aspects of the present disclosure:

Aspect 1: A method for wireless communications at a device, comprising: performing rate splitting on a first message for a first UE and a second message for a second UE, the first message comprising a first private portion and a first common portion, and the second message comprising a second private portion and a second common portion, the rate splitting comprising combining the first common portion and the second common portion into a third common portion; generating cyclic redundancy check parity bits associated with at least one of the first private portion and the third common portion; and transmitting, based at least in part on the generating, the first private portion and the third common portion to the first UE, and the second private portion and the third common portion to the second UE.

Aspect 2: The method of aspect 1, wherein the generating comprises: generating a first set of cyclic redundancy check parity bits for at least one code block associated with at least one of the first private portion and the third common portion; and generating a second set of cyclic redundancy check parity bits for at least one transport block associated with at least one of the first private portion and the third common portion.

Aspect 3: The method of aspect 2, further comprising: attaching the first set of cyclic redundancy check parity bits to the at least one code block and the second set of cyclic redundancy check parity bits to the at least one transport block, wherein the transmitting is based at least in part on the attaching.

Aspect 4: The method of any of aspects 2 through 3, further comprising: attaching the first set of cyclic redundancy check parity bits to at least one first code block associated with the first private portion and to at least one second code block associated with the third common portion; attaching the second set of cyclic redundancy check parity bits to at least one first transport block associated with the first private portion and to at least one second transport block associated with the third common portion; and attaching a third set of cyclic redundancy check parity bits to a block associated with the first private portion and the third common portion, wherein the transmitting is based at least in part on the attaching.

Aspect 5: The method of any of aspects 2 through 4, further comprising: attaching the first set of cyclic redundancy check parity bits to at least one first code block associated with the first private portion and to at least one second code block associated with the third common portion; and attaching the second set of cyclic redundancy check parity bits to the at least one transport block associated with the first private portion or the third common portion, wherein the transmitting is based at least in part on the attaching.

Aspect 6: The method of any of aspects 1 through 5, further comprising: encoding the first private portion, the second private portion, and the third common portion, wherein the generating is based at least in part on the encoding.

Aspect 7: The method of any of aspects 1 through 6, wherein the generating comprises: generating a set of cyclic redundancy check parity bits associated with the first private portion and the third common portion.

Aspect 8: The method of aspect 7, further comprising: attaching the set of cyclic redundancy check parity bits to a transport block or a code block associated with the third common portion, wherein the transmitting is based at least in part on the attaching.

Aspect 9: The method of any of aspects 7 through 8, further comprising: attaching the set of cyclic redundancy check parity bits to a transport block or a code block associated with the first private portion, wherein the transmitting is based at least in part on the attaching.

Aspect 10: The method of any of aspects 7 through 9, further comprising: attaching a first subset of the set of cyclic redundancy check parity bits to a transport block or a code block associated with the first private portion; and attaching a second subset of the set of cyclic redundancy check parity bits to a transport block or a code block associated with the third common portion, wherein the set of cyclic redundancy check parity bits comprises the first subset and the second subset, and wherein the transmitting is based at least in part on the attaching.

Aspect 11: The method of any of aspects 1 through 10, wherein the generating comprises: generating a first set of cyclic redundancy check parity bits for a first transport block associated with the first private portion based at least in part on the first private portion and the third common portion; and generating a second set of cyclic redundancy check parity bits for a second transport block associated with the second private portion based at least in part on the second private portion and the third common portion.

Aspect 12: The method of aspect 11, further comprising: attaching the first set of cyclic redundancy check parity bits to the first transport block associated with the first private portion; and attaching the second set of cyclic redundancy check parity bits to the second transport block associated with the second private portion, wherein the transmitting is based at least in part on the attaching.

Aspect 13: The method of any of aspects 1 through 12, wherein generating the cyclic redundancy check parity bits is based at least in part on a first set of one or more polynomials associated with rate splitting transmissions, and the first set of one or more polynomials is different from a second set of one or more polynomials associated with non-rate splitting transmissions.

Aspect 14: A method for wireless communications at a UE, comprising: receiving, from a device, a message comprising a private portion, a common portion, and cyclic redundancy check parity bits; decoding the private portion and the common portion based at least in part on receiving the message; determining a decoding status based at least in part on the cyclic redundancy check parity bits; and communicating with the device based at least in part on determining the decoding status.

Aspect 15: The method of aspect 14, wherein a first subset of the cyclic redundancy check parity bits is associated with at least one code block and a second subset of the cyclic redundancy check parity bits for at least one transport block, the at least one code block and the at least one transport block each associated with at least one of the private portion and the common portion.

Aspect 16: The method of aspect 15, wherein receiving the message comprises: receiving at least one code block, the at least one code block comprising at least the first subset of the cyclic redundancy check parity bits; and receiving at least one transport block, the at least one transport block comprising at least the second subset of cyclic redundancy check parity bits, the at least one code block and the at least one transport block each associated with at least one of the private portion and the common portion.

Aspect 17: The method of any of aspects 15 through 16, wherein receiving the message comprises: receiving at least one first code block associated with the common portion and at least one second code block associated with the private portion, the at least one first code block and the at least one second code block comprising at least the first subset of the cyclic redundancy check parity bits; receiving at least one first transport block associated with the common portion and at least one second transport block associated with the private portion, the at least one first transport block and the at least one second transport block comprising at least the second subset of the cyclic redundancy check parity bits; and receiving at least one block associated with the common portion and the private portion, the at least one block comprising at least a third subset of the cyclic redundancy check parity bits.

Aspect 18: The method of any of aspects 15 through 17, wherein receiving the message comprises: receiving at least one first code block associated with the common portion and at least one second code block associated with the private portion, the at least one first code block and the at least one second code block comprising at least the first subset of the cyclic redundancy check parity bits; and receiving at least one first transport block associated with the common portion and the private portion, the at least one transport block comprising at least the second subset of the cyclic redundancy check parity bits.

Aspect 19: The method of any of aspects 14 through 18, wherein receiving the message comprises: receiving at least one code block; and receiving at least one transport block, wherein the cyclic redundancy check parity bits are attached to the at least one transport block.

Aspect 20: The method of aspect 19, wherein the at least one transport block is associated with the common portion.

Aspect 21: The method of any of aspects 19 through 20, wherein the at least one transport block is associated with the private portion.

Aspect 22: The method of any of aspects 19 through 21, wherein the at least one transport block comprises at least a first transport block associated with the common portion and a second transport block associated with the private portion, and a first subset of the cyclic redundancy check parity bits are attached to the first transport block and a second subset of the cyclic redundancy check parity bits are attached to the second transport block.

Aspect 23: The method of any of aspects 14 through 22, wherein the decoding is based at least in part on a first set of one or more polynomials associated with rate splitting transmissions, and the first set of one or more polynomials is different from a second set of one or more polynomials associated with non-rate splitting transmissions.

Aspect 24: An apparatus for wireless communications at a device, comprising a processor; memory coupled with the processor; and instructions stored in the memory and executable by the processor to cause the apparatus to perform a method of any of aspects 1 through 13.

Aspect 25: An apparatus for wireless communications at a device, comprising at least one means for performing a method of any of aspects 1 through 13.

Aspect 26: A non-transitory computer-readable medium storing code for wireless communications at a device, the code comprising instructions executable by a processor to perform a method of any of aspects 1 through 13.

Aspect 27: An apparatus for wireless communications at a UE, comprising a processor; memory coupled with the processor; and instructions stored in the memory and executable by the processor to cause the apparatus to perform a method of any of aspects 14 through 23.

Aspect 28: An apparatus for wireless communications at a UE, comprising at least one means for performing a method of any of aspects 14 through 23.

Aspect 29: A non-transitory computer-readable medium storing code for wireless communications at a UE, the code comprising instructions executable by a processor to perform a method of any of aspects 14 through 23.

It should be noted that the methods described herein describe possible implementations, and that the operations and the steps may be rearranged or otherwise modified and that other implementations are possible. Further, aspects from two or more of the methods may be combined.

Although aspects of an LTE, LTE-A, LTE-A Pro, or NR system may be described for purposes of example, and LTE, LTE-A, LTE-A Pro, or NR terminology may be used in much of the description, the techniques described herein are applicable beyond LTE, LTE-A, LTE-A Pro, or NR networks. For example, the described techniques may be applicable to various other wireless communications systems such as Ultra Mobile Broadband (UMB), Institute of Electrical and Electronics Engineers (IEEE) 802.11 (Wi-Fi), IEEE 802.16 (WiMAX), IEEE 802.20, Flash-OFDM, as well as other systems and radio technologies not explicitly mentioned herein.

Information and signals described herein may be represented using any of a variety of different technologies and techniques. For example, data, instructions, commands, information, signals, bits, symbols, and chips that may be referenced throughout the description may be represented by voltages, currents, electromagnetic waves, magnetic fields or particles, optical fields or particles, or any combination thereof.

The various illustrative blocks and components described in connection with the disclosure herein may be implemented or performed using a general-purpose processor, a DSP, an ASIC, a CPU, an FPGA or other programmable logic device, discrete gate or transistor logic, discrete hardware components, or any combination thereof designed to perform the functions described herein. A general-purpose processor may be a microprocessor but, in the alternative, the processor may be any processor, controller, microcontroller, or state machine. A processor may also be implemented as a combination of computing devices (e.g., a combination of a DSP and a microprocessor, multiple microprocessors, one or more microprocessors in conjunction with a DSP core, or any other such configuration).

The functions described herein may be implemented using hardware, software executed by a processor, firmware, or any combination thereof. If implemented using software executed by a processor, the functions may be stored as or transmitted using one or more instructions or code of a computer-readable medium. Other examples and implementations are within the scope of the disclosure and appended claims. For example, due to the nature of software, functions described herein may be implemented using software executed by a processor, hardware, firmware, hardwiring, or combinations of any of these. Features implementing functions may also be physically located at various positions, including being distributed such that portions of functions are implemented at different physical locations.

Computer-readable media includes both non-transitory computer storage media and communication media including any medium that facilitates transfer of a computer program from one location to another. A non-transitory storage medium may be any available medium that may be accessed by a general-purpose or special-purpose computer. By way of example, and not limitation, non-transitory computer-readable media may include RAM, ROM, electrically erasable programmable ROM (EEPROM), flash memory, compact disk (CD) ROM or other optical disk storage, magnetic disk storage or other magnetic storage devices, or any other non-transitory medium that may be used to carry or store desired program code means in the form of instructions or data structures and that may be accessed by a general-purpose or special-purpose computer, or a general-purpose or special-purpose processor. Also, any connection is properly termed a computer-readable medium. For example, if the software is transmitted from a website, server, or other remote source using a coaxial cable, fiber optic cable, twisted pair, digital subscriber line (DSL), or wireless technologies such as infrared, radio, and microwave, then the coaxial cable, fiber optic cable, twisted pair, DSL, or wireless technologies such as infrared, radio, and microwave are included in the definition of computer-readable medium. Disk and disc, as used herein, include CD, laser disc, optical disc, digital versatile disc (DVD), floppy disk and Blu-ray disc. Disks may reproduce data magnetically, and discs may reproduce data optically using lasers. Combinations of the above are also included within the scope of computer-readable media.

As used herein, including in the claims, "or" as used in a list of items (e.g., a list of items prefaced by a phrase such as "at least one of" or "one or more of") indicates an inclusive list such that, for example, a list of at least one of A, B, or C means A or B or C or AB or AC or BC or ABC (i.e., A and B and C). Also, as used herein, the phrase "based on" shall not be construed as a reference to a closed set of conditions. For example, an example step that is described as "based on condition A" may be based on both a condition A and a condition B without departing from the scope of the present disclosure. In other words, as used herein, the phrase "based on" shall be construed in the same manner as the phrase "based at least in part on."

The term "determine" or "determining" encompasses a variety of actions and, therefore, "determining" can include calculating, computing, processing, deriving, investigating, looking up (such as via looking up in a table, a database or another data structure), ascertaining and the like. Also, "determining" can include receiving (e.g., receiving information), accessing (e.g., accessing data stored in memory) and the like. Also, "determining" can include resolving, obtaining, selecting, choosing, establishing, and other such similar actions.

In the appended figures, similar components or features may have the same reference label. Further, various components of the same type may be distinguished by following the reference label by a dash and a second label that distinguishes among the similar components. If just the first reference label is used in the specification, the description is applicable to any one of the similar components having the same first reference label irrespective of the second reference label, or other subsequent reference label.

The description set forth herein, in connection with the appended drawings, describes example configurations and does not represent all the examples that may be implemented or that are within the scope of the claims. The term "example" used herein means "serving as an example, instance, or illustration," and not "preferred" or "advantageous over other examples." The detailed description includes specific details for the purpose of providing an understanding of the described techniques. These techniques, however, may be practiced without these specific details. In some instances, known structures and devices are shown in block diagram form in order to avoid obscuring the concepts of the described examples.

The description herein is provided to enable a person having ordinary skill in the art to make or use the disclosure. Various modifications to the disclosure will be apparent to a person having ordinary skill in the art, and the generic principles defined herein may be applied to other variations without departing from the scope of the disclosure. Thus, the disclosure is not limited to the examples and designs described herein but is to be accorded the broadest scope consistent with the principles and novel features disclosed herein.

What is claimed is:

1. A method for wireless communications by a device, comprising:
    concatenating a first common portion of a first message for a first user equipment (UE) and a second common portion of a second message for a second UE to obtain a third common portion for the first UE and the second UE;
    generating cyclic redundancy check parity bits associated with at least one of a first private portion of the first message for the first UE, a second private portion of the second message for the second UE, and the third common portion;
    attaching, based at least in part on the generating, the cyclic redundancy check parity bits to at least one code block associated with the first message, at least one transport block associated with the first message, or both;
    transmitting, based at least in part on the concatenating, the first message comprising the cyclic redundancy check parity bits via the at least one code block, the at least one transport block or both, the first message indicating the first private portion and the third common portion to the first UE; and
    transmitting, based at least in part on the concatenating, the second message to the second UE, the second message indicating the second private portion and the third common portion to the second UE.

2. The method of claim 1, wherein the generating comprises:
    generating a first set of cyclic redundancy check parity bits for the at least one code block, wherein the at least one code block is associated with at least one of the first private portion and the third common portion; and
    generating a second set of cyclic redundancy check parity bits for the at least one transport block, wherein the at least one transport block is associated with at least one of the first private portion and the third common portion.

3. The method of claim 2, wherein attaching the cyclic redundancy check parity bits further comprises:
    attaching the first set of cyclic redundancy check parity bits to the at least one code block and the second set of cyclic redundancy check parity bits to the at least one transport block, wherein transmitting the first message is based at least in part on attaching the first set of cyclic redundancy check parity bits.

4. The method of claim 2, wherein attaching the cyclic redundancy check parity bits further comprises:
    attaching the first set of cyclic redundancy check parity bits to at least one first code block associated with the first private portion and to at least one second code block associated with the third common portion;

attaching the second set of cyclic redundancy check parity bits to at least one first transport block associated with the first private portion and to at least one second transport block associated with the third common portion; and attaching a third set of cyclic redundancy check parity bits to a block associated with the first private portion and the third common portion, wherein transmitting the first message and transmitting the second message are based at least in part on attaching the first set of cyclic redundancy check parity bits, attaching the second set of cyclic redundancy check parity bits, and attaching the third set of cyclic redundancy check parity bits.

5. The method of claim 2, wherein attaching the cyclic redundancy check parity bits further comprises:

attaching the first set of cyclic redundancy check parity bits to at least one first code block associated with the first private portion and to at least one second code block associated with the third common portion; and attaching the second set of cyclic redundancy check parity bits to the at least one transport block associated with the first private portion or the third common portion, wherein transmitting the first message and transmitting the second message are based at least in part on attaching the first set of cyclic redundancy check parity bits and attaching the second set of cyclic redundancy check parity bits.

6. The method of claim 1, further comprising:

encoding the first private portion, the second private portion, and the third common portion, wherein the generating is based at least in part on the encoding.

7. The method of claim 1, wherein the generating comprises:

generating a set of cyclic redundancy check parity bits associated with the first private portion and the third common portion.

8. The method of claim 7, wherein attaching the cyclic redundancy check parity bits further comprises:

attaching the set of cyclic redundancy check parity bits to the at least one transport block or the at least one code block, the at least one transport block or the at least one code block corresponding to the third common portion, wherein transmitting the first message and transmitting the second message are based at least in part on attaching the set of cyclic redundancy check parity bits.

9. The method of claim 7, wherein attaching the cyclic redundancy check parity bits further comprises:

attaching the set of cyclic redundancy check parity bits to the at least one transport block or the at least one code block, the at least one transport block or the at least one code block corresponding to the first private portion, wherein transmitting the first message and transmitting the second message are based at least in part on attaching the set of cyclic redundancy check parity bits.

10. The method of claim 7, wherein attaching the cyclic redundancy check parity bits further comprises:

attaching a first subset of the set of cyclic redundancy check parity bits to a transport block or a code block corresponding to the first private portion; and attaching a second subset of the set of cyclic redundancy check parity bits to a transport block or a code block corresponding to the third common portion, wherein the set of cyclic redundancy check parity bits comprises the first subset and the second subset, and wherein the first message and transmitting the second message are based at least in part on the attaching the second subset of the set of cyclic redundancy check parity bits.

11. The method of claim 1, wherein the generating comprises:

generating a first set of cyclic redundancy check parity bits for a first transport block associated with the first private portion based at least in part on the first private portion and the third common portion; and generating a second set of cyclic redundancy check parity bits for a second transport block associated with the second private portion based at least in part on the second private portion and the third common portion, the at least one transport block comprising the first transport block and the second transport block.

12. The method of claim 11, wherein attaching the cyclic redundancy check parity bits further comprises:

attaching the first set of cyclic redundancy check parity bits to the first transport block associated with the first private portion; and attaching the second set of cyclic redundancy check parity bits to the second transport block associated with the second private portion, wherein transmitting the first message and transmitting the second message are based at least in part on attaching the first set of cyclic redundancy check parity bits and attaching the second set of cyclic redundancy check parity bits.

13. The method of claim 1, wherein:

generating the cyclic redundancy check parity bits is based at least in part on a first set of one or more polynomials associated with rate splitting transmissions, and the first set of one or more polynomials is different from a second set of one or more polynomials associated with non-rate splitting transmissions.

14. A device for wireless communications, comprising:

a processor;

memory coupled with the processor; and instructions stored in the memory and executable by the processor to cause the device to:

concatenate first common portion of a first message for a first user equipment (UE), and a second common portion of a second message for a second UE to obtain, a third common portion for the first UE and the second UE;

generate cyclic redundancy check parity bits associated with at least one of a first private portion of the first message for the first UE, a second private portion of the second message for the second UE, and the third common portion;

attach, based at least in part on the generating, the cyclic redundancy check parity bits to at least one code block associated with the first message, at least one transport block associated with the first message, or both;

transmit, based at least in part on the concatenating generating, the first message comprising the cyclic redundancy check parity bits via the at least one code block, the at least one transport block or both, the first message indicating the first private portion and the third common portion to the first UE; and transmit, based at least in part on the concatenating, the second message to the second UE, the second message indicating the second private portion and the third common portion to the second UE.

15. The device of claim 14, wherein the instructions to generating are executable by the processor to cause the device to:

generate a first set of cyclic redundancy check parity bits for the at least one code block, wherein the at least one code block is associated with at least one of the first private portion and the third common portion; and generate a second set of cyclic redundancy check parity bits for the at least one transport block, wherein the at least one transport block is associated with at least one of the first private portion and the third common portion.

16. The device of claim 15, wherein, to attach the cyclic redundancy check parity bits, the instructions are further executable by the processor to cause the device to:

attach the first set of cyclic redundancy check parity bits to the at least one code block and the second set of cyclic redundancy check parity bits to the at least one transport block, wherein transmitting the first message is based at least in part on attaching the first set of cyclic redundancy check parity bits.

17. The device of claim 15, wherein, to attach the cyclic redundancy check parity bits, the instructions are further executable by the processor to cause the device to:

attach the first set of cyclic redundancy check parity bits to at least one first code block associated with the first private portion and to at least one second code block associated with the third common portion;

attach the second set of cyclic redundancy check parity bits to at least one first transport block associated with the first private portion and to at least one second transport block associated with the third common portion; and attach a third set of cyclic redundancy check parity bits to a block associated with the first private portion and the third common portion, wherein transmitting the first message and transmitting the second message are based at least in part on attaching the first set of cyclic redundancy check parity bits, attaching the second set of cyclic redundancy check parity bits, and attaching the third set of cyclic redundancy check parity bits.

18. The device of claim 15, wherein, to attach the cyclic redundancy check parity bits, the instructions are further executable by the processor to cause the device to:

attach the first set of cyclic redundancy check parity bits to at least one first code block associated with the first private portion and to at least one second code block associated with the third common portion; and attach the second set of cyclic redundancy check parity bits to the at least one transport block associated with the first private portion or the third common portion, wherein transmitting the first message and transmitting the second message are based at least in part on attaching the first set of cyclic redundancy check parity bits and attaching the second set of cyclic redundancy check parity bits.

19. The device of claim 14, wherein the instructions are further executable by the processor to cause the device to:

encode the first private portion, the second private portion, and the third common portion, wherein the generating is based at least in part on the encoding.

20. The device of claim 14, wherein the generating comprises:

generate a set of cyclic redundancy check parity bits associated with the first private portion and the third common portion.

21. The device of claim 20, wherein, to attach the cyclic redundancy check parity bits, the instructions are further executable by the processor to cause the device to:

attach the set of cyclic redundancy check parity bits to the at least one transport block or the at least one code block, the at least one transport block or the at least one code block corresponding to the third common portion, wherein transmitting the first message and transmitting the second message are based at least in part on attaching the set of cyclic redundancy check parity bits.

22. The device of claim 20, wherein, to attach the cyclic redundancy check parity bits, the instructions are further executable by the processor to cause the device to:

attach the set of cyclic redundancy check parity bits to the at least one transport block or the at least one code block, the at least one transport block or the at least one code block corresponding to the first private portion, wherein transmitting the first message and transmitting the second message are based at least in part on attaching the set of cyclic redundancy check parity bits.

23. The device of claim 20, wherein, to attach the cyclic redundancy check parity bits, the instructions are further executable by the processor to cause the device to:

attach a first subset of the set of cyclic redundancy check parity bits to a transport block or a code block corresponding to the first private portion; and attach a second subset of the set of cyclic redundancy check parity bits to a transport block or a code block corresponding to the third common portion, wherein the set of cyclic redundancy check parity bits comprises the first subset and the second subset, and wherein the first message and transmitting the second message are based at least in part on the attaching the second subset of the set of cyclic redundancy check parity bits.

24. The device of claim 14, wherein the generating comprises:

generate a first set of cyclic redundancy check parity bits for a first transport block associated with the first private portion based at least in part on the first private portion and the third common portion; and generate a second set of cyclic redundancy check parity bits for a second transport block associated with the second private portion based at least in part on the second private portion and the third common portion, the at least one transport block comprising the first transport block and the second transport block.

25. The device of claim 24, wherein, to attach the cyclic redundancy check parity bits, the instructions are further executable by the processor to cause the device to:

attach the first set of cyclic redundancy check parity bits to the first transport block associated with the first private portion; and attach the second set of cyclic redundancy check parity bits to the second transport block associated with the second private portion, wherein transmitting the first message and transmitting the second message are based at least in part on attaching the first set of cyclic redundancy check parity bits and attaching the second set of cyclic redundancy check parity bits.

26. The device of claim 14, wherein:

generating the cyclic redundancy check parity bits is based at least in part on a first set of one or more polynomials associated with rate splitting transmissions, and the first set of one or more polynomials is different from a second set of one or more polynomials associated with non-rate splitting transmissions.

27. A device for wireless communications, comprising:

means for concatenating a first common portion of a first message for a first user equipment (UE), and a second common portion of a second message for a second UE to obtain a third common portion for the first UE and the second UE;

means for generating cyclic redundancy check parity bits associated with at least one of a first private portion of the first message for the first UE, a second private portion of the second message for the second UE, and the third common portion;

means for attaching, based at least in part on the generating, the cyclic redundancy check parity bits to at least one code block associated with the first message, at least one transport block associated with the first message, or both;

means for transmitting, based at least in part on the concatenating, the first message comprising the cyclic redundancy check parity bits via the at least one code block, the at least one transport block or both, the first message indicating the first private portion and the third common portion to the first UE; and means for transmitting, based at least in part on the concatenating, the second message to the second UE, the second message indicating the second private portion and the third common portion to the second UE.

28. A non-transitory computer-readable medium storing code for wireless communication, the code comprising instructions executable by one or more processors to:

concatenate a first common portion of a first message for a first user equipment (UE), and a second common portion of a second message for a second UE to obtain, a third common portion for the first UE and the second UE;

generate cyclic redundancy check parity bits associated with at least one of a first private portion of the first message for the first UE, a second private portion of the second message for the second UE, and the third common portion;

attach, based at least in part on the generating, the cyclic redundancy check parity bits to at least one code block associated with the first message, at least one transport block associated with the first message, or both;

transmit, based at least in part on the concatenating, the first message comprising the cyclic redundancy check parity bits via the at least one code block, the at least one transport block or both, the first message indicating the first private portion and the third common portion to the first UE; and transmit, based at least in part on the concatenating, the second message to the second UE, the second message indicating the second private portion and the third common portion to the second UE.

* * * * *